United States Patent
Kim et al.

(10) Patent No.: US 10,411,011 B2
(45) Date of Patent: Sep. 10, 2019

(54) SEMICONDUCTOR DEVICES AND METHODS OF MANUFACTURING THE SAME

(71) Applicant: SAMSUNG ELECTRONICS CO., LTD., Suwon-si, Gyeonggi-do (KR)

(72) Inventors: Kook-Tae Kim, Hwaseong-si (KR); Ho-Sung Son, Hwaseong-si (KR); Dong-Suk Shin, Yongin-si (KR); Hyun-Jun Sim, Hwaseong-si (KR); Ju-Ri Lee, Yongin-si (KR); Sung-Uk Jang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/028,080

(22) Filed: Jul. 5, 2018

(65) Prior Publication Data
US 2018/0331105 A1    Nov. 15, 2018

Related U.S. Application Data

(62) Division of application No. 15/276,274, filed on Sep. 26, 2016, now Pat. No. 10,043,806.

(30) Foreign Application Priority Data

Oct. 6, 2015   (KR) .......................... 10-2015-0140406

(51) Int. Cl.
*H01L 27/092*    (2006.01)
*H01L 29/16*    (2006.01)
(Continued)

(52) U.S. Cl.
CPC ........ *H01L 27/0924* (2013.01); *H01L 27/092* (2013.01); *H01L 29/161* (2013.01);
(Continued)

(58) Field of Classification Search
CPC ........................ H01L 27/0924; H01L 29/1608
(Continued)

(56) References Cited

U.S. PATENT DOCUMENTS 4,766,092 A   8/1988 Kuroda et al.
6,440,807 B1  8/2002 Ajmera et al.
(Continued)

FOREIGN PATENT DOCUMENTS

JP   2007110047 A   4/2007
KR  20070073440 A   7/2007
(Continued)

*Primary Examiner* — Igwe U Anya
(74) *Attorney, Agent, or Firm* — Volentine, Whitt & Francos, PLLC

(57) ABSTRACT

A dummy gate electrode layer and a dummy gate mask layer may be formed on a substrate. The dummy gate mask layer may be patterned to form a dummy gate mask so that a portion of the dummy gate electrode layer is exposed. Ions may be implanted into the exposed portion of the dummy gate electrode layer and a portion of the dummy gate electrode layer adjacent thereto by an angled ion implantation to form a growth blocking layer in the dummy gate electrode layer. The dummy gate electrode layer may be etched using the dummy gate mask as an etching mask to form a dummy gate electrode. A spacer may be formed on side surfaces of a dummy gate structure including the dummy gate electrode and the dummy gate mask. An SEG process may be performed to form an epitaxial layer.

20 Claims, 71 Drawing Sheets

(51) Int. Cl.
  *H01L 29/167* (2006.01)
  *H01L 29/78* (2006.01)
  *H01L 29/161* (2006.01)
  *H01L 29/66* (2006.01)
  *H01L 21/8238* (2006.01)

(52) U.S. Cl.
  CPC ........ *H01L 29/167* (2013.01); *H01L 29/1608* (2013.01); *H01L 29/66545* (2013.01); *H01L 29/7851* (2013.01); H01L 21/823814 (2013.01); H01L 21/823821 (2013.01)

(58) Field of Classification Search
  USPC .......................................................... 257/77
  See application file for complete search history.

(56) References Cited

U.S. PATENT DOCUMENTS

| | | | |
|---|---|---|---|
| 6,900,092 B2 | 5/2005 | Ajmera et al. | |
| 7,763,516 B2 | 7/2010 | Takahashi | |
| 7,951,719 B2 | 5/2011 | Brewer | |
| 8,586,455 B1 | 11/2013 | Chang et al. | |
| 8,659,089 B2 | 2/2014 | Ko et al. | |
| 8,679,961 B2 | 3/2014 | Ikeda | |
| 8,906,760 B2 | 12/2014 | Ranjan et al. | |
| 8,927,377 B2 | 1/2015 | Xu et al. | |
| 9,034,741 B2 | 5/2015 | Adam et al. | |
| 9,041,125 B2 | 5/2015 | Lin et al. | |
| 9,048,262 B2 | 6/2015 | Adam et al. | |
| 2012/0199888 A1 | 8/2012 | Dai et al. | |
| 2014/0138780 A1 | 5/2014 | Colinge et al. | |
| 2014/0151814 A1 | 6/2014 | Giles et al. | |
| 2014/0239420 A1 | 8/2014 | Basker et al. | |
| 2014/0252486 A1 | 9/2014 | Lin et al. | |
| 2014/0273368 A1 | 9/2014 | Hung et al. | |
| 2014/0367754 A1* | 12/2014 | Morisaki | H01L 21/265 257/288 |
| 2015/0014773 A1 | 1/2015 | Cheng et al. | |
| 2015/0126012 A1 | 5/2015 | Jeong et al. | |
| 2015/0132908 A1 | 5/2015 | Jeong et al. | |
| 2015/0228647 A1 | 8/2015 | Chang et al. | |
| 2015/0228730 A1* | 8/2015 | Yang | H01L 27/092 257/369 |
| 2015/0263136 A1 | 9/2015 | Hsiao et al. | |
| 2016/0087098 A1* | 3/2016 | Liu | H01L 29/0847 257/344 |

FOREIGN PATENT DOCUMENTS

| | | |
|---|---|---|
| KR | 20100038631 A | 4/2010 |
| KR | 20130044692 A | 5/2013 |

* cited by examiner

FIG. 7
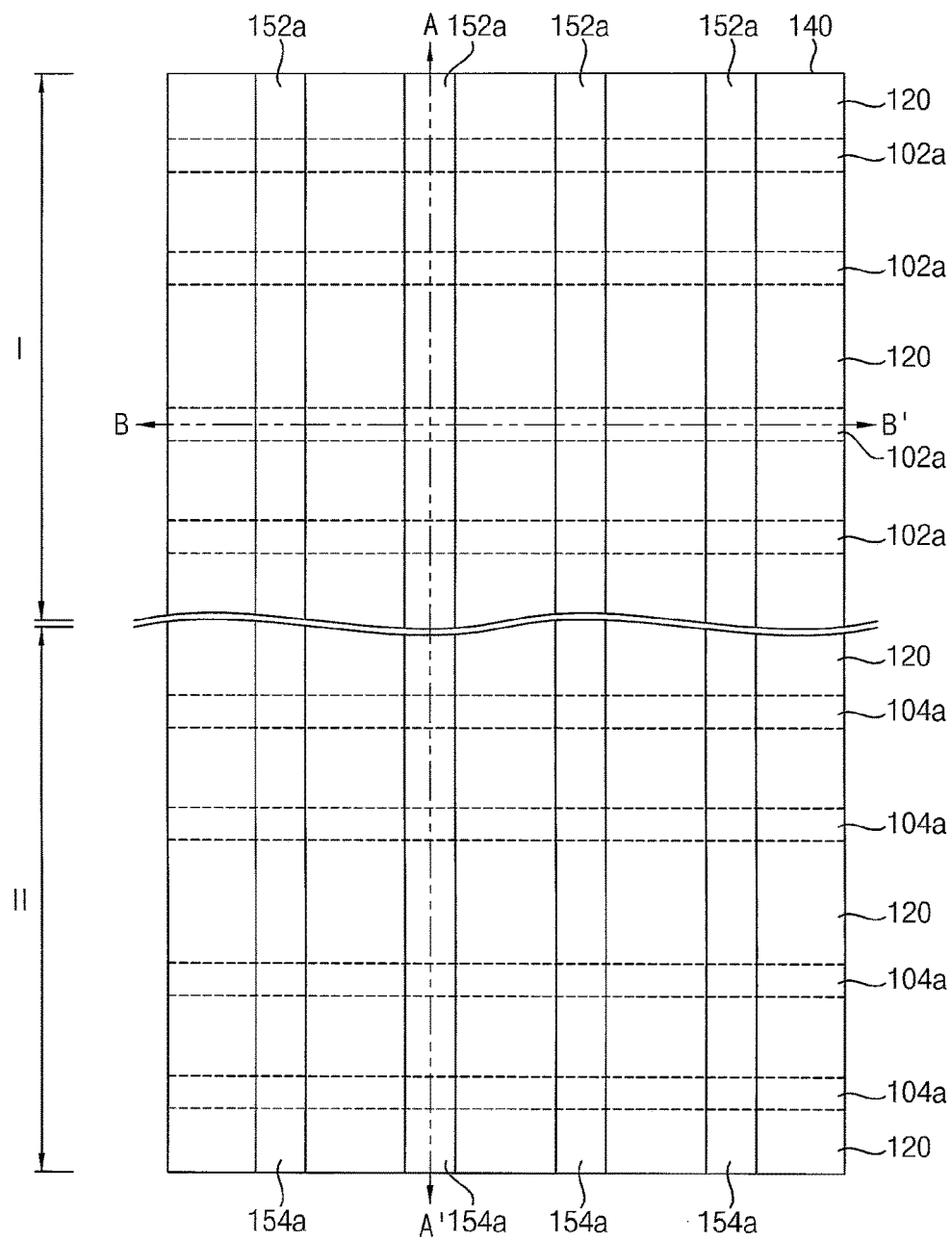
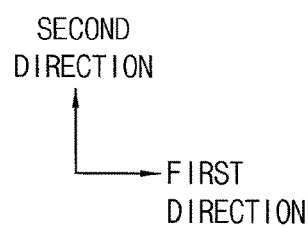

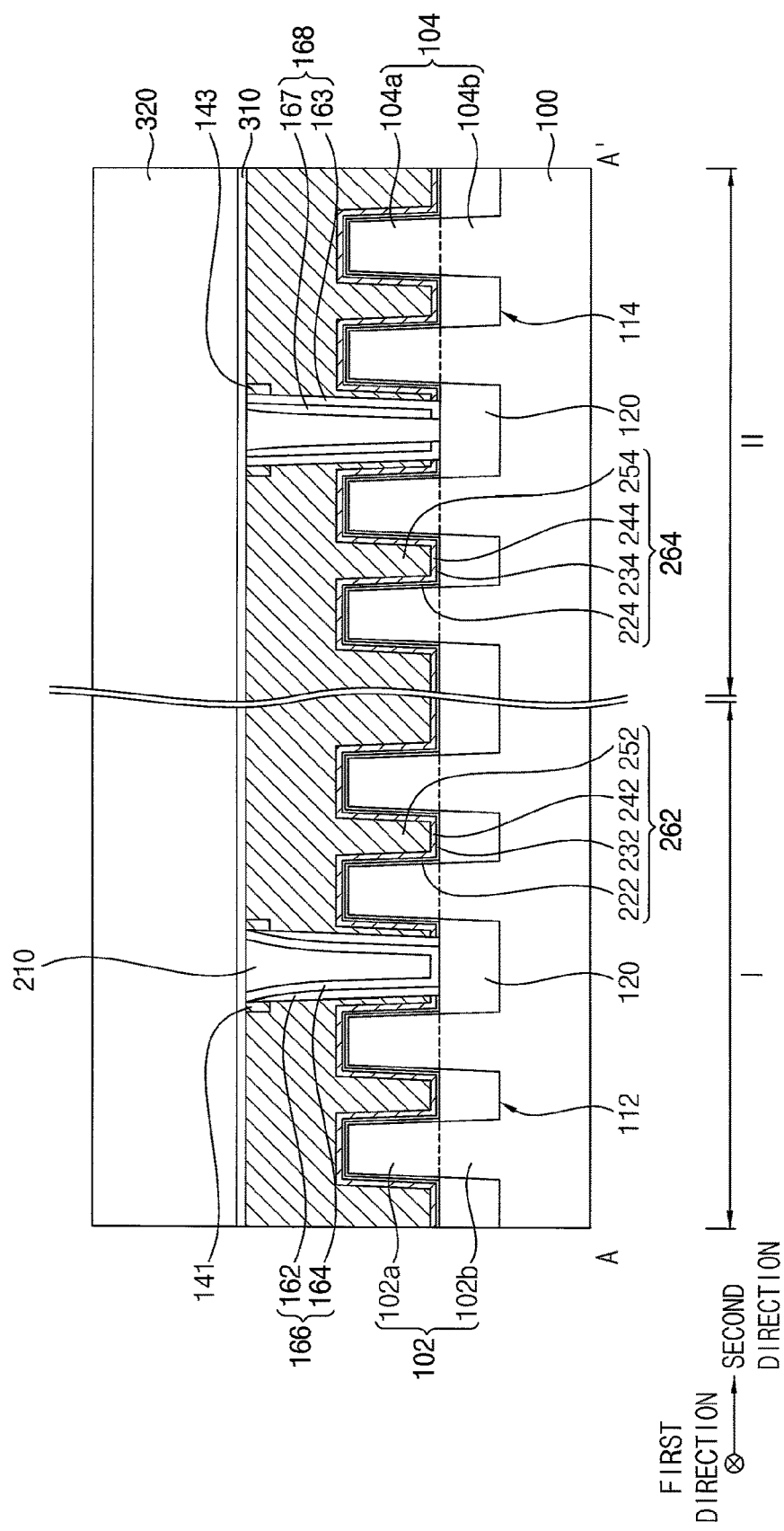

SEMICONDUCTOR DEVICES AND METHODS OF MANUFACTURING THE SAME

PRIORITY STATEMENT

This application is a Divisional of U.S. application Ser. No. 15/276,274, filed Sep. 26, 2016, which claims priority under 35 USC § 119 to Korean Patent Application No. 10-2015-0140406, filed on Oct. 6, 2015 in the Korean Intellectual Property Office (KIPO), the contents of which are hereby incorporated by reference in their entirety.

BACKGROUND

1. Field

The inventive concept relates to semiconductor devices and methods of manufacturing the same. More particularly, the inventive concept relates to semiconductor devices including epitaxial layers and methods of manufacturing the same.

2. Description of the Related Art

When a finFET is formed, a dummy gate structure including a dummy gate electrode and a hard mask sequentially stacked on a substrate and extending in a second direction may be formed in a first direction substantially perpendicular to the second direction and also in the second direction, and the dummy gate structure may have side surfaces at both ends in the second direction, which may not be vertical but slanted with respect to a top surface of the substrate. Thus, the side surfaces of the dummy gate structure in the second direction may not be completely covered by spacers subsequently formed, and a portion of the dummy gate electrode may be exposed. When an epitaxial layer is formed on an active fin by a selective epitaxial growth (SEG) process, the epitaxial layer may be formed on the exposed portion of the dummy gate electrode, which may generate an electrical short between gate structures.

SUMMARY

According to an aspect of the inventive concept, there is provided a method of manufacturing a semiconductor device, in which a dummy gate electrode layer and a dummy gate mask layer are sequentially formed on a substrate, the dummy gate mask layer is patterned to form a dummy gate mask so that a portion of the dummy gate electrode layer is exposed, ions are implanted into the exposed portion of the dummy gate electrode layer and a portion of the dummy gate electrode layer adjacent thereto by an angled ion implantation process to form a growth blocking layer at a portion of the dummy gate electrode layer, the dummy gate electrode layer is etched using the dummy gate mask as an etching mask to form a dummy gate electrode, a spacer is formed on a side surface of a dummy gate structure including the dummy gate electrode and the dummy gate mask, and an SEG process is performed to form an epitaxial layer on a portion of the substrate adjacent the spacer.

According to another aspect of the inventive concept, there is provided a method of manufacturing a semiconductor device, in which an isolation pattern is formed on a substrate to define an active fin, a dummy gate electrode layer and a dummy gate mask layer are sequentially formed on the active fin and the isolation pattern, an angled ion implantation process is performed to form a growth blocking layer at a portion of the dummy gate electrode layer, the dummy gate electrode layer is etched using the dummy gate mask as an etching mask to form a dummy gate electrode, a portion of the growth blocking layer remains as a growth blocking pattern on a side surface of the dummy gate electrode, a spacer is formed on a side surface of a dummy gate structure including the dummy gate electrode and the dummy gate mask, an SEG process is performed to form an epitaxial layer on a portion of the active fin adjacent the spacer, and the dummy gate structure is replaced with a gate structure.

According to the inventive concept, there is also provided a semiconductor device which includes gate structures each extending longitudinally in a second direction and spaced apart from each other in the second direction on a substrate such that each of the gate structures has first opposite side surfaces in a first direction that crosses the second direction and second opposite side surfaces in the second direction, a gate spacer structure including a first portion on the first opposite side surfaces of each of the gate structures, and a second portion on the second opposite side surfaces of each of the gate structures, and a source/drain layer on a portion of the substrate adjacent the first portion of the gate spacer structure, and wherein each of the second opposite side surfaces of each of the gate structures has a respective indentation therein.

According to another aspect of the inventive concept, there is provided a semiconductor device which includes a substrate, gate structures spaced apart from each other as aligned in one direction on the substrate such that each of the gate structures has opposite ends in said one direction and opposite sides in another direction that crosses said one direction, a gate spacer having portions that cover the ends of the gate structures, respectively, an insulation layer extending between said portions of the gate spacer so as to be interposed between the gate structures aligned in said one direction, and an epitaxial layer disposed on the substrate, constituting source/drain regions of the device, and facing the side surfaces of the gate structures adjacent the end surfaces of the gate structures, and wherein the ends of the gate structures have indentations therein, respectively, the indentations being open at top surfaces of the gate structures such that each of the indentations is defined between a top surface and one of the end surfaces of a respective one of the gate structures.

According to another aspect of the inventive concept, there is provided a semiconductor device which includes a substrate, gate structures spaced apart from each other as aligned in one direction on the substrate such that each of the gate structures has opposite ends in said one direction and opposite sides in another direction that crosses said one direction, a gate spacer having portions that cover the ends of the gate structures, respectively, an insulation layer extending between said portions of the gate spacer so as to be interposed between the gate structures aligned in said one direction, an epitaxial layer disposed on the substrate, constituting source/drain regions of the device, and facing the sides of the gate structures, and remnants of epitaxial growth preventing patterns interposed between upper parts of the ends of the gate structures and said portions of the gate spacer, respectively.

BRIEF DESCRIPTION OF THE DRAWINGS

The inventive concept will be more clearly understood from the following detailed description taken in conjunction with the accompanying drawings. FIGS. 1 to 71 illustrate non-limiting, examples as described in more detail hereinafter.

FIGS. 1 to 67 together illustrate examples of methods of manufacturing a semiconductor device in accordance with the inventive concept, wherein FIGS. 1, 4, 7, 10, 15, 18, 21, 26, 32, 35, 39, 46, 49, 57 and 63 are plan views, FIGS. 2, 3, 5, 8, 11, 13, 16, 19, 22, 25, 27, 31, 36, 40, 45, 50, 54-56, 58, 60, 64 and 68-71 are cross-sectional views taken along lines A-A' of corresponding ones of the plan views, respectively, FIGS. 48, 53 and 67 are cross-sectional views taken along lines F-F' of corresponding ones of the plan views.

FIGS. 68 to 71 are sectional views of examples of semiconductor devices in accordance with the inventive concept.

DETAILED DESCRIPTION

Figure 1:
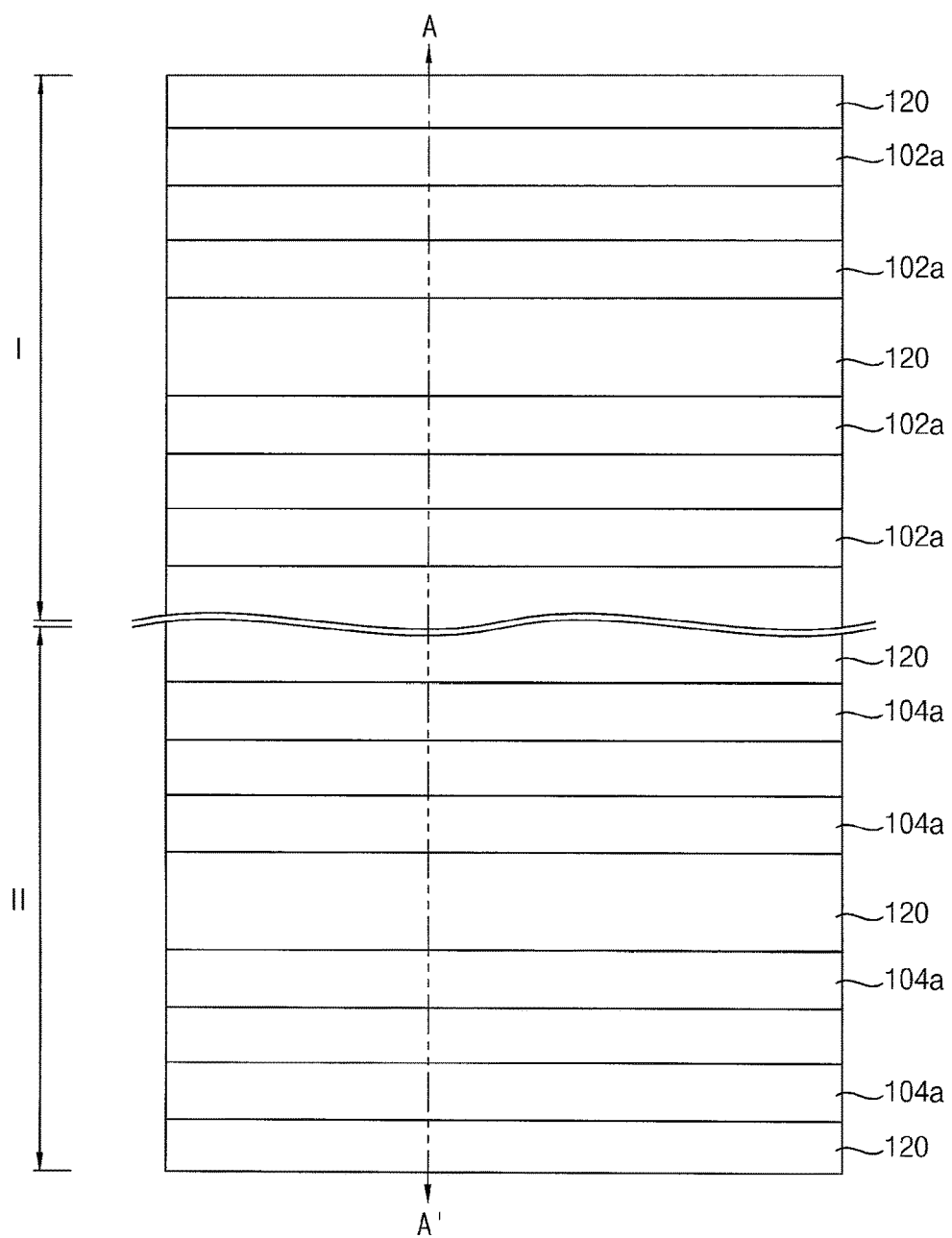

The inventive concept will be described more fully hereinafter with reference to the accompanying drawings, in which some examples are shown. The present inventive concept may, however, be exemplified in many different forms and should not be construed as limited to the examples set forth herein. Rather, these examples are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals designate like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Examples are described herein with reference to cross-sectional illustrations that are schematic illustrations of idealized examples (and intermediate structures). As such, variations from the shapes of the illustrations as a result, for example, of manufacturing techniques and/or tolerances, are to be expected. Thus, examples should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. For example, the term "extending" will be generally understood as referring to a longitudinal or lengthwise direction, i.e., as referencing the longest dimension of a particular element or feature especially in the case of an element or feature having a linear or elongated form. The term "plurality formed in both" of certain directions will be generally understood as describing an array of features of elements in which the elements are spaced in the stated directions. The term "substantially the same material" will be generally understood as synonymous with the term "the same material" but accounts for slight variations in the material that may occur unintentionally as the result of processing. The term "substrate" will be understood as being used in its broadest sense to describe an underlying bulk portion or layer(s) of material and may at times be used simply to refer to that part of an underlying bulk portion or layers of material that has not been altered by a particular process used in forming a semiconductor device.

Figure 67:
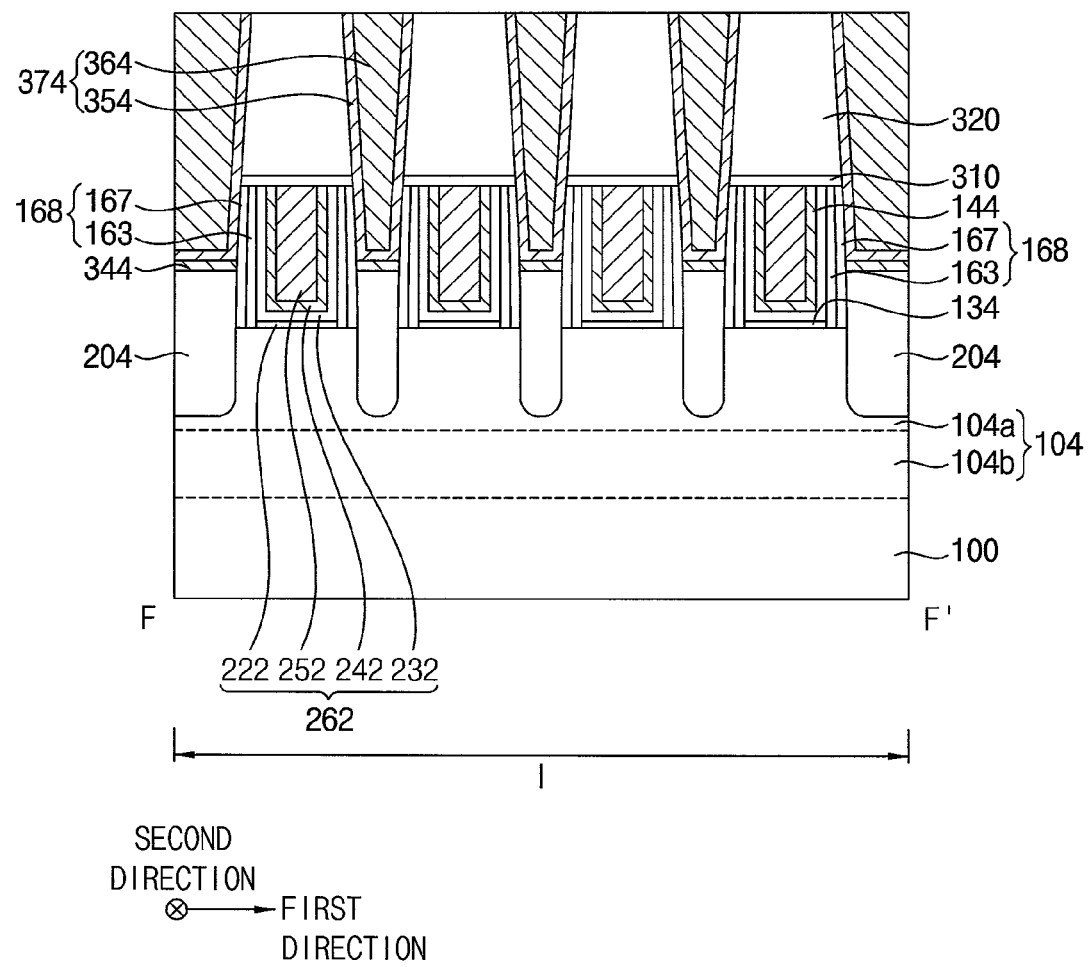

FIGS. 1 to 67 are plan views and cross-sectional views illustrating stages of examples of one method of manufacturing a semiconductor device in accordance with the inventive concept.

Figure 2:
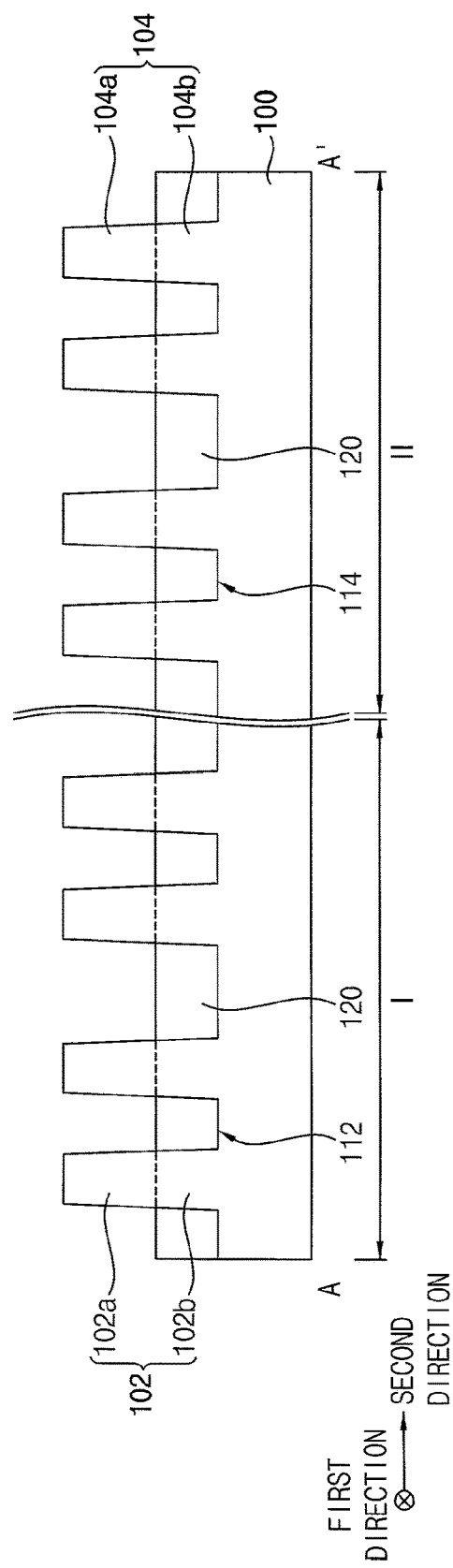

Referring to FIGS. 1 and 2, upper portions of a substrate 100 may be etched to form first and second recesses 112 and 114, and an isolation pattern 120 may be formed on the substrate 100 to fill a lower portion of each of the first and second recesses 112 and 114.

The substrate 100 may be of a semiconductor material, e.g., silicon, germanium, silicon-germanium, etc., or a III-V semiconductor compound, e.g., GaP, GaAs, GaSb, etc. In some examples, the substrate 100 may be a silicon-on-insulator (SOI) substrate, or a germanium-on-insulator (GOI) substrate.

The substrate 100 may include first and second regions I and II. In examples, the first and second regions I and II may serve as a positive-channel metal oxide semiconductor (PMOS) region and a negative-channel metal oxide semiconductor (NMOS) region, respectively. The first and second recesses 112 and 114 may be formed in the first and second regions I and II, respectively, of the substrate 100.

In examples, the isolation pattern 120 may be formed by forming an isolation layer on the substrate 100 to sufficiently fill the first and second recesses 112 and 114, planarizing the isolation layer until a top surface of the substrate 100 is exposed, and removing upper portions of the isolation layer to expose upper portions of the first and second recesses 112 and 114. The isolation layer may be formed of an oxide, e.g., silicon oxide.

As the isolation pattern 120 is formed on the substrate 100, a field region having a top surface covered by the isolation pattern 120, and first and second active regions 102 and 104 having top surfaces, respectively, not covered by the isolation pattern 120 but protruding therefrom may be defined in the first and second regions I and II, respectively, of the substrate 100. Each of the first and second active regions 102 and 104 may have a fin-like shape protruding from the isolation pattern 120, and thus may be also referred to as an active fin.

In examples, each of the first and second active fins 102 and 104 may extend (linearly) in a first direction substantially parallel to the top surface of the substrate 100. A plurality of first active fins 102 and a plurality of second active fins 104 may be spaced in a second direction, which may be substantially parallel to the top surface of the substrate 100 and cross the first direction. In examples, the first and second directions may cross each other at a right angle, and thus may be substantially perpendicular to each other.

In examples, the first active fin 102 may include a first lower active pattern 102b whose side surfaces may be covered by the isolation pattern 120, and a first upper active pattern 102a not covered by the isolation pattern 120 but protruding therefrom. The second active fin 104 may include a second lower active pattern 104b whose side surfaces may be covered by the isolation pattern 120, and a second upper active pattern 104a not covered by the isolation pattern 120 but protruding therefrom. In examples, the first and second upper active patterns 102a and 104a may have widths in the second direction that may be slightly less than widths of the first and second lower active patterns 102b and 104b, respectively.

In examples, the isolation pattern 120 may be formed to have a multi-layered structure. In particular, the isolation pattern 120 may include first and second liners (not shown) sequentially stacked on an inner wall of each of the first and second recesses 112 and 114, and a filling insulation layer (not shown) filling a remaining portion of each of the first and second recesses 112 and 114 on the second liner. For example, the first liner may be formed of an oxide, e.g., silicon oxide, the second liner may be formed of a nitride, e.g., silicon nitride, or polysilicon, and the filling insulation layer may be formed of an oxide, e.g., silicon oxide.

Figure 3:
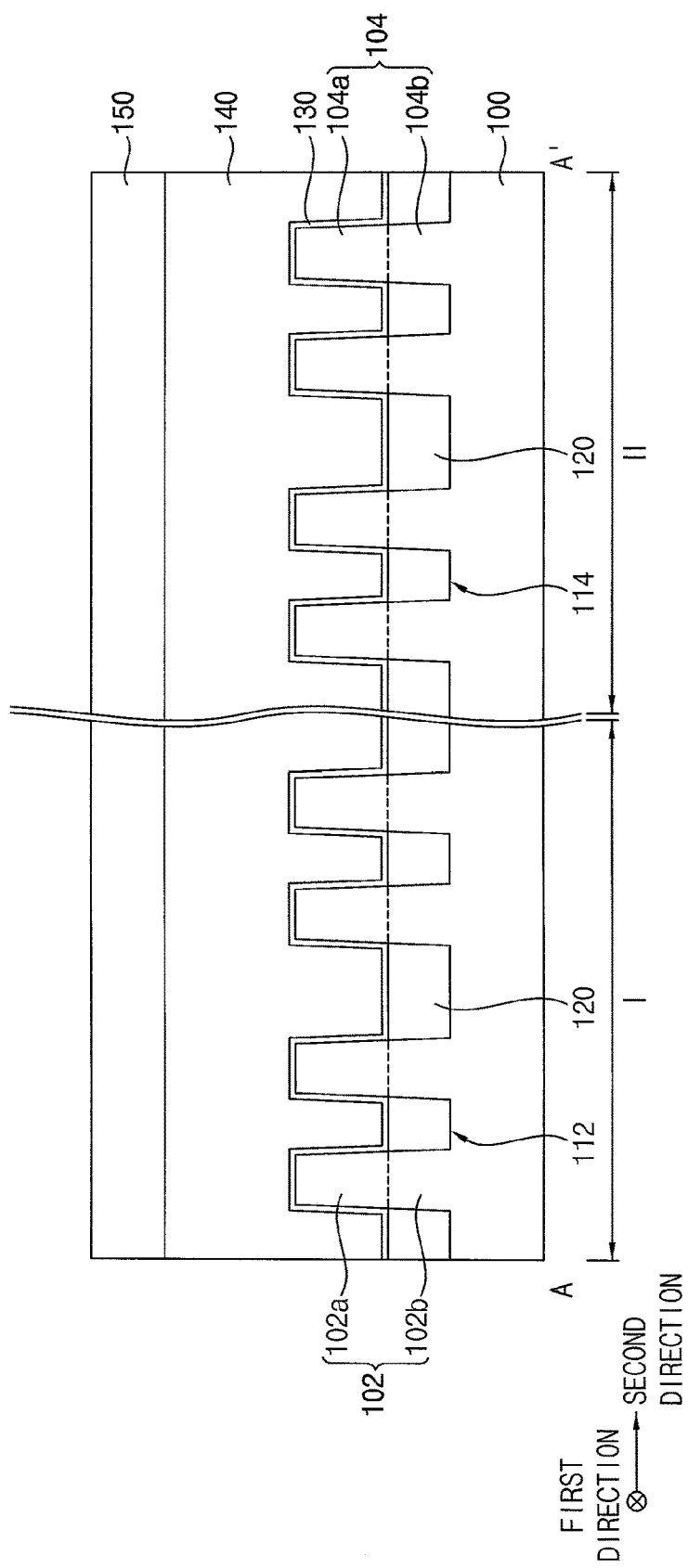

Referring to FIG. 3, a dummy gate insulation layer 130, a dummy gate electrode 140 and a dummy gate mask layer 150 may be sequentially formed on the first and second active fins 102 and 104 and the isolation pattern 120.

The dummy gate insulation layer 130 may be formed of an oxide, e.g., silicon oxide, the dummy gate electrode layer 140 may be formed of, e.g., polysilicon, and the dummy gate mask layer 150 may be formed of a nitride, e.g., silicon nitride. The dummy gate insulation layer 130 may be formed by a chemical vapor deposition (CVD) process, an atomic layer deposition (ALD) process, etc. Alternatively, the dummy gate insulation layer 130 may be formed by a thermal oxidation process on an upper portion of the substrate 100, and in this case, the dummy gate insulation layer may 130 be formed only on the first and second upper active patterns 102a and 104a. The dummy gate electrode layer 140 and the dummy gate mask layer 150 may be formed by a CVD process, an ALD process, etc.

Figure 4:
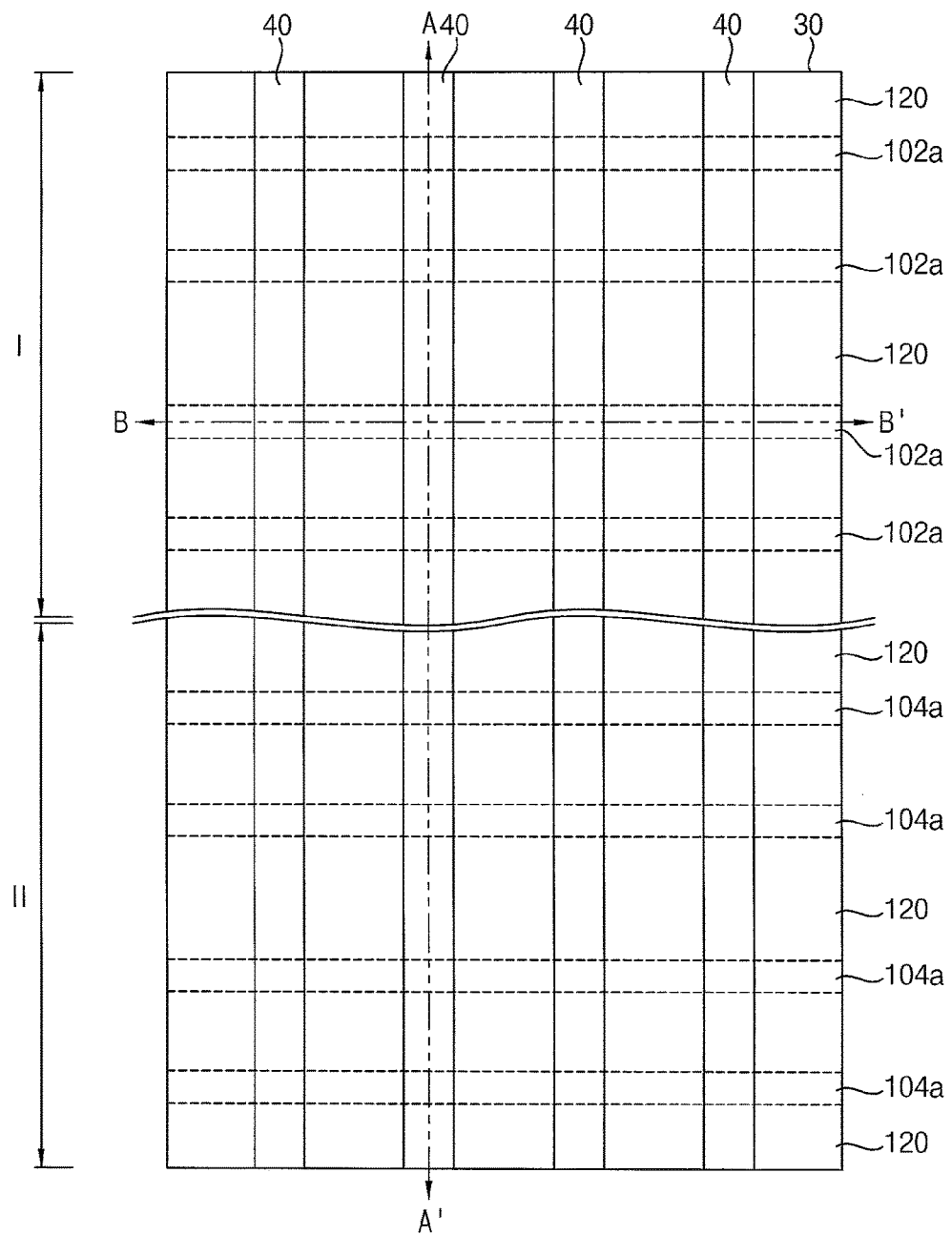
Figure 5:
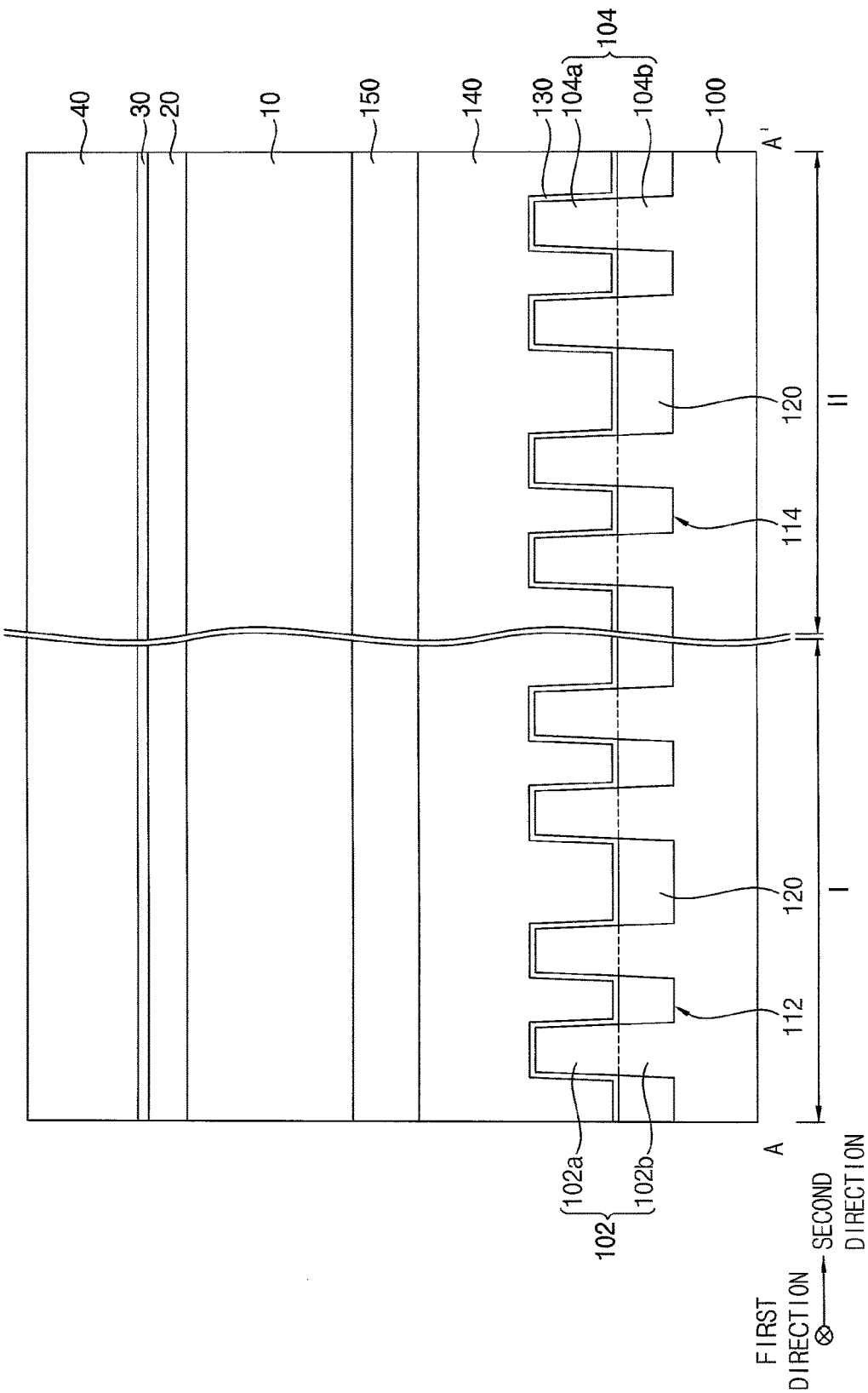
Figure 6:
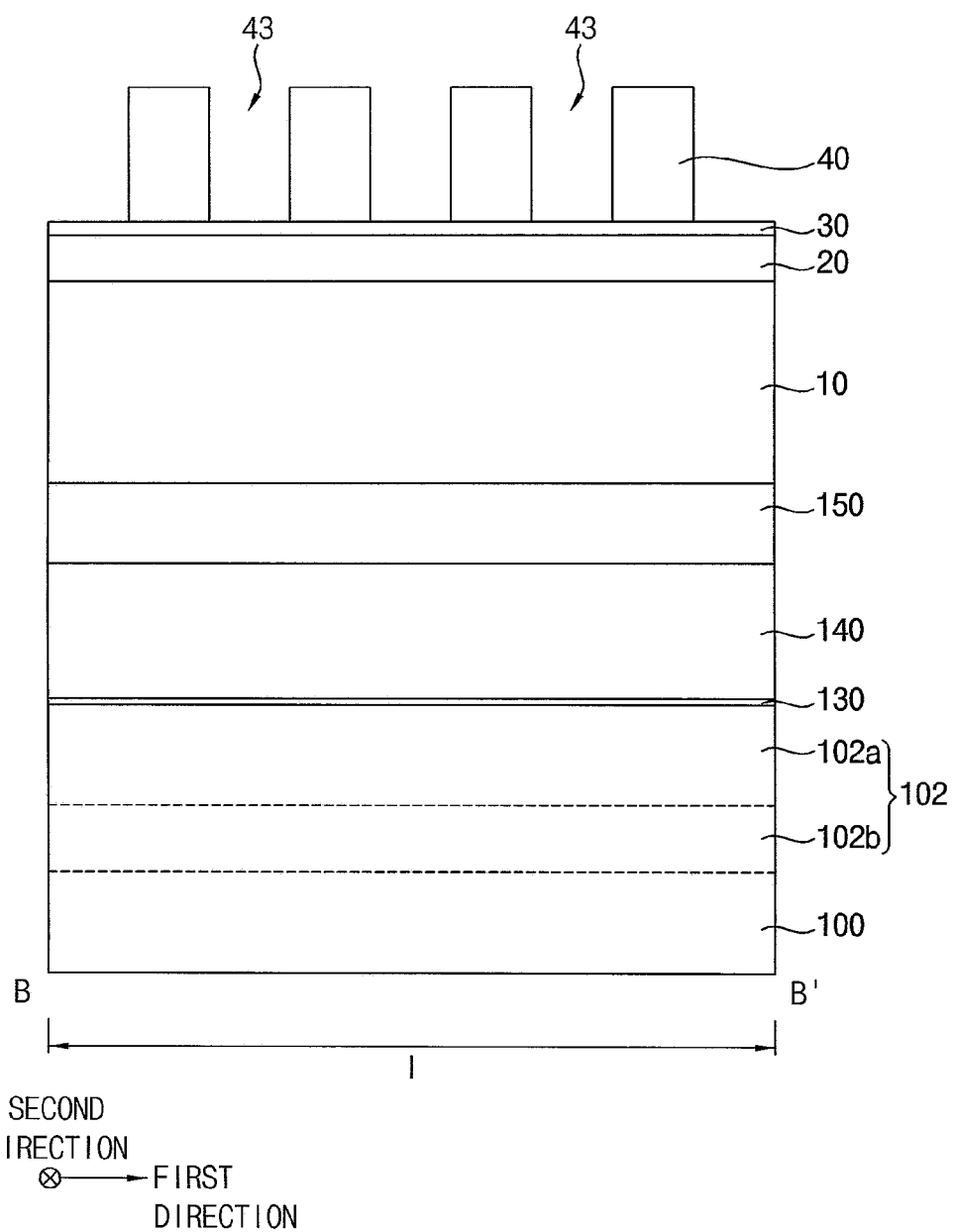
FIGS. 6, 9, 23, 33, 37, 41, 51, 59, 61 and 65 are cross-sectional views taken along lines B-B' of corresponding ones of the plan views, respectively.

Referring to FIGS. 4 to 6, first, second and third layers 10, 20 and 30 may be sequentially formed on the dummy gate mask layer 150, and a first photoresist pattern 40 may be formed on the third layer 30.

For example, the first layer 10 may include a spin-on-hardmask (SOH), the second layer 20 may include an oxynitride, e.g., plasma enhanced silicon oxynitride (PE-SION), and the third layer 30 may include a bottom anti-reflective coating (BARC) layer.

In examples, the first photoresist pattern 40 may have a plurality of first openings 43 spaced in the first direction and each of which may extend in the second direction, and an upper surface of the third layer 30 may be partially exposed by each of the first openings 43.

Figure 8:
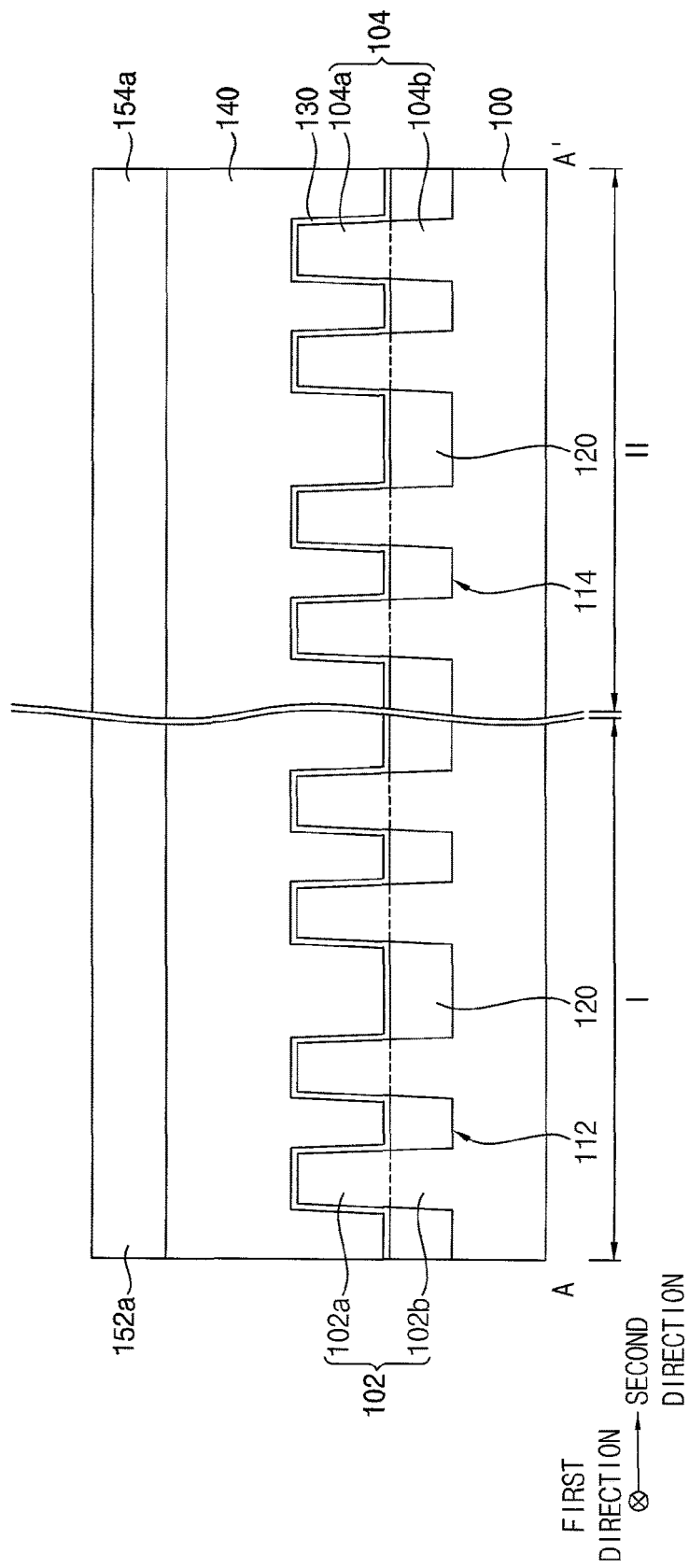
Figure 9:
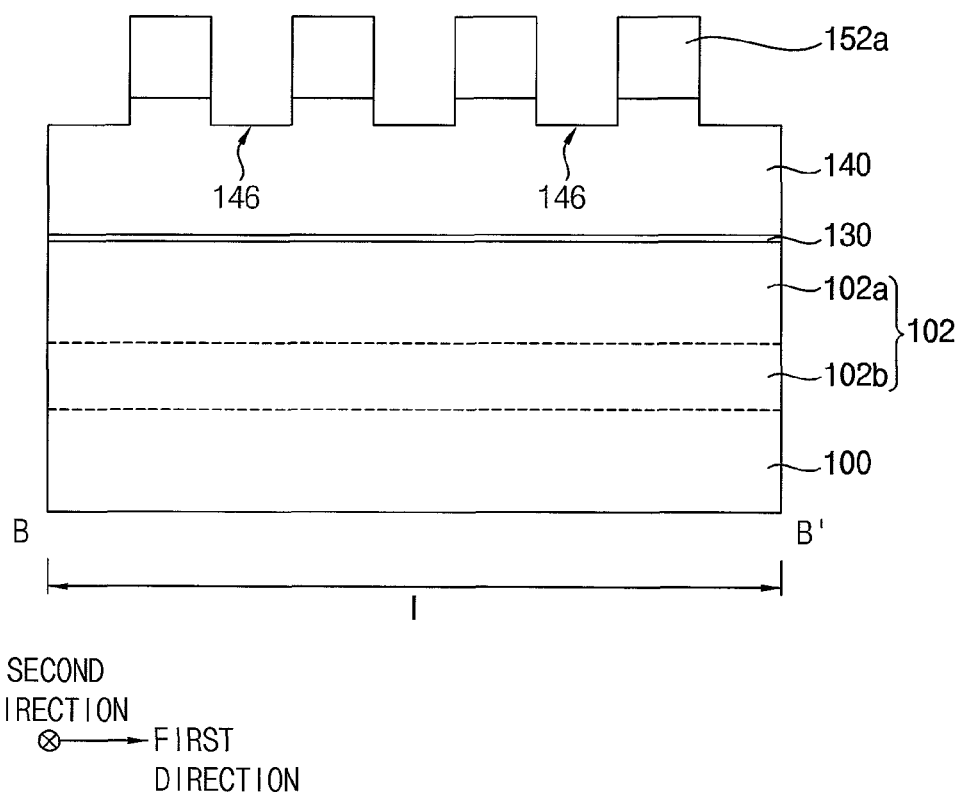

Referring to FIGS. 7 to 9, a first etching process using the first photoresist pattern 40 as an etching mask may be performed to sequentially etch the third layer 30, the second layer 20 and the first layer 10, and the first photoresist pattern 40, the third layer 30 and the second layer 20 may be removed in the first etching process. A second etching process using the first layer 10 as an etching mask may be performed to etch the dummy gate mask layer 150 so that first and second preliminary dummy gate masks 152a and 154a may be formed in the first and second regions I and II, respectively, of the substrate 100.

The remaining first layer 10 after the second etching process may be removed by, e.g., an ashing process and/or a stripping process.

In examples, each of the first and second preliminary dummy gate masks 152a and 154a may extend in the second direction, and a plurality of first preliminary dummy gate masks 152a and a plurality of second preliminary dummy gate masks 154a may be formed in the first direction.

When the first and second preliminary dummy gate masks 152a and 154a are formed, an upper portion of the underlying dummy gate electrode layer 140 may be partially removed to form a third recess 146; however, the inventive concept is not limited thereto. When the dummy gate electrode layer 150 may be sufficiently removed to form the first and second preliminary dummy gate masks 152a and 154*a* well, the third recess 146 may not be necessarily formed at an upper portion of the dummy gate electrode layer 140.

Figure 10:
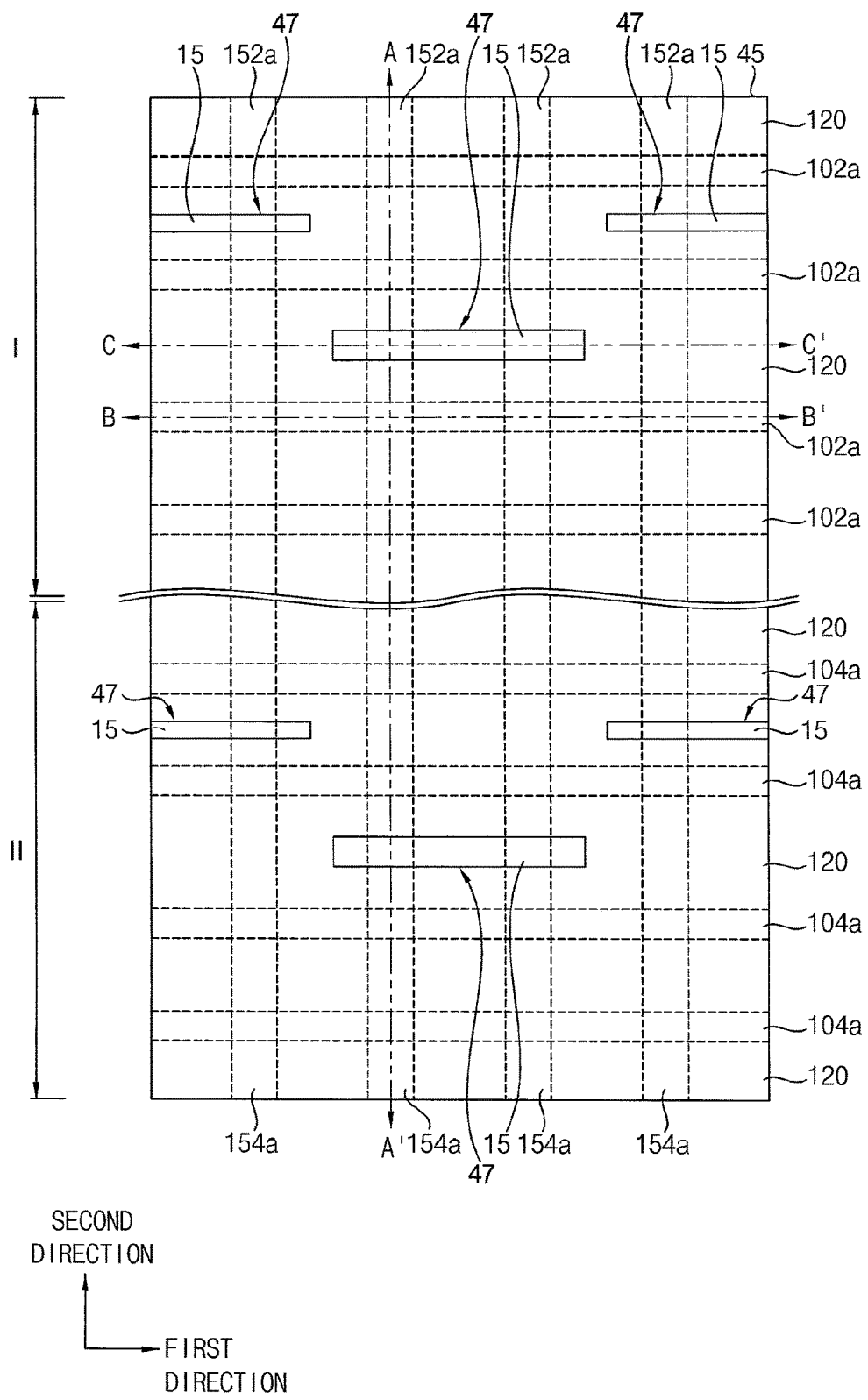
Figure 11:
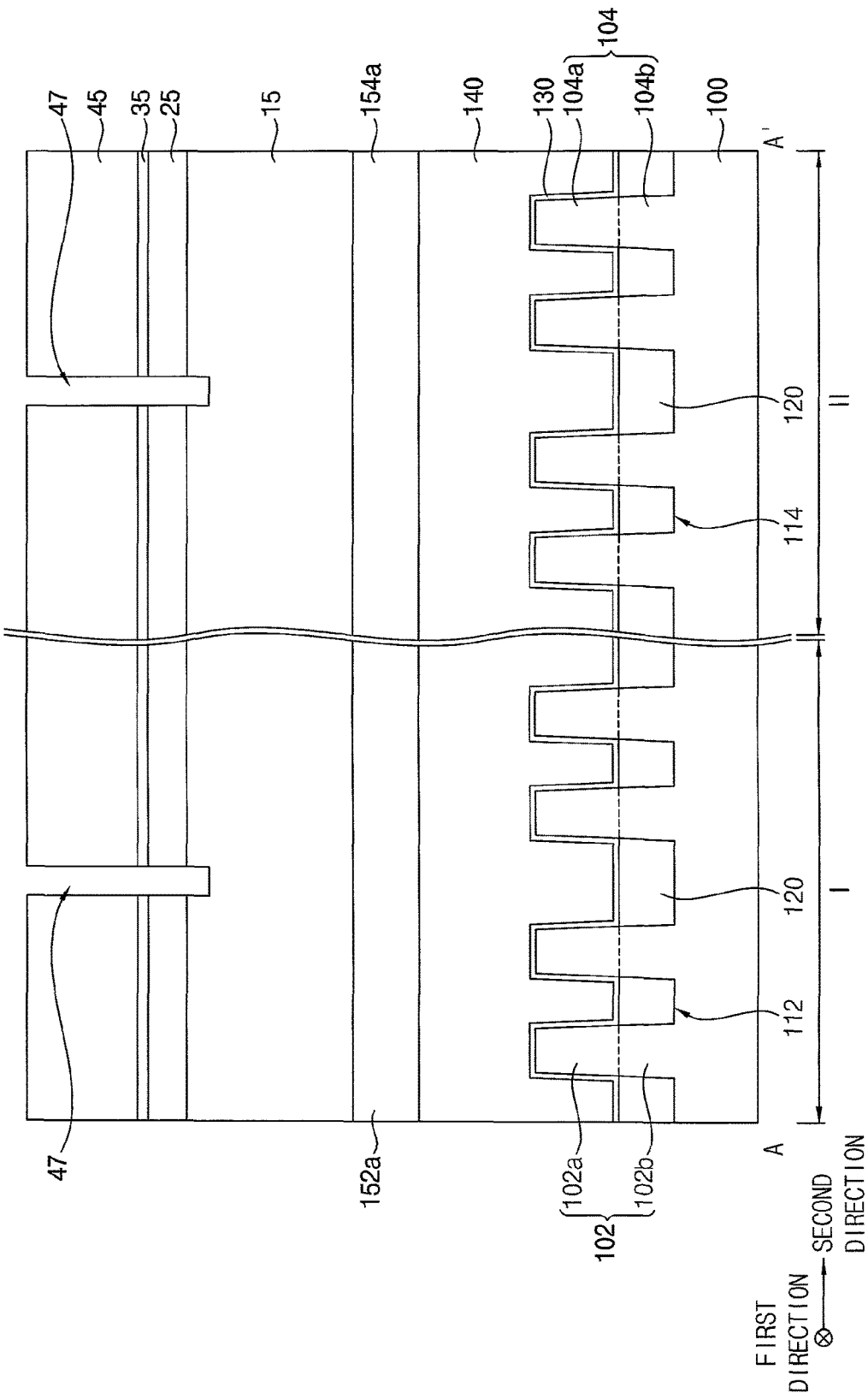
Figure 12:
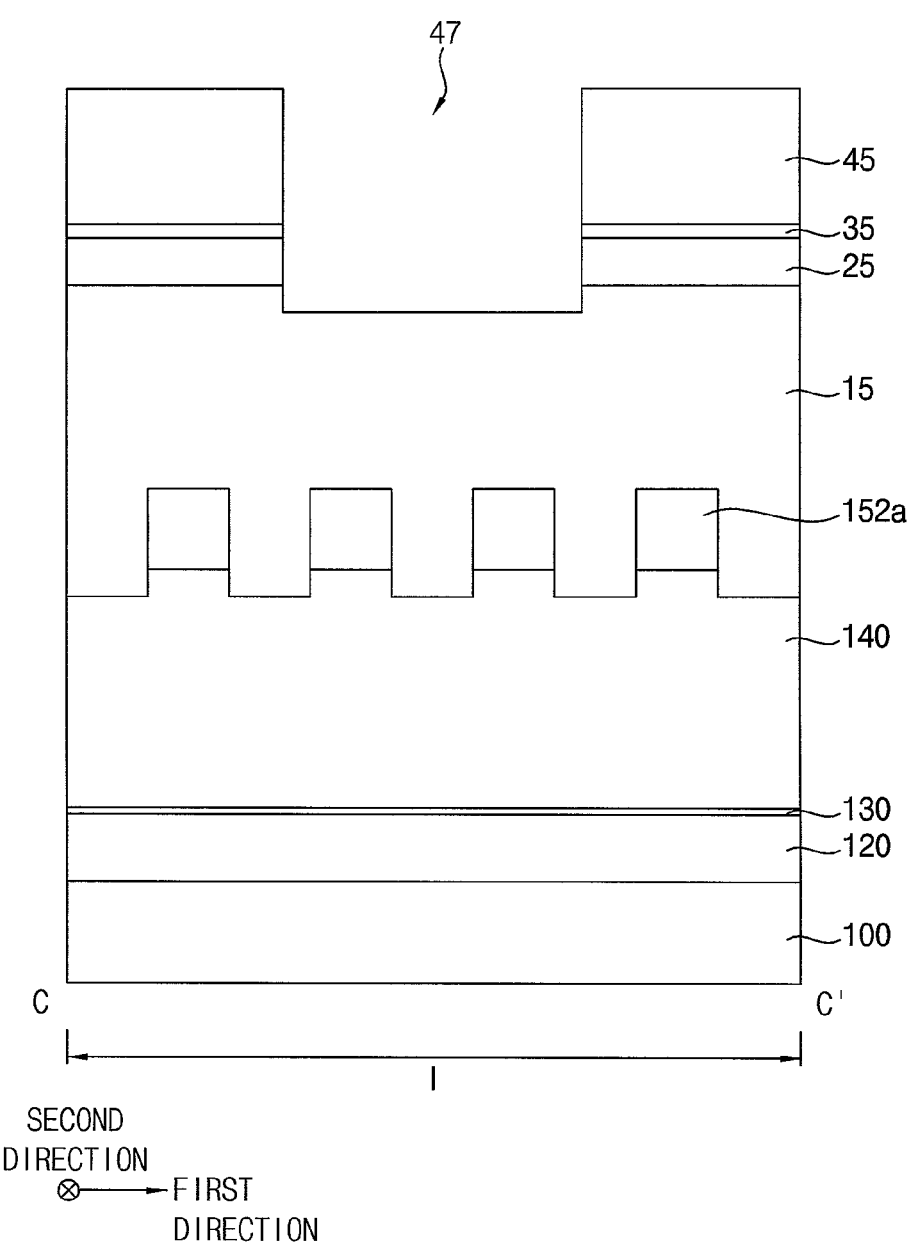
FIGS. 12, 14, 17, 20, 24, 28 and 42 are cross-sectional views taken along lines C-C' of corresponding ones of the plan views, respectively.

Referring to FIGS. 10 to 12, fourth, fifth and sixth layers 15, 25 and 35 may be sequentially formed on the first and second preliminary dummy gate masks 152*a* and 154*a* and the dummy gate electrode layer 140, and a second photoresist pattern 45 may be formed on the sixth layer 35.

For example, the fourth layer 15 may include SOH, the fifth layer 25 may include an oxynitride, e.g., PE-SION, and the sixth layer 35 may include a BARC layer.

In examples, the second photoresist pattern 45 may have a plurality of second openings 47 formed in both the first and second directions and each of which may extend in the first direction, and an upper surface of the sixth layer 35 may be partially exposed by each of the second openings 47.

A third etching process using the second photoresist pattern 45 as an etching mask may be performed to sequentially etch the sixth layer 35 and the fifth layer 25, and an upper portion of the fourth layer 15 may be partially etched. Thus, each of the second openings 47 extending through the second photoresist pattern 45 may be vertically enlarged to extend through the sixth layer 35, the fifth layer 25, and an upper portion of the fourth layer 15.

Figure 13:
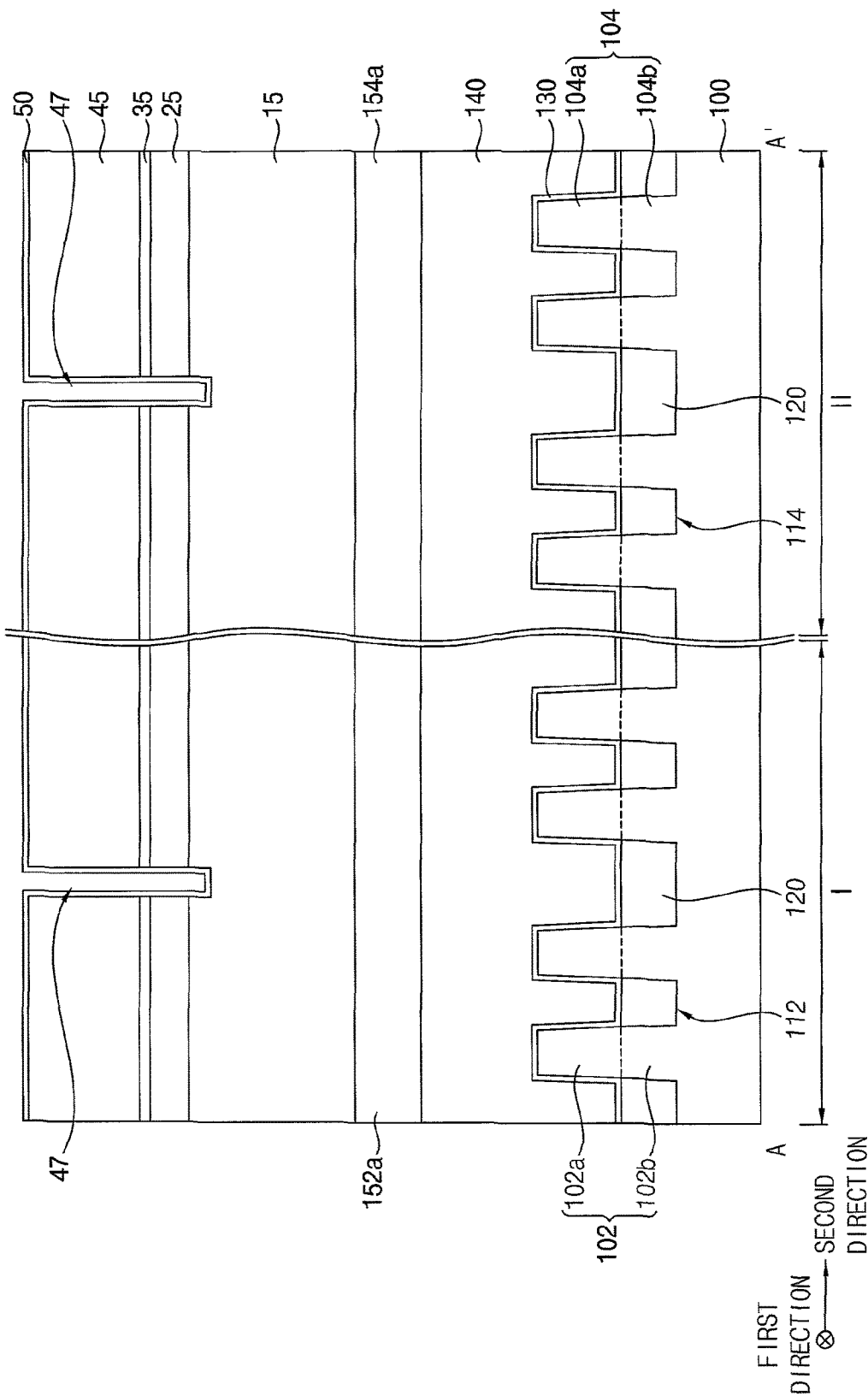
Figure 14:
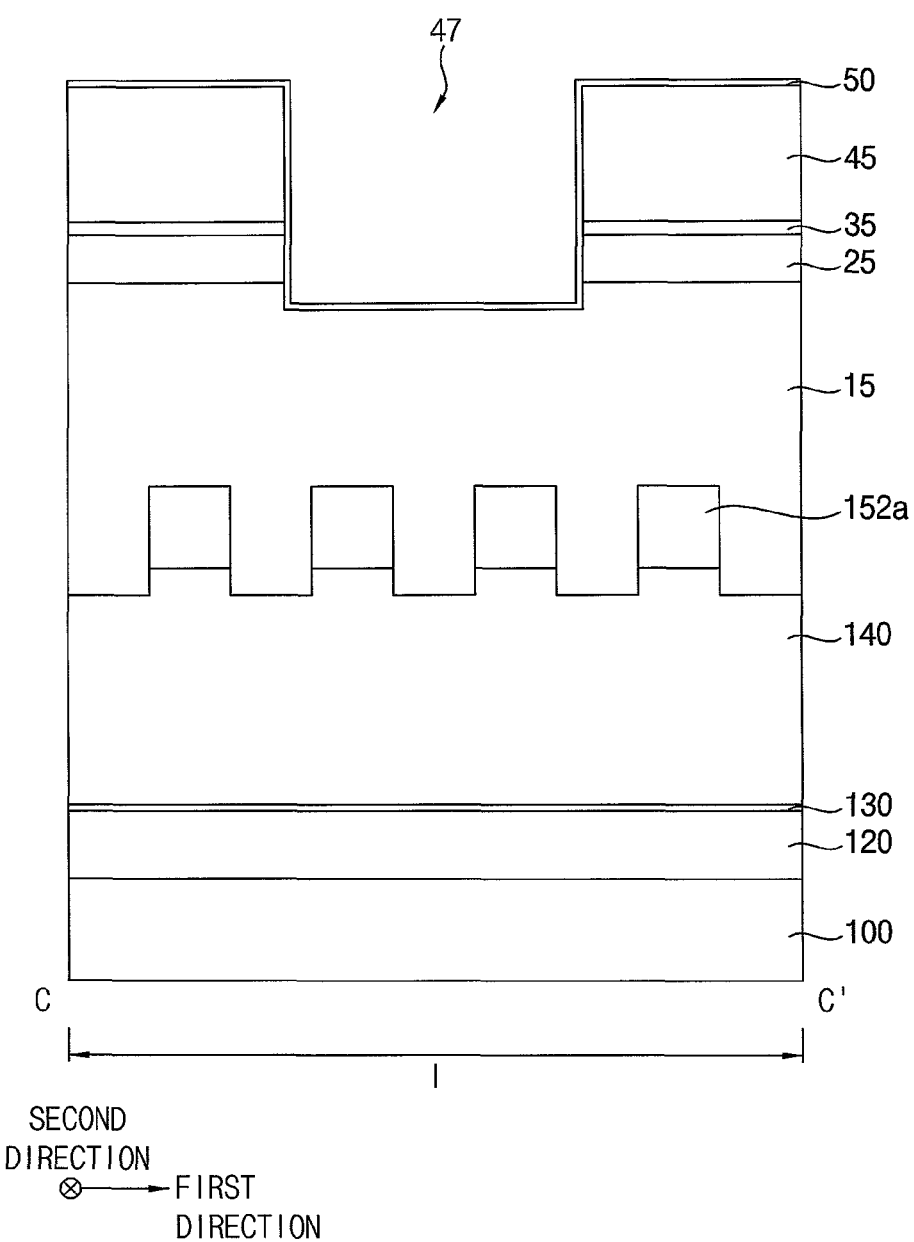

Referring to FIGS. 13 and 14, a seventh layer 50 may be formed on side surfaces of the second openings 47, the exposed upper portions of the fourth layer 15 by the second openings 47 and the second photoresist pattern 45.

The seventh layer 50 may be thinly formed on the side surfaces of the second openings 47, and may protect the fifth and sixth layers 25 and 35 and the second photoresist pattern 45 in a subsequent etching process for etching the fourth layer 15 so that each of the fifth and sixth layers 25 and 35 and the second photoresist pattern 45 may have a constant width. In some examples, the seventh layer 50 may not be formed. In examples, the seventh layer 50 may be formed of an oxide, e.g., atomic layer deposition oxide (ALD-OX).

Figure 15:
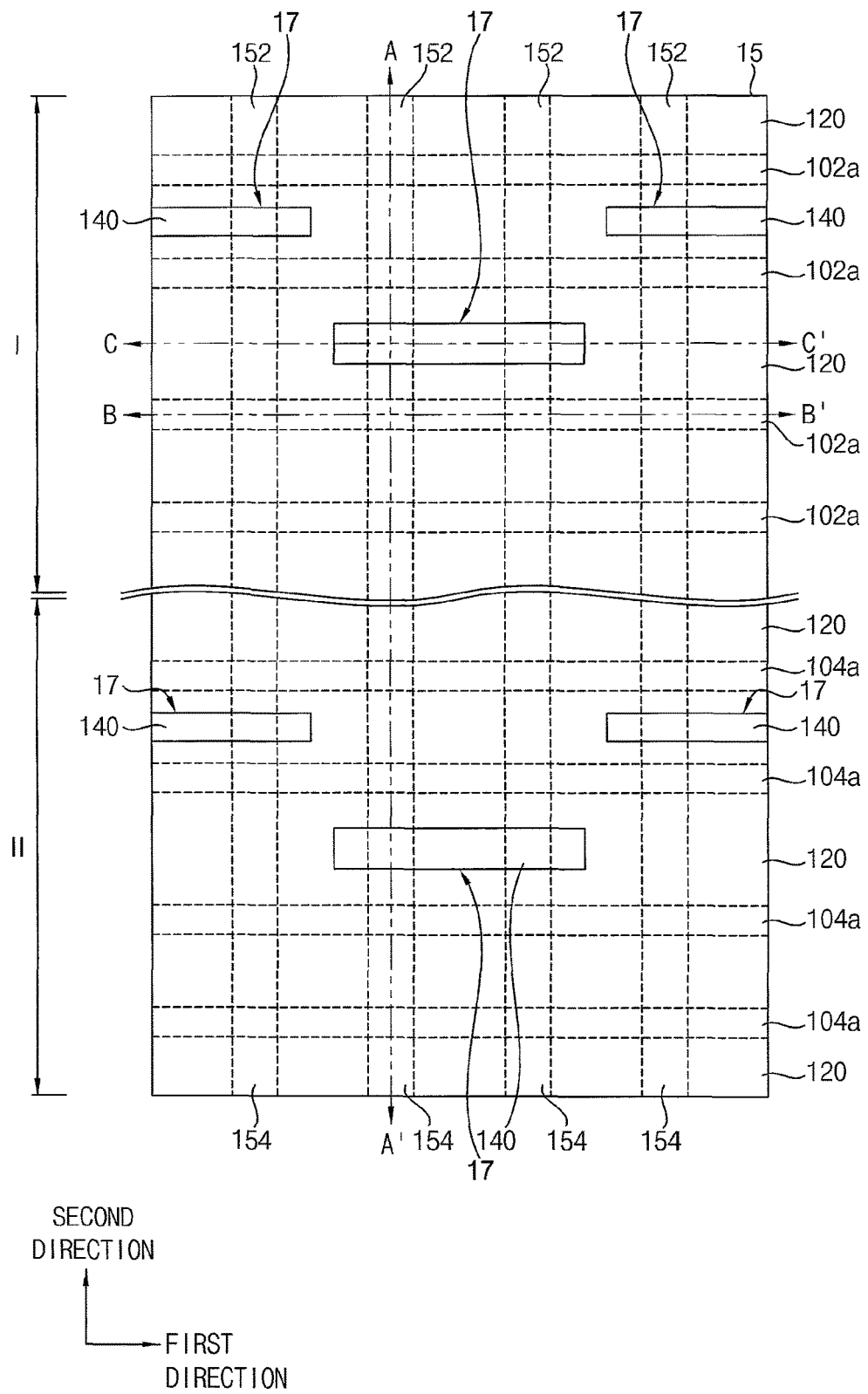
Figure 16:
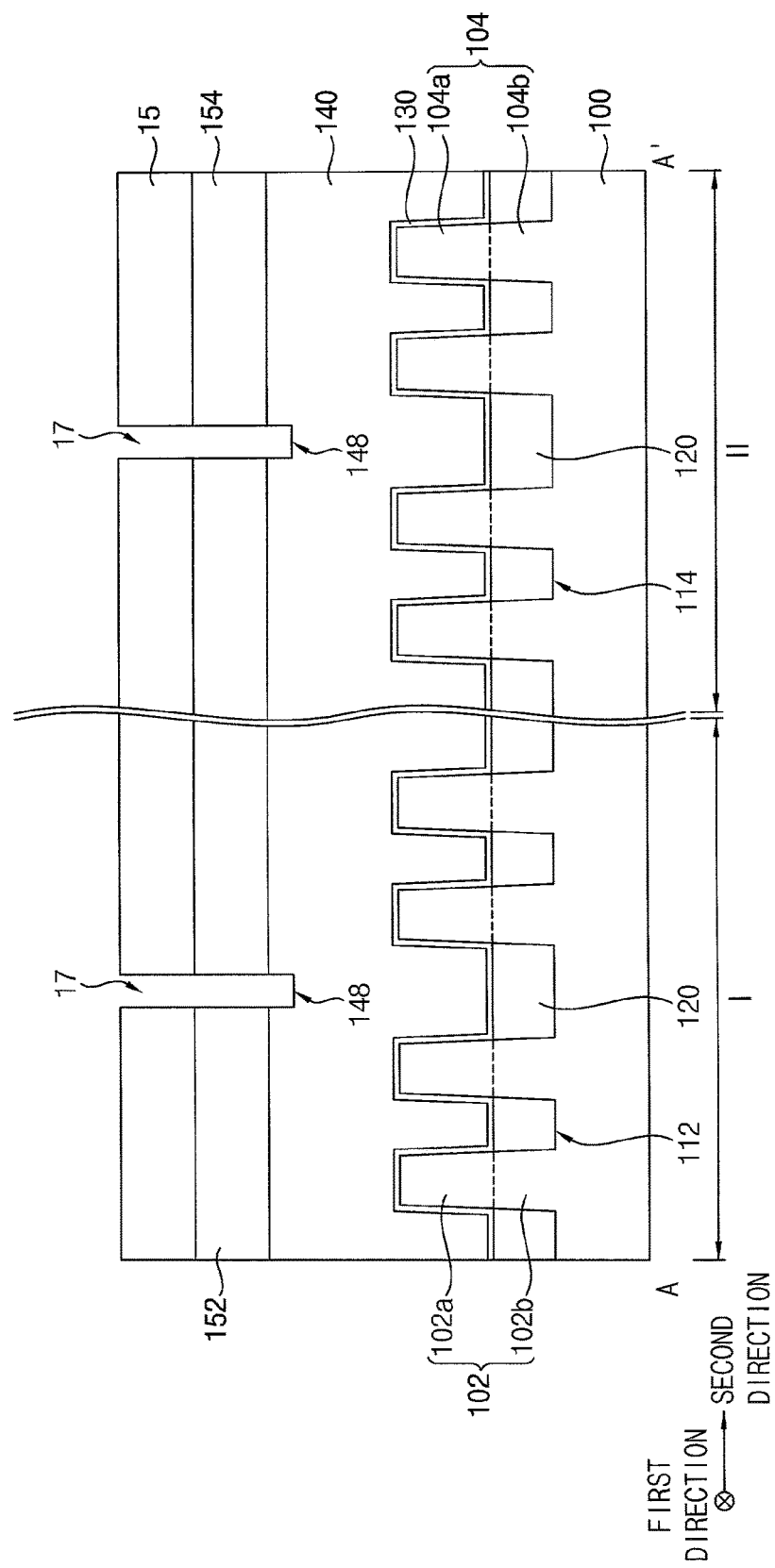
Figure 17:
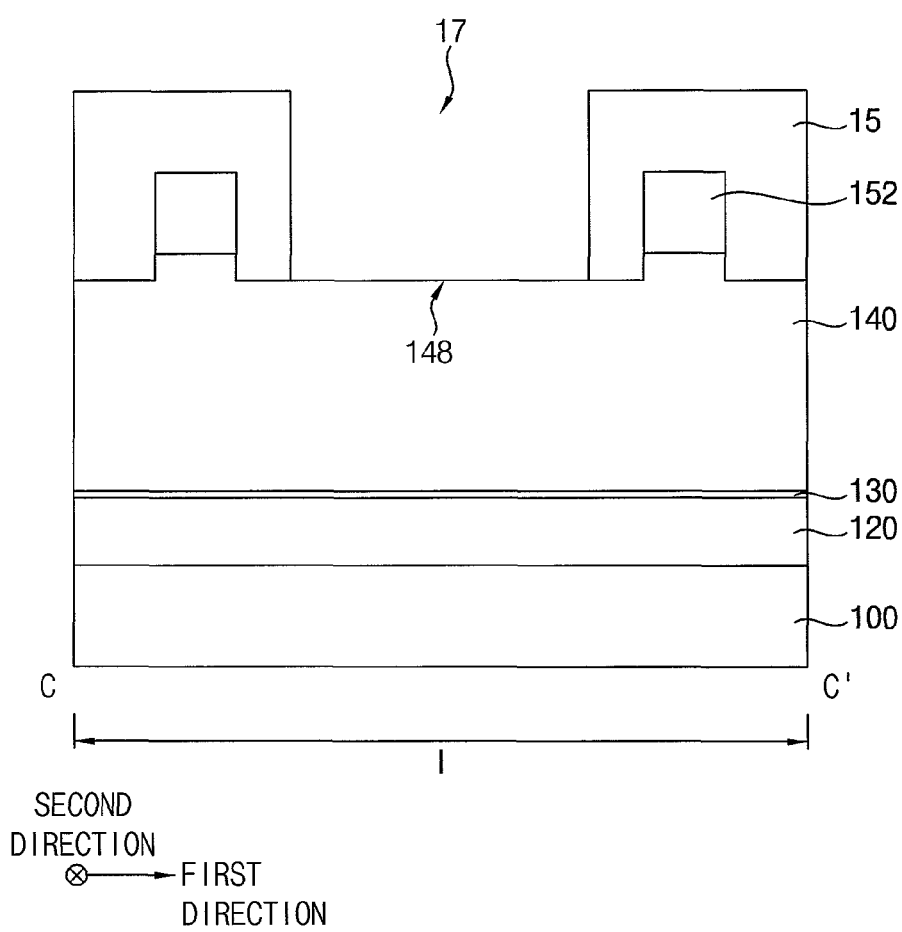

Referring to FIGS. 15 to 17, a fourth etching process using the second photoresist pattern 45, the sixth layer 35 and the fifth layer 25 as an etching mask may be performed to etch the underlying fourth layer 15, and the second photoresist pattern 45, the sixth layer 35 and the fifth layer 25 may be removed in the fourth etching process. The underlying first and second preliminary dummy gate masks 152*a* and 154*a* may be etched using the remaining fourth layer 15 as an etching mask to form first and second dummy gate masks 152 and 154 in the first and second regions I and II, respectively, of the substrate 100.

When the first and second dummy gate masks 152 and 154 are formed, an upper portion of the underlying gate electrode layer 140 may be removed to form a fourth recess 148; however, the inventive concept is not limited thereto. When the first and second preliminary dummy gate masks 152*a* and 154*a* are sufficiently etched to form the first and second dummy gate masks 152 and 154 well, the fourth recess 148 may not be necessarily formed on the dummy gate electrode layer 140.

As the fourth etching process is performed, a third opening 17 may be formed through the fourth layer 15, and the first and second dummy gate masks 152 and 154. The third opening 17 may be formed on the fourth recess 148 to be in communication therewith, i.e., so as to be open to or open into the fourth recess 148. The third opening 17 like the second opening 47 may extend in the first direction, and a plurality of third openings 17 may be formed in both the first and second directions.

Figure 18:
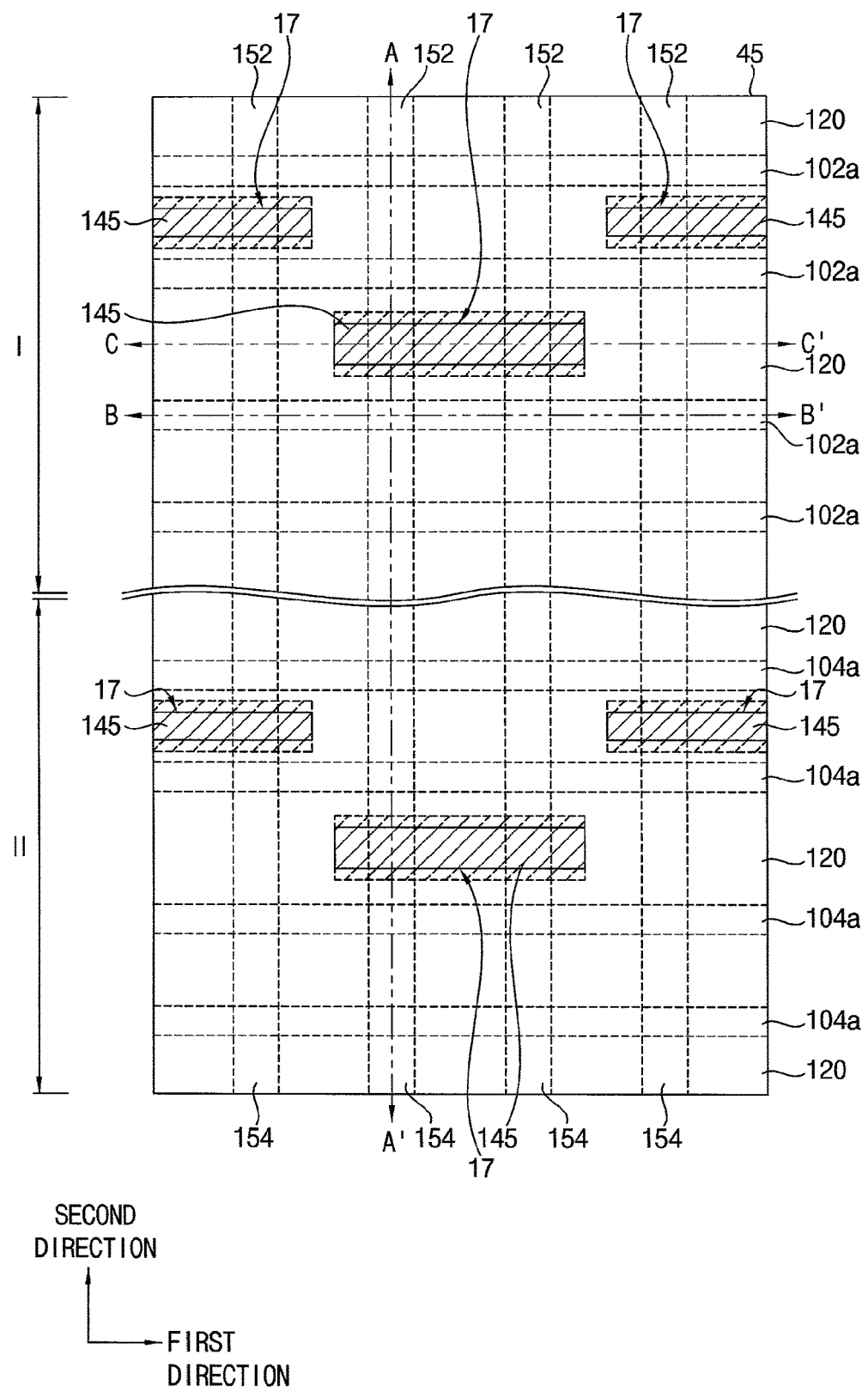
Figure 19:
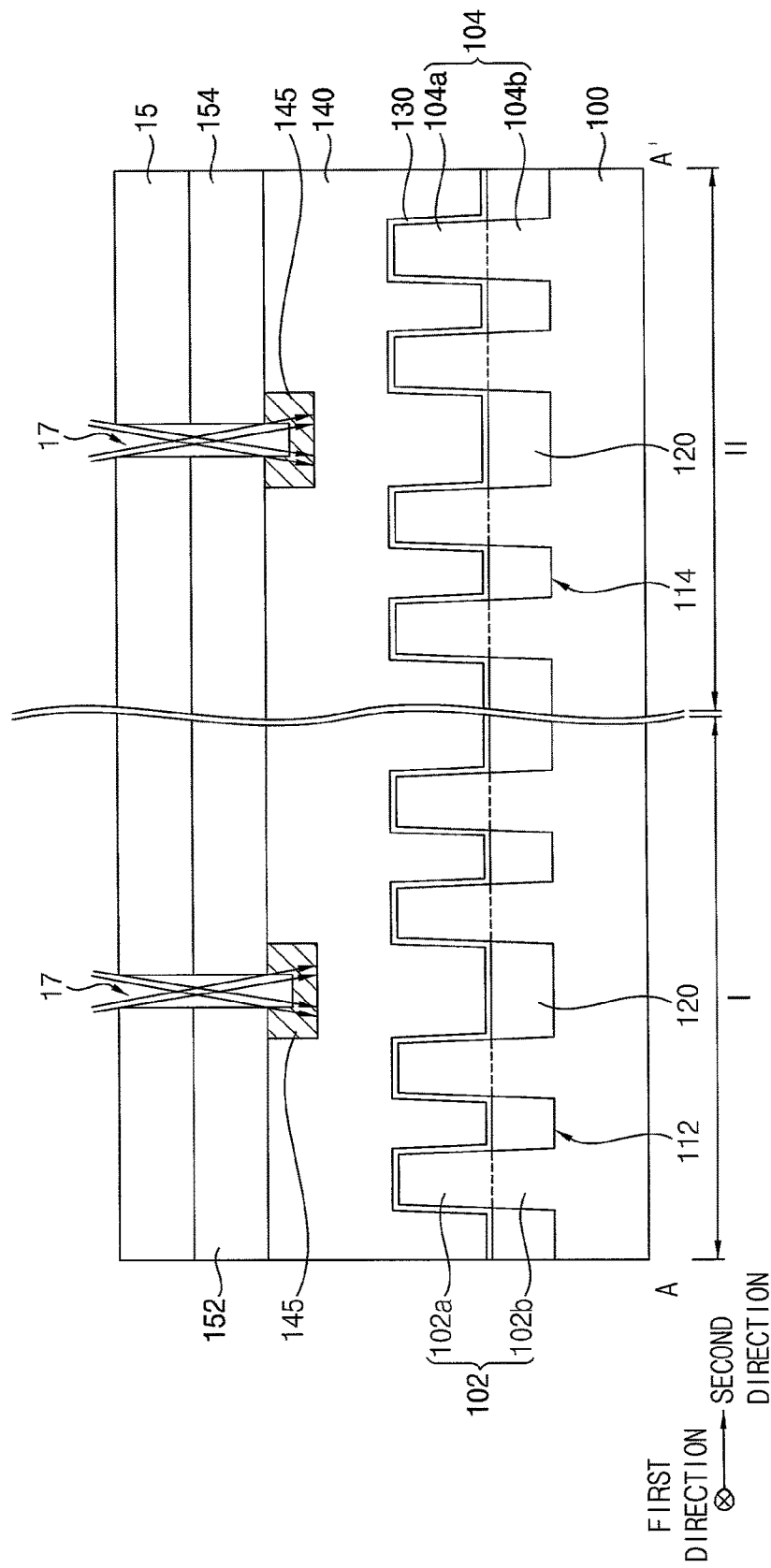
Figure 20:
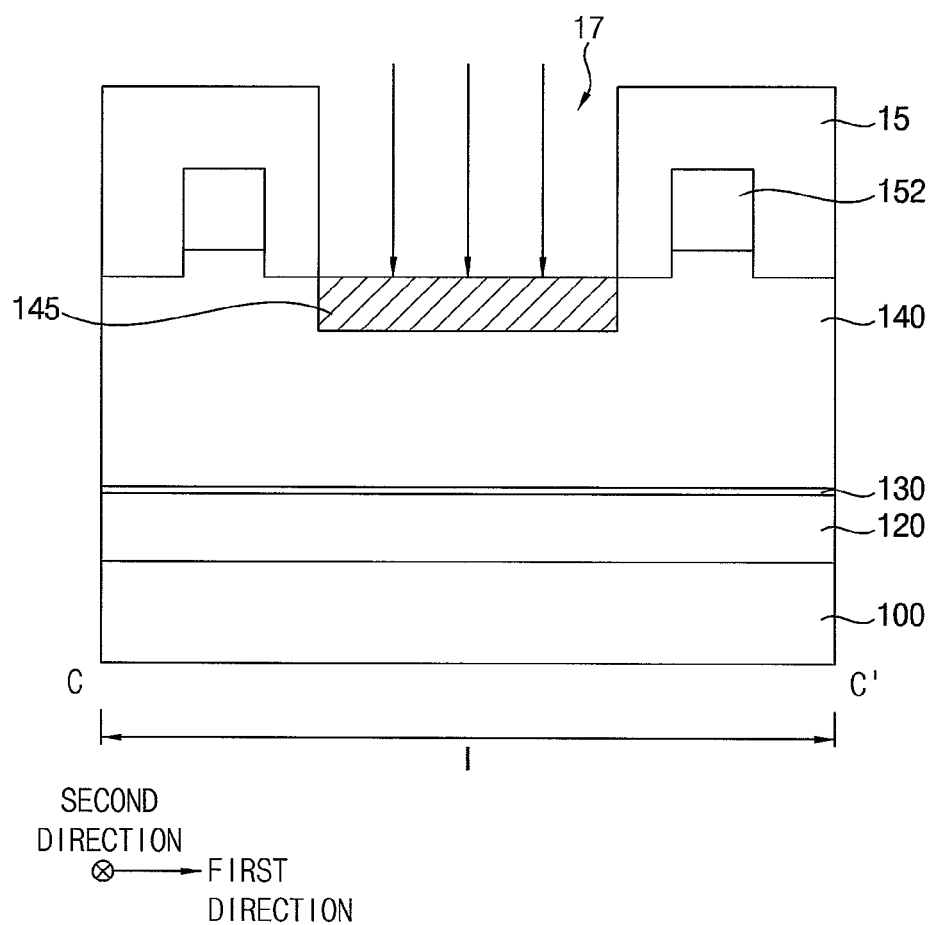
Figure 21:
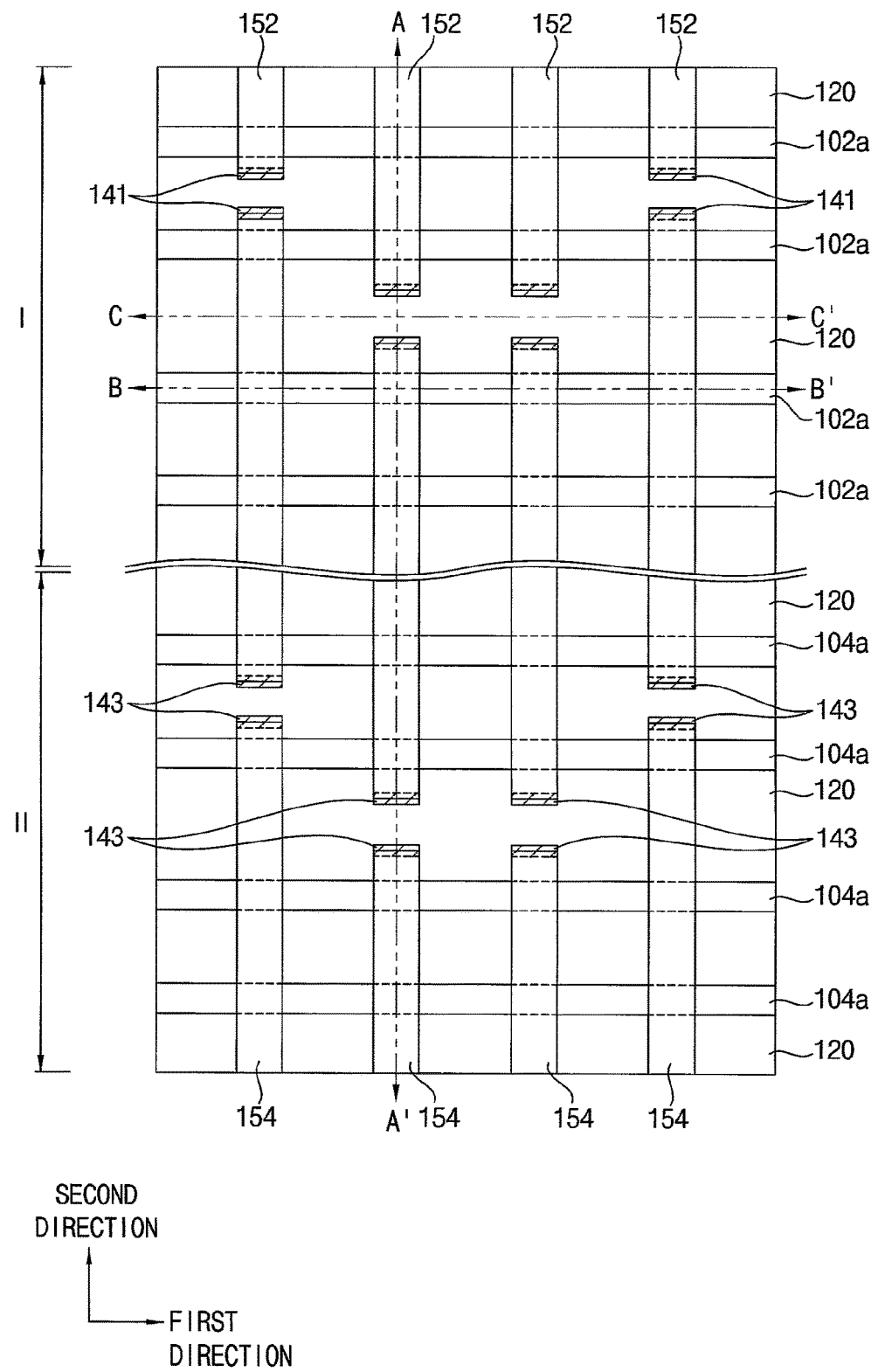
Figure 22:
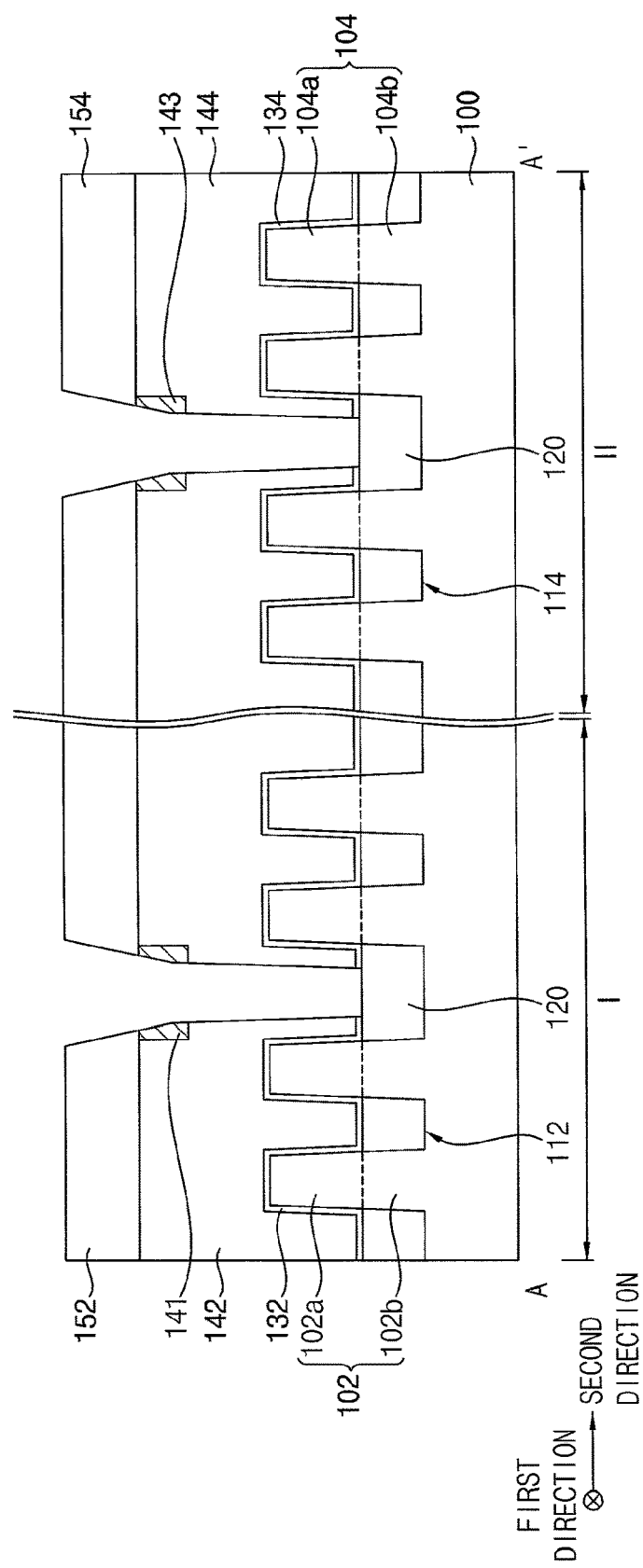
Figure 23:
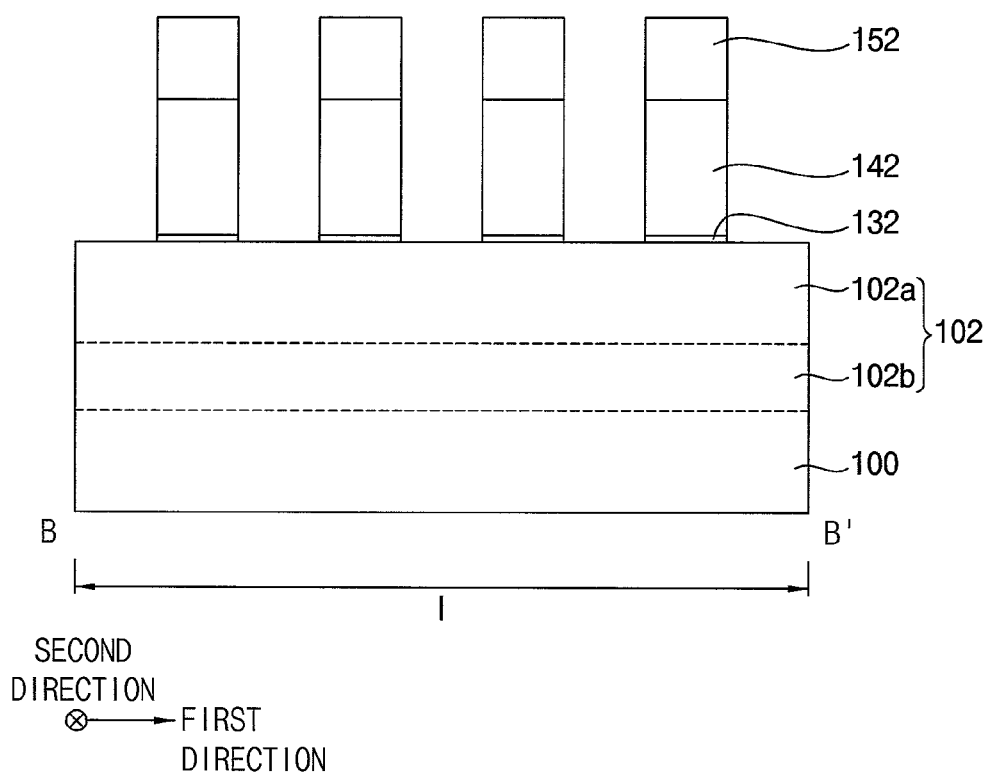
Figure 24:
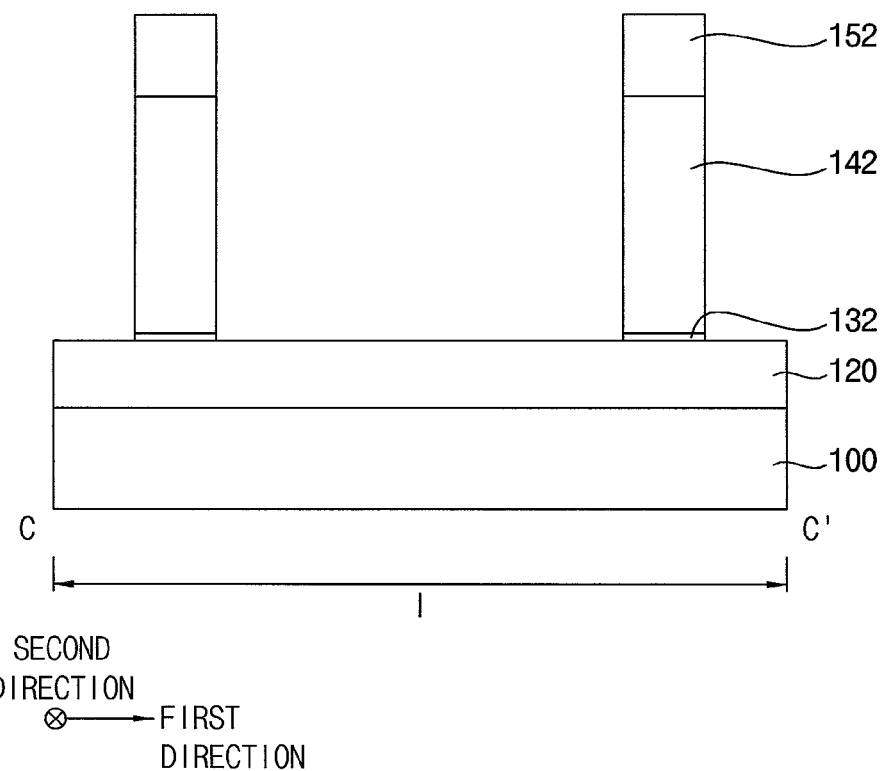

Referring to FIGS. 18 to 20, an angled ion implantation process may be performed through the third opening 17 to implant ions into a portion of the dummy gate electrode layer 140 adjacent the fourth recess 148, and thus a growth blocking layer 145 may be formed on the dummy gate electrode layer 140.

The growth blocking layer 145 may prevent the dummy gate electrode layer 140 including polysilicon from serving as a seed in a subsequent first selective epitaxial growth (SEG) process illustrated with reference to FIGS. 35 to 38. The growth blocking layer 145, which may be formed by implanting ions into the dummy gate electrode layer 140 including polysilicon, may not serve as a seed in the SEG process, and thus no epitaxial layer may be grown from the dummy gate electrode layer 140.

The ions may include, e.g., nitrogen, carbon, oxygen, arsenic, etc.; however, the inventive concept is not limited thereto, and any ions that may prevent the dummy gate electrode layer 140 from serving as a seed may be used.

In examples, the angled ion implantation process may be performed such that the ions are implanted into the dummy gate electrode layer 140 in a direction slanted, i.e., inclined, with respect to the top surface of the substrate 100 in a cross-sectional view taken along the second direction. Thus, the growth blocking layer 145 may be formed at a portion of the dummy gate electrode layer 140 under the fourth recess 148 and a portion thereof adjacent the fourth recess 148 in the second direction.

Referring to FIGS. 21 to 24, the fourth layer 15 may be removed by, e.g., an ashing process and/or a stripping process, and the dummy gate electrode layer 140 and the dummy gate insulation layer 130 may be sequentially etched using the first and second dummy gate masks 152 and 154 as an etching mask to form first and second dummy gate structures on the first and second regions I and II, respectively, of the substrate 100.

The first dummy gate structure may be formed to include a first dummy gate insulation pattern 132, a first dummy gate electrode 142 and a first dummy gate mask 152 sequentially stacked on the first active fin 102 and a portion of the isolation pattern 120 adjacent the first active fin 102 in the second direction, and the second dummy gate structure may be formed to include a second dummy gate insulation pattern 134, a second dummy gate electrode 144 and a second dummy gate mask 154 sequentially stacked on the second active fin 104 and a portion of the isolation pattern 120 adjacent the second active fin 104 in the second direction.

In examples, each of the first and second dummy gate structures may be formed to extend in the second direction on each of the first and second active fins 102 and 104 and the isolation pattern 120, and a plurality of first dummy gate structures and a plurality of second dummy gate structures may be formed in both the first and second directions.

When the etching process is performed, opposite side surfaces of each of the first and second dummy gate structures in the first direction may be formed to be nearly vertical to the top surface of the substrate 100, while opposite end surfaces (which may also be referred to as side surfaces hereinafter) of each of the first and second dummy gate structures in the second direction may be formed to be slanted with respective to the top surface of the substrate 100. In the etching process, the opposite side surfaces of each of the first and second dummy gate structures in the first direction may be influenced by an etching gas from the first direction, while the opposite side surfaces of each of the first and second dummy gate structures in the second direction may be influenced by an etching gas not only from the first direction but also from the second direction.

In particular, the first and second dummy gate insulation patterns 132 and 134 and lower portions of the first and second dummy gate electrodes 142 and 144, which may be formed at lower portions of the first and second dummy gate structures, respectively, may be formed to have opposite end surfaces (which will be referred to as second side surfaces in the second direction hereinafter) that may be nearly vertical to the top surface of the substrate 100, while the first and second dummy gate masks 152 and 154 and upper portions of the first and second dummy gate electrodes 142 and 144, which may be formed at upper portions of the first and second dummy gate structures, respectively, may be formed to have opposite end surfaces (which will be referred to as side surfaces in the second direction hereinafter) that may be slanted with respect to the top surface of the substrate 100.

In the etching process, a portion of the growth blocking layer 145 under the fourth recess 148 may be removed, and thus first and second growth blocking patterns 141 and 143 may be formed at upper portions of opposite side surfaces in the second direction of the first and second dummy gate electrodes 142 and 144, respectively.

Figure 25:
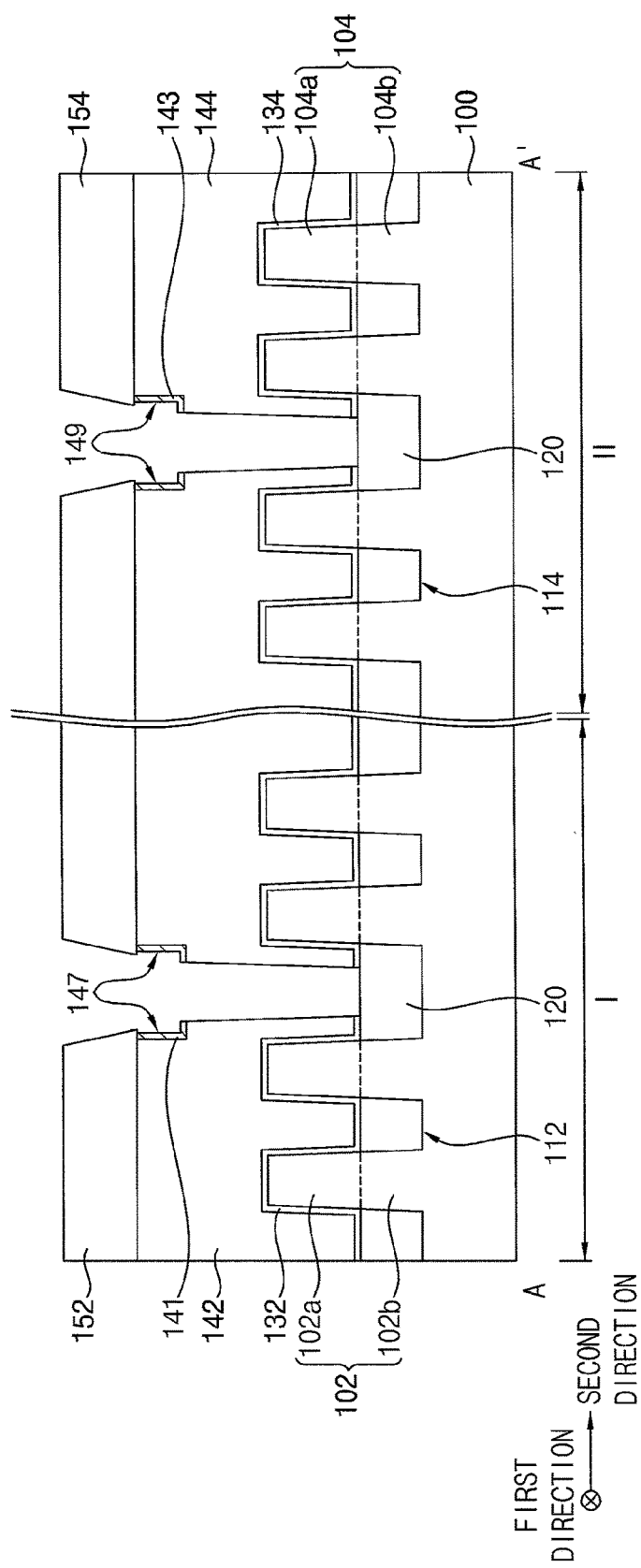
Figure 26:
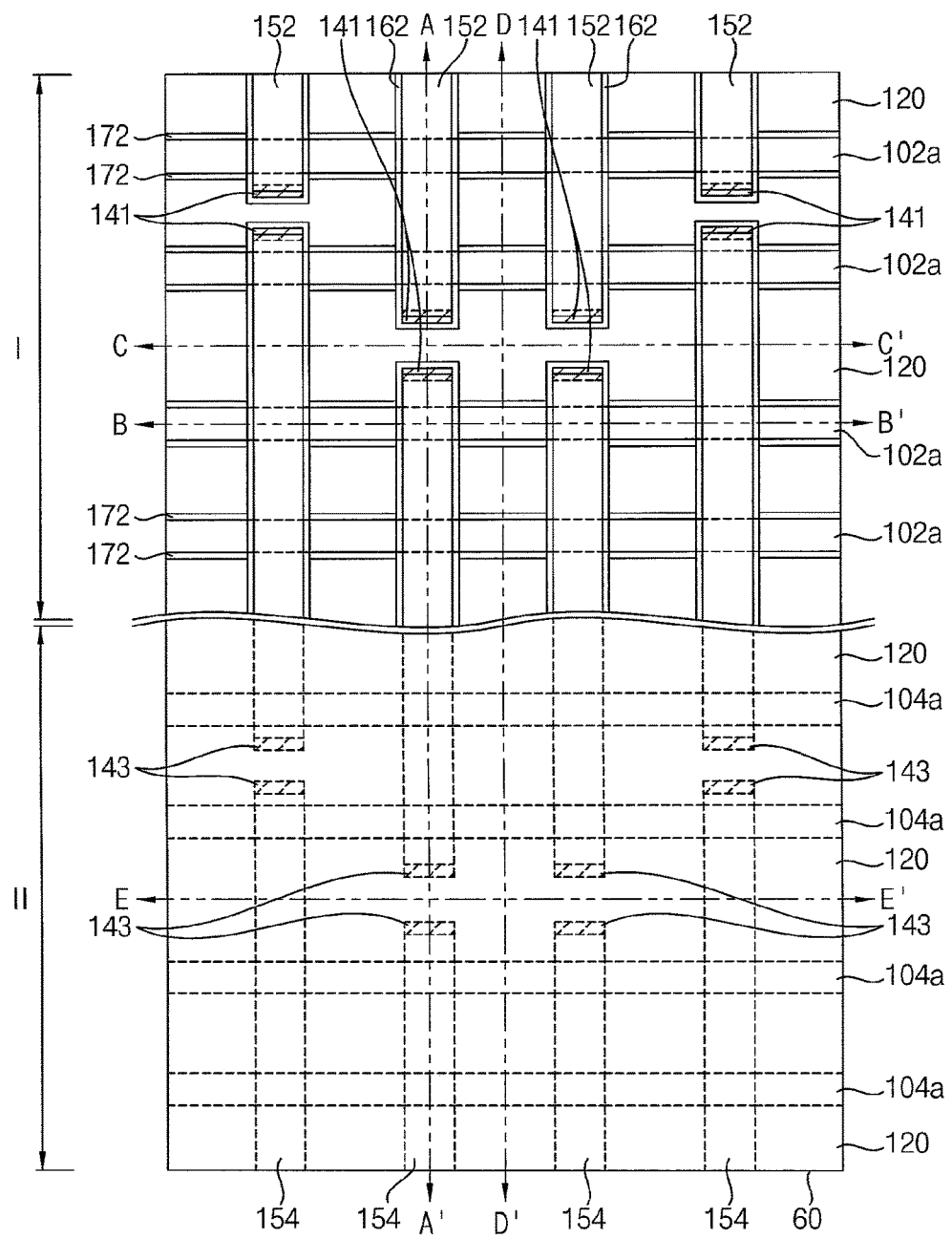
Figure 27:
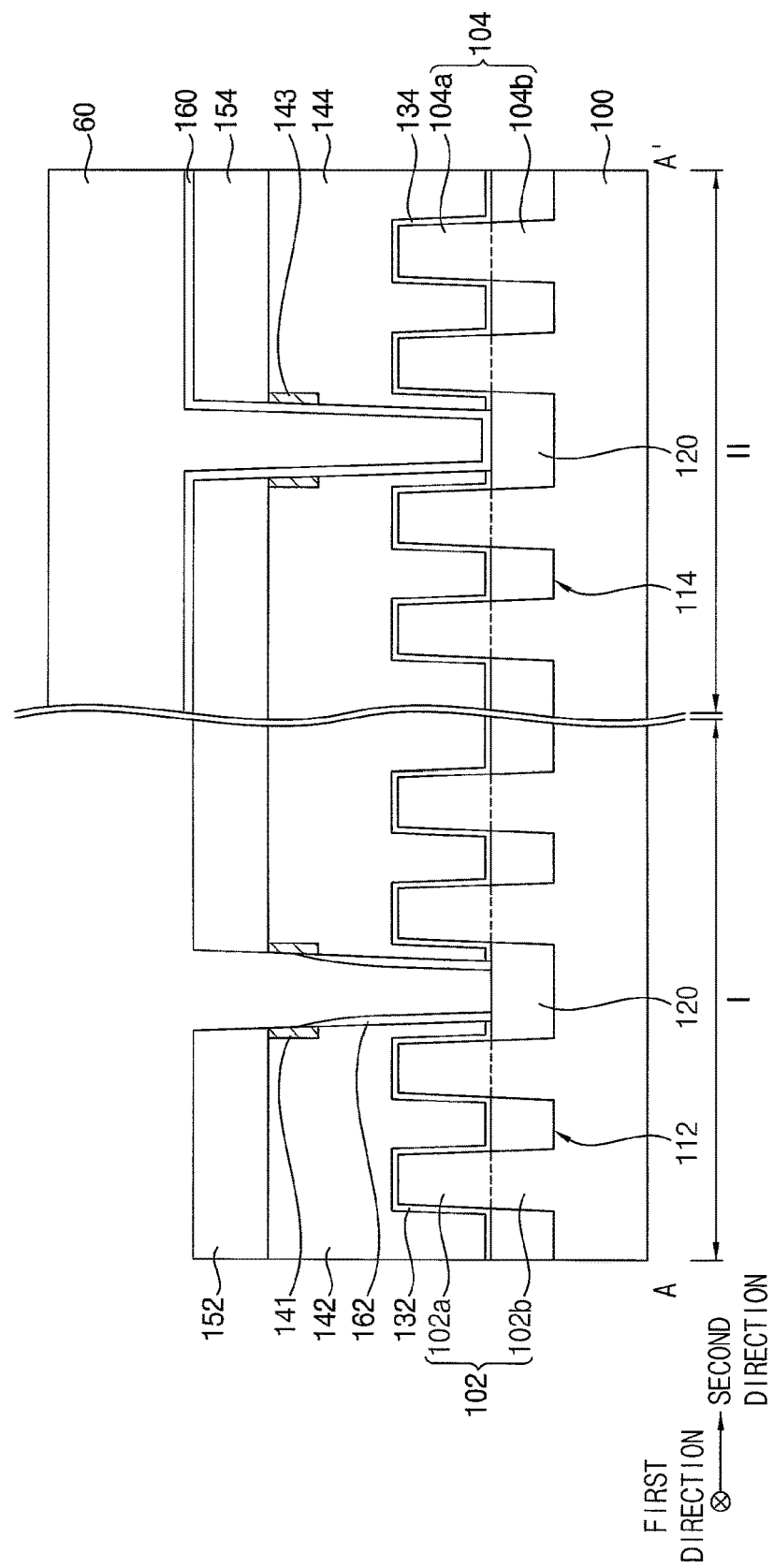
Figure 28:
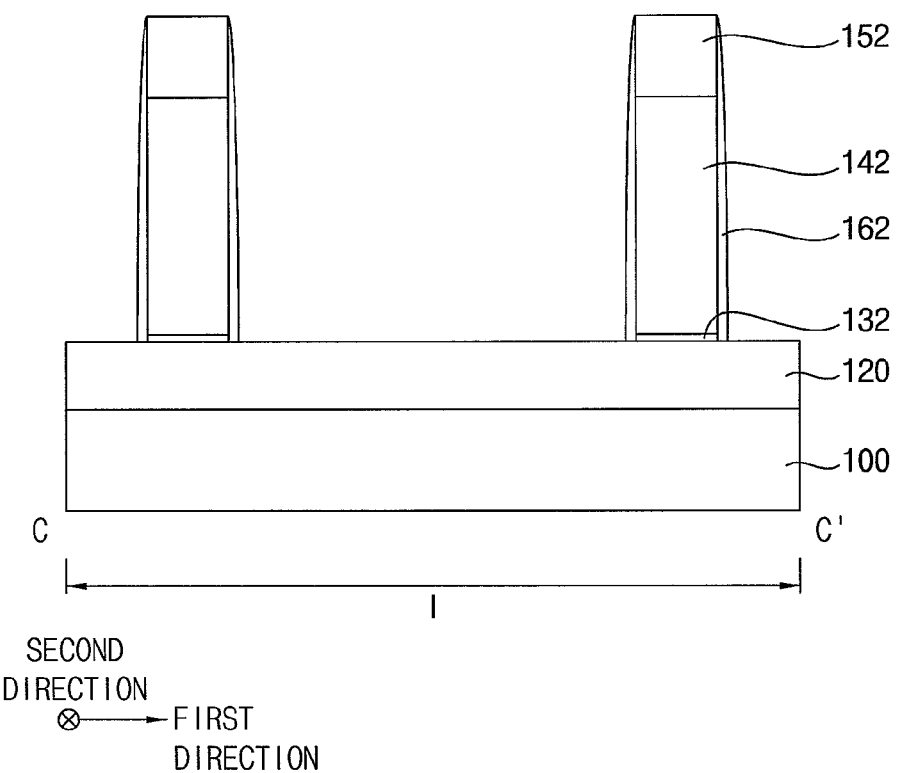
Figure 29:
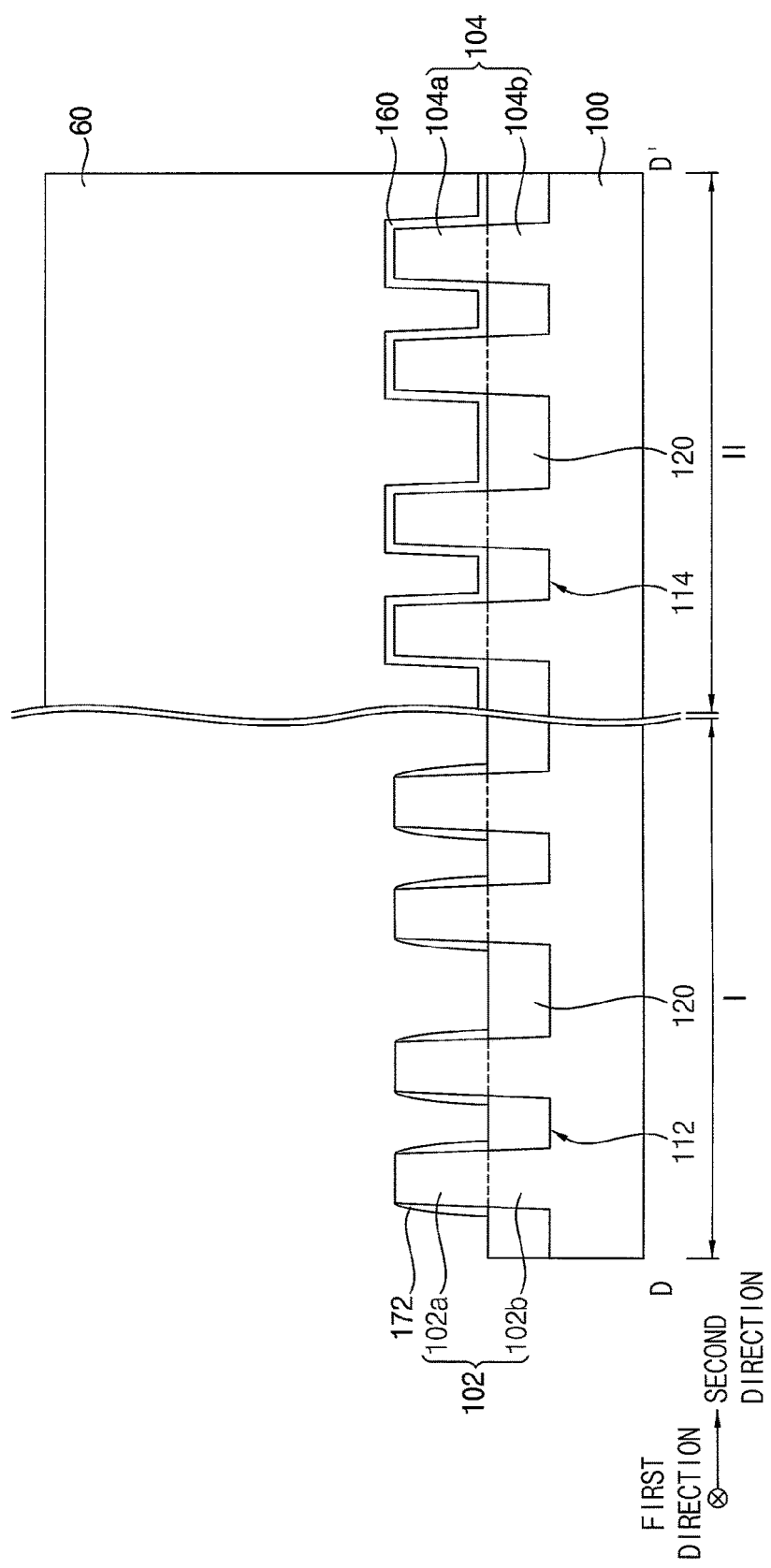
FIGS. 29, 34, 38, 43, 47, 52, 62 and 66 are cross-sectional views taken along lines D-D' of corresponding ones of the plan views, respectively.
Figure 30:
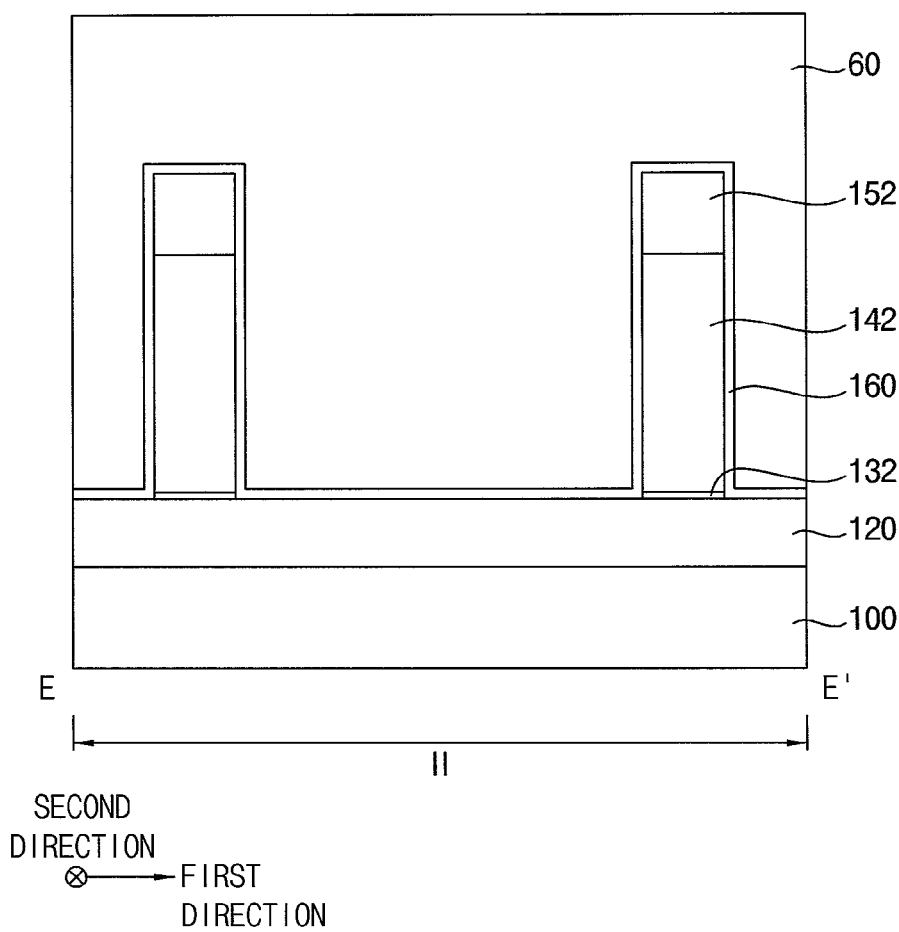
FIGS. 30 and 44 are cross-sectional views taken along lines E-E' of corresponding ones of the plan views.

Referring to FIG. 25, the growth blocking layer 145 may be further etched in the etching process when compared to the dummy gate electrode layer 140, and thus first and second indentations 147 and 149 may be formed in sides of the first and second growth blocking patterns 141 and 143, respectively.

The dummy gate electrode layer 140 may include, e.g., polysilicon, while the growth blocking layer 145 may include polysilicon doped with nitrogen, carbon, etc., and thus etching rates of the dummy gate electrode layer 140 and the growth blocking layer 145 may be different from each other. Accordingly, according to the etching gas and the difference of elements between the dummy gate electrode layer 140 and the growth blocking layer 145, the growth blocking layer 145 may be over-etched when compared to the dummy gate electrode layer 140.

Referring to FIGS. 26 to 30, a first spacer layer 160 may be formed on the first and second regions I and II of the substrate 100 on which the first and second dummy gate structures are formed, a third photoresist pattern 60 covering the second region II of the substrate 100 may be formed on the first spacer layer 160, and an anisotropic etching process may be performed using the third photoresist pattern 60 as an etching mask.

Thus, a first gate spacer 162 may be formed on sides of the first dummy gate structure on the first region I of the substrate 100, and a first fin spacer 172 may be formed on sides of the first active fin 102.

The first spacer layer 160 may be formed of a nitride, e.g., silicon nitride, silicon oxycarbonitride, etc.

The first gate spacer 162 may include a first portion on opposite first side surfaces of the first dummy gate structure in the first direction, and a second portion on opposite second side surfaces of the first dummy gate structure in the second direction.

In examples, the first portion of the first gate spacer 162 may cover the entirety of the first side surfaces of the first dummy gate structure. On the other hand, the second portion of the first gate spacer 162 may not cover the entirety of the end or "second side" surfaces of the first dummy gate structure but expose respective upper portions of the second side surfaces.

In this example in which the first side surfaces of the first dummy gate structure are nearly vertical (perpendicular to the top surface of the substrate 100), a portion of the first spacer layer 160 on the first side surfaces of the first dummy gate structure may be hardly etched in the anisotropic etching process but will remain on those surfaces. However, upper portions of the second side surfaces of the first dummy gate structure may be inclined relative to the vertical (non-parallel and not perpendicular to the top surface of the substrate 100), and thus a portion of the first spacer layer 160 on the upper portions of the second side surfaces of the first dummy gate structure may be removed in the anisotropic etching process, in which case the first spacer layer 160 remains on lower portions only of the second side surfaces of the first dummy gate structure. Accordingly, the upper portions of the second side surfaces of the first dummy gate structure, especially, second side surfaces of the first dummy gate mask 152 in the second direction and upper portions of second side surfaces of the first dummy gate electrode 142 in the second direction are not covered, i.e., are exposed, by the second portion of the first gate spacer 162 in this example.

In examples, the first growth blocking pattern 141 may be formed on the upper portion of the second side surfaces of the first dummy gate structure not covered by the first gate spacer 162 but exposed on the upper portion of the second side surfaces of the first dummy gate electrode 142. That is, the second portion of the first gate spacer 162 may cover a lower portion of the first growth blocking pattern 141 but expose an upper portion thereof, and thus the top of the second portion of the first gate spacer 162 may be situated at a level between the bottom and top of the first growth blocking pattern 141.

However, the inventive concept is not limited thereto, and only a portion of the first side surfaces of the first dummy gate electrode 142 on which the first growth blocking pattern 141 may be covered. That is, the top of the first gate spacer 162 may be situated at a level at least above that of the bottom of the first growth blocking pattern 141.

Figure 31:
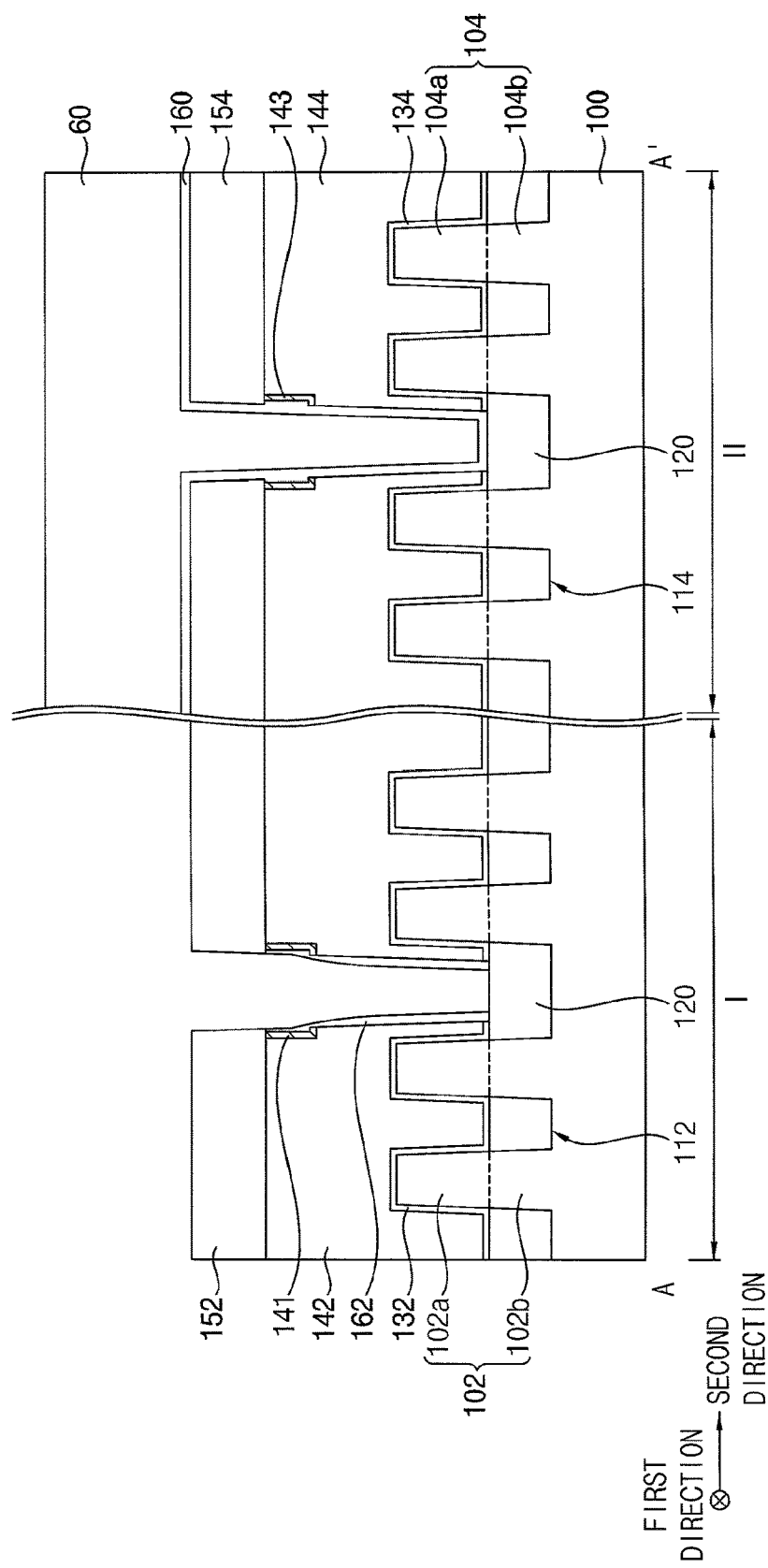

As illustrated with reference to FIG. 25, FIG. 31 shows the first spacer layer 160 and the first gate spacer 162 when the first and second indentations 147 and 149 are formed in the sides of the first and second growth blocking patterns 141 and 143, respectively.

Figure 32:
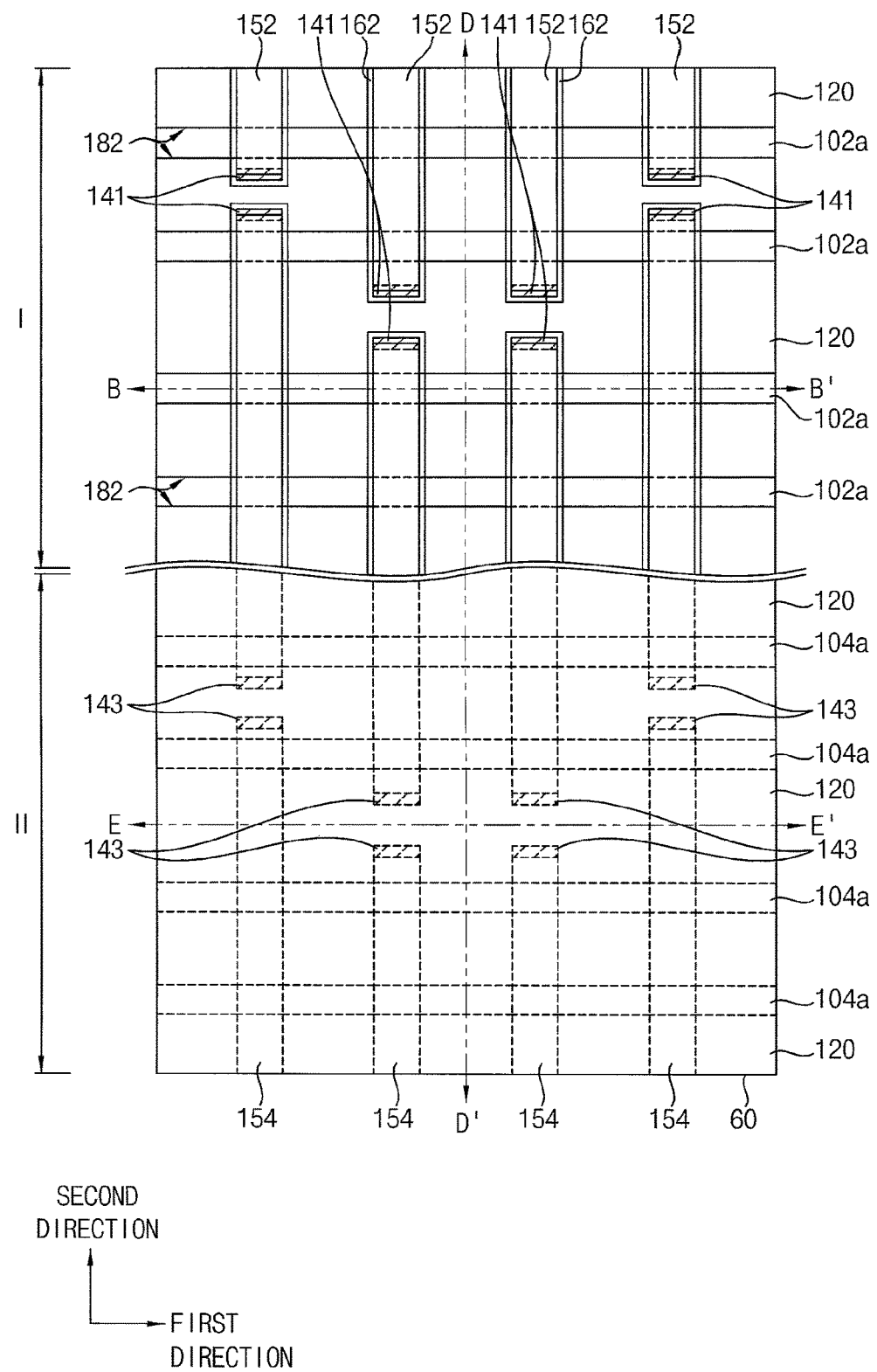
Figure 33:
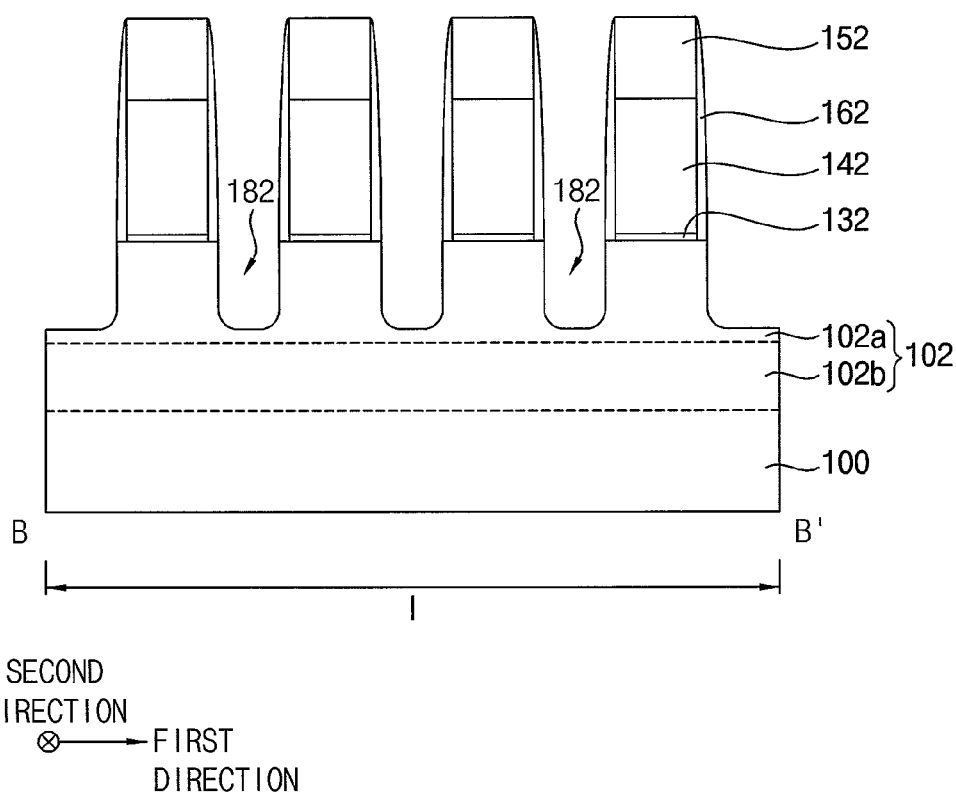
Figure 34:
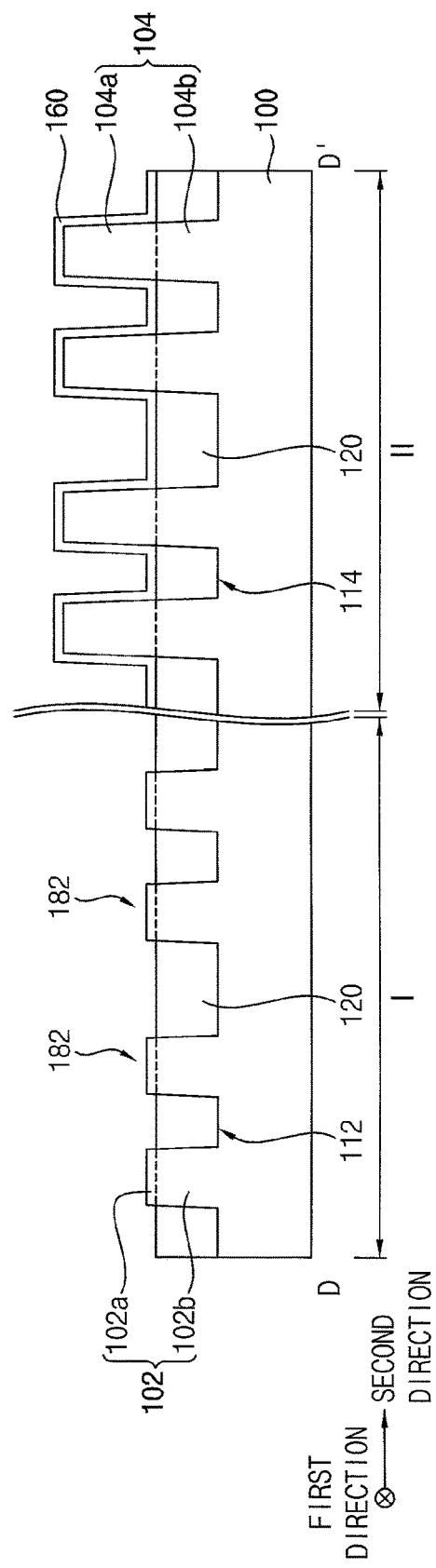
Figure 35:
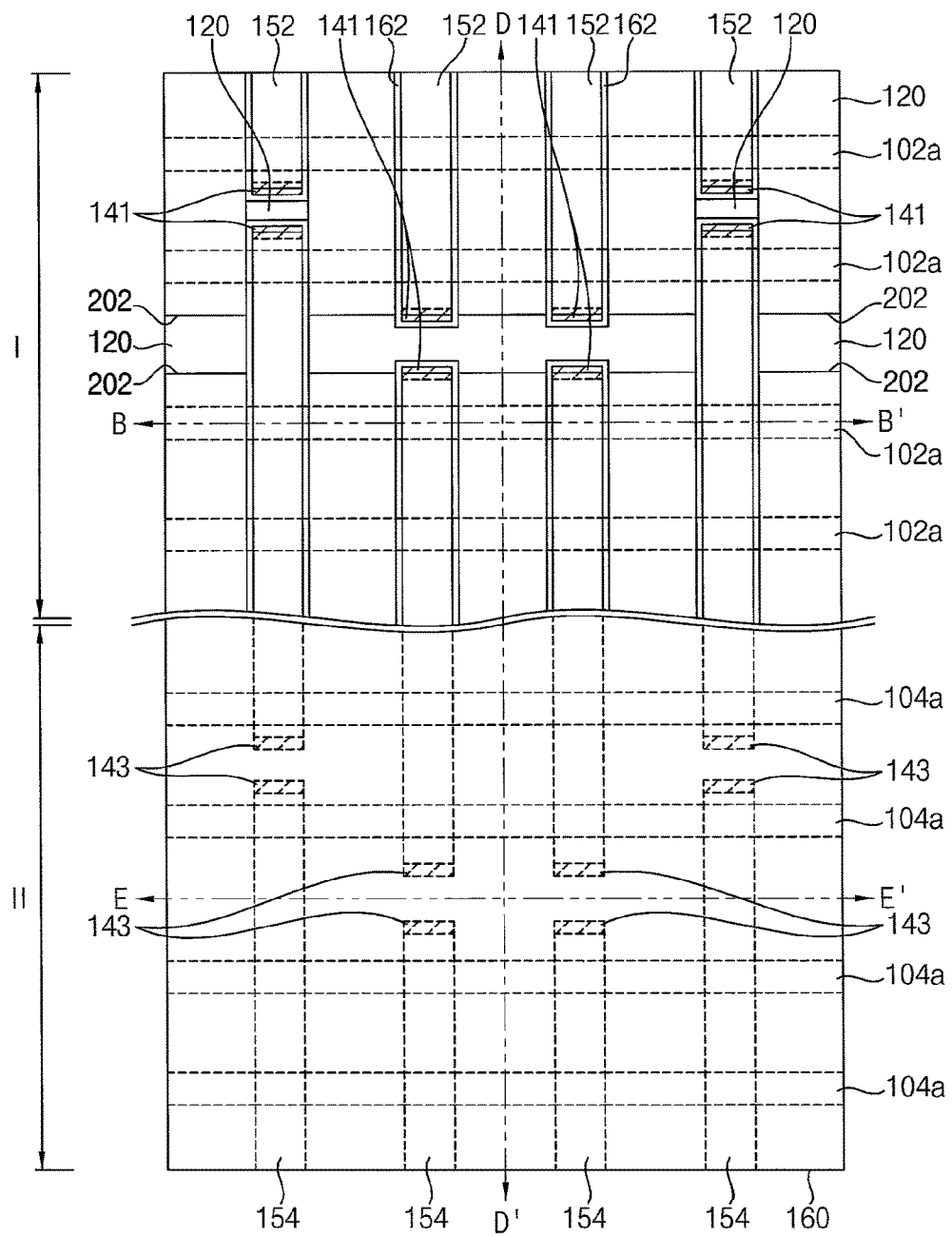
Figure 36:
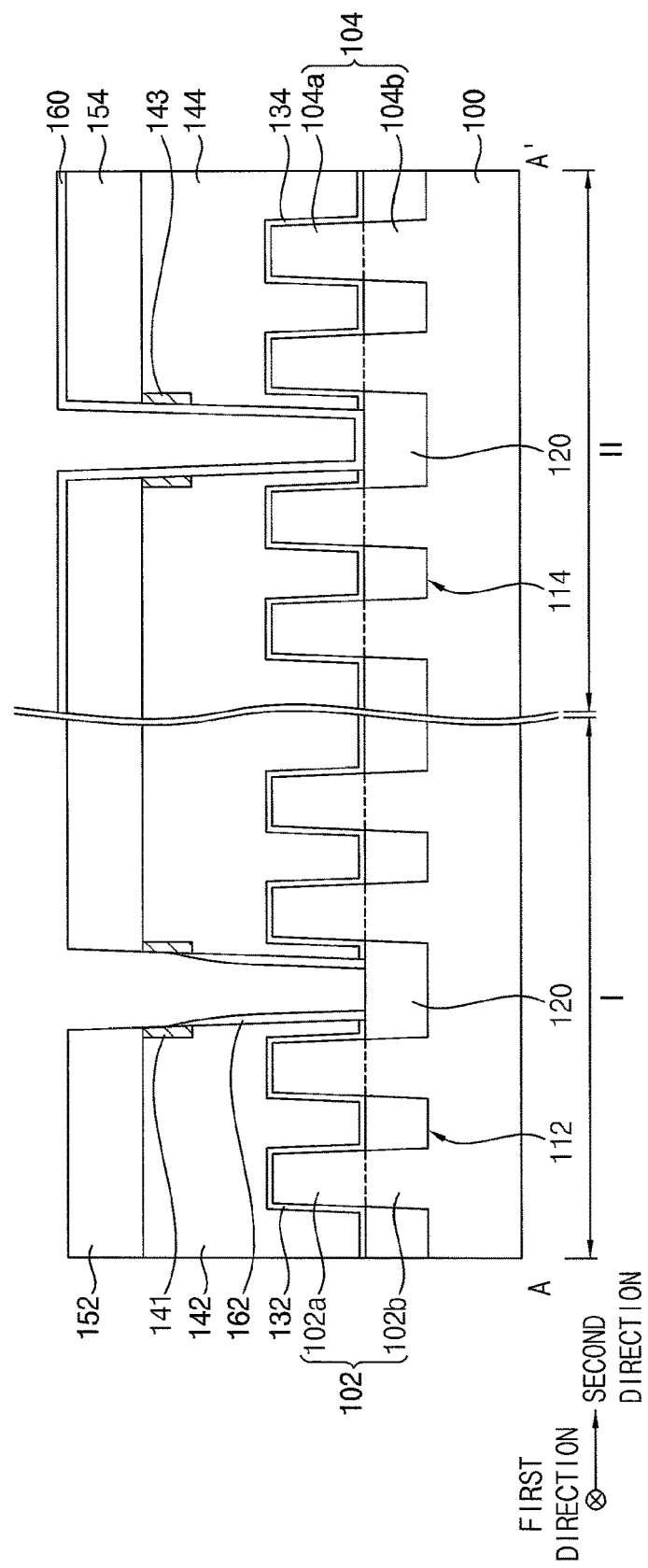
Figure 37:
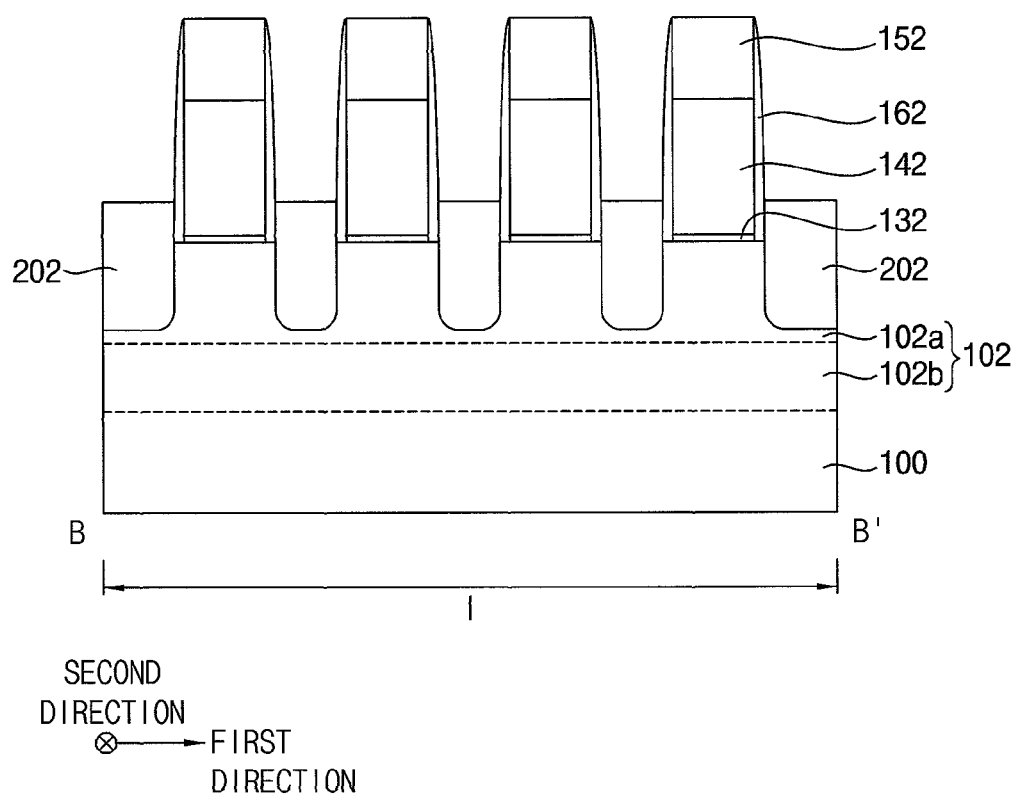
Figure 38:
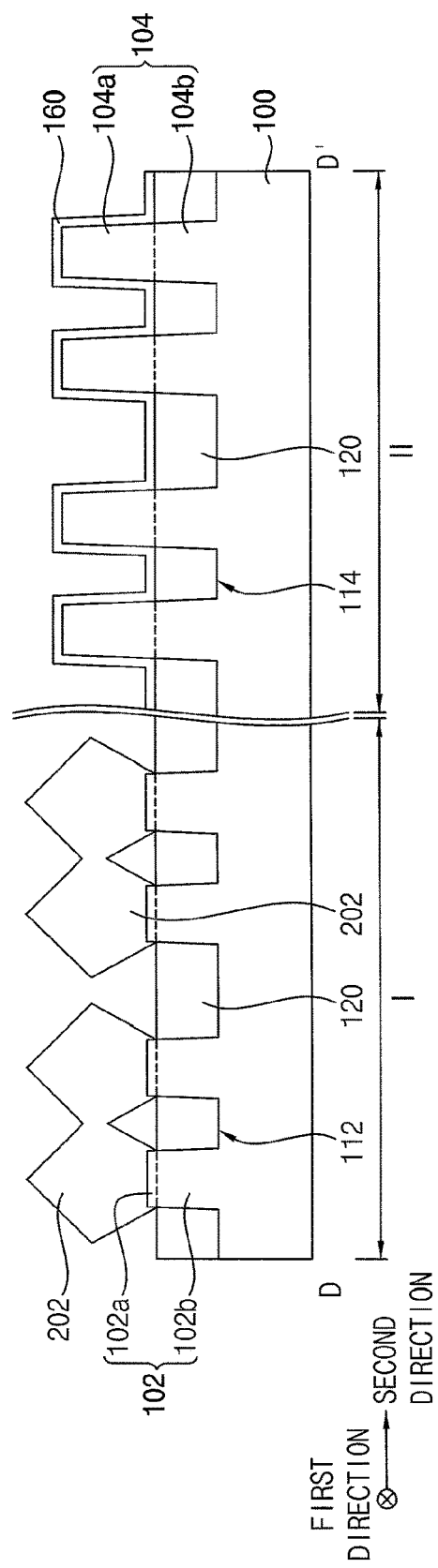
Figure 39:
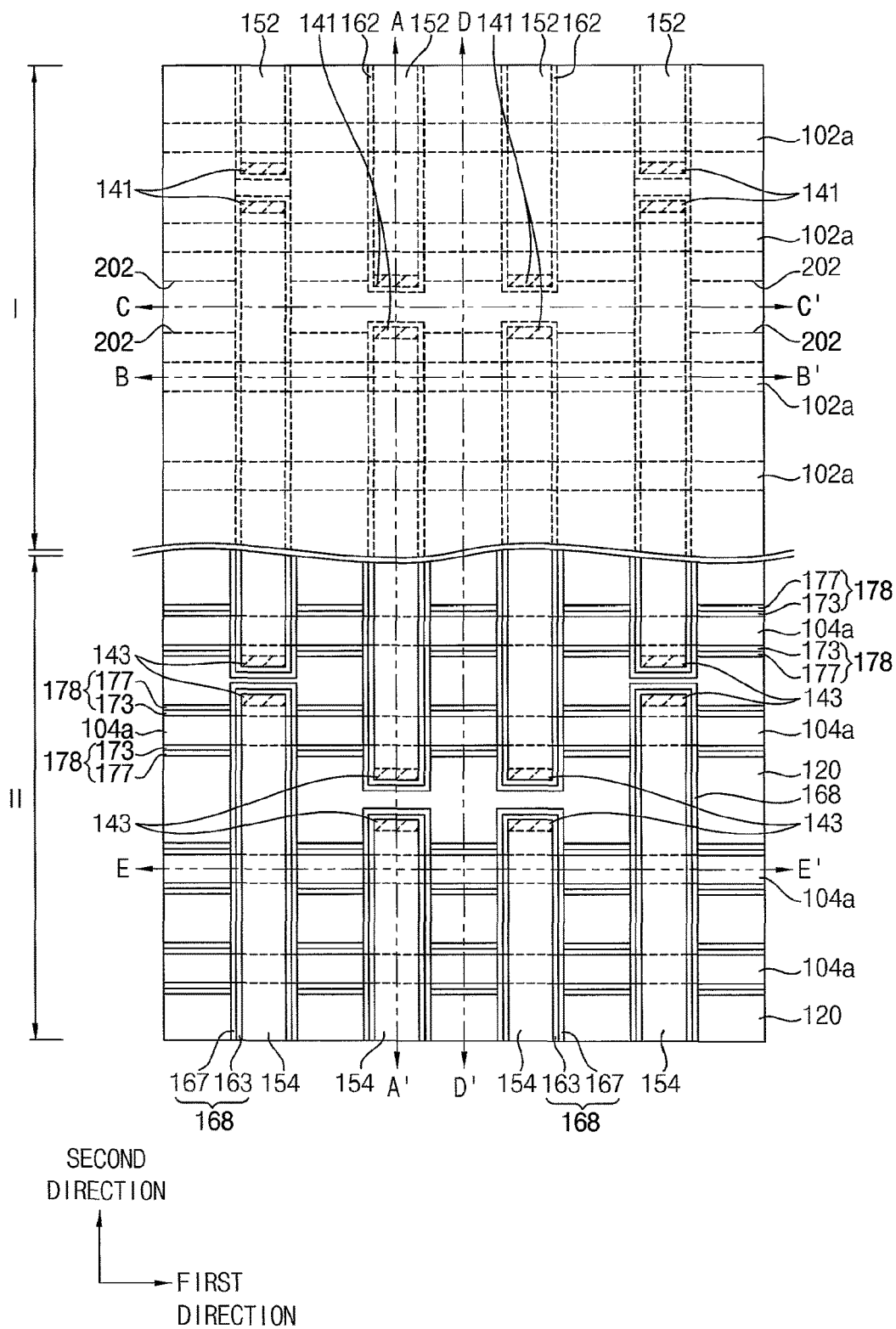
Figure 40:
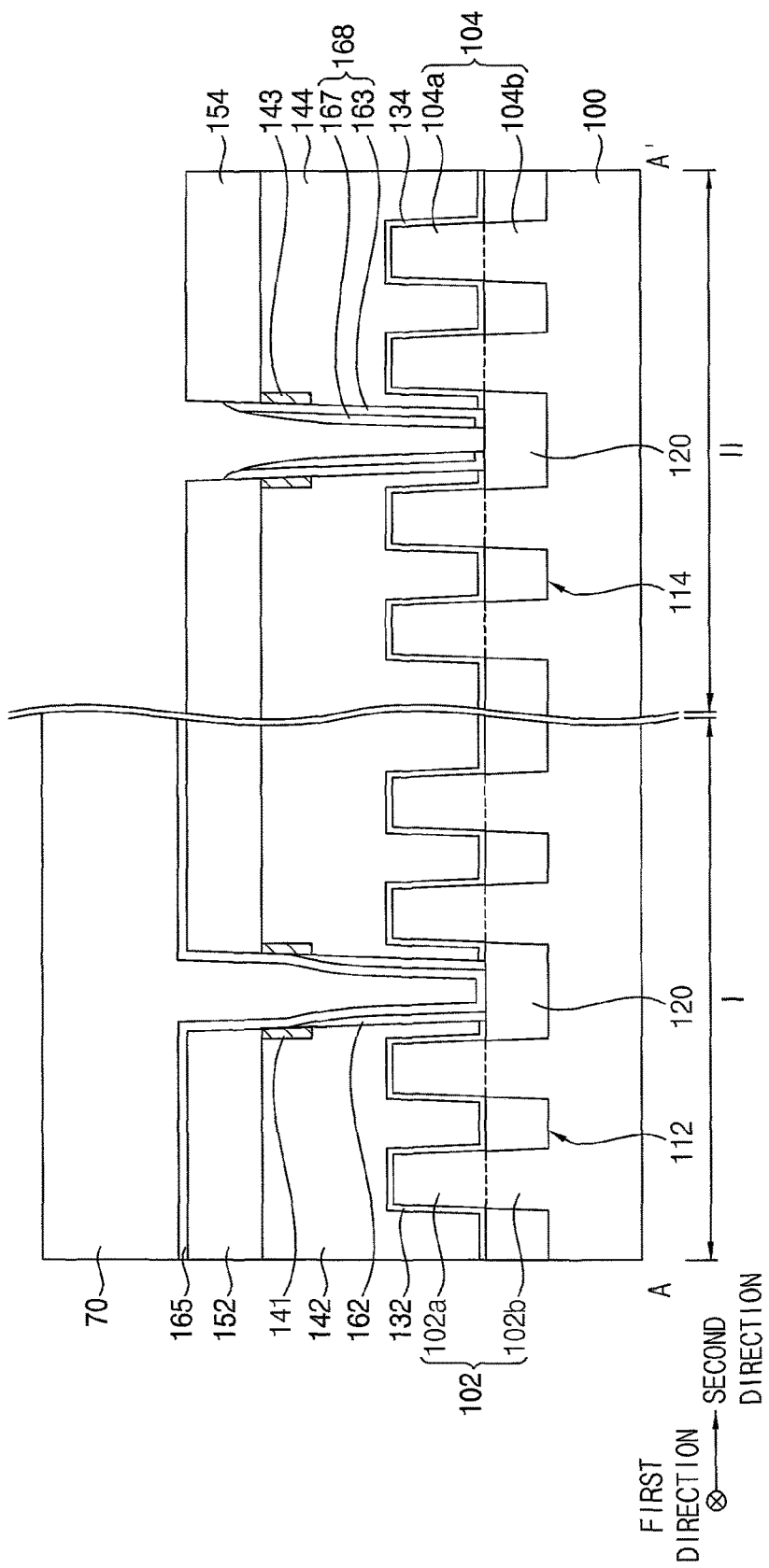
Figure 41:
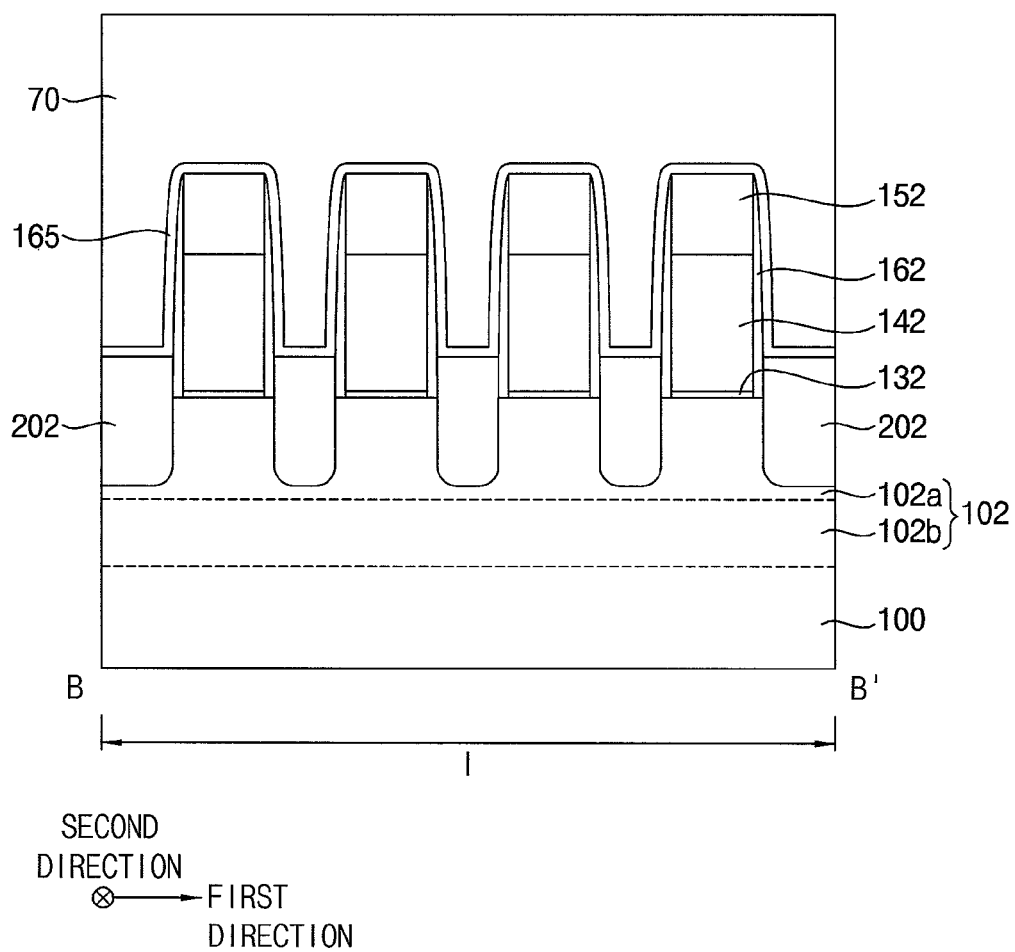
Figure 42:
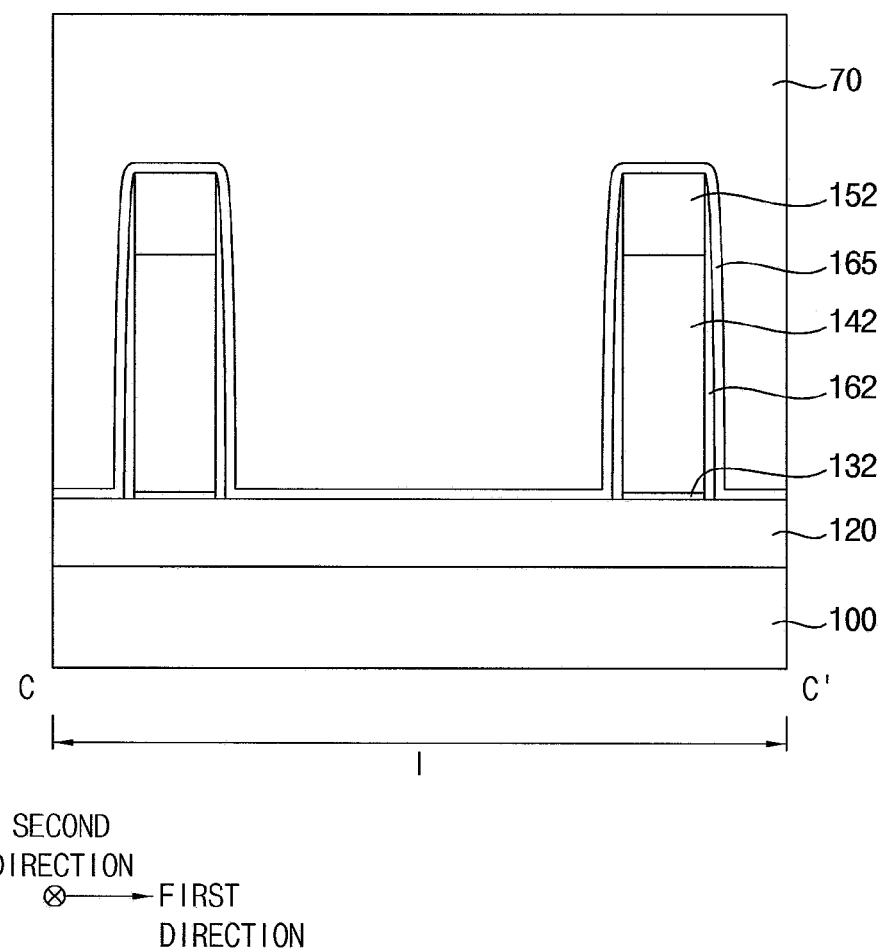
Figure 43:
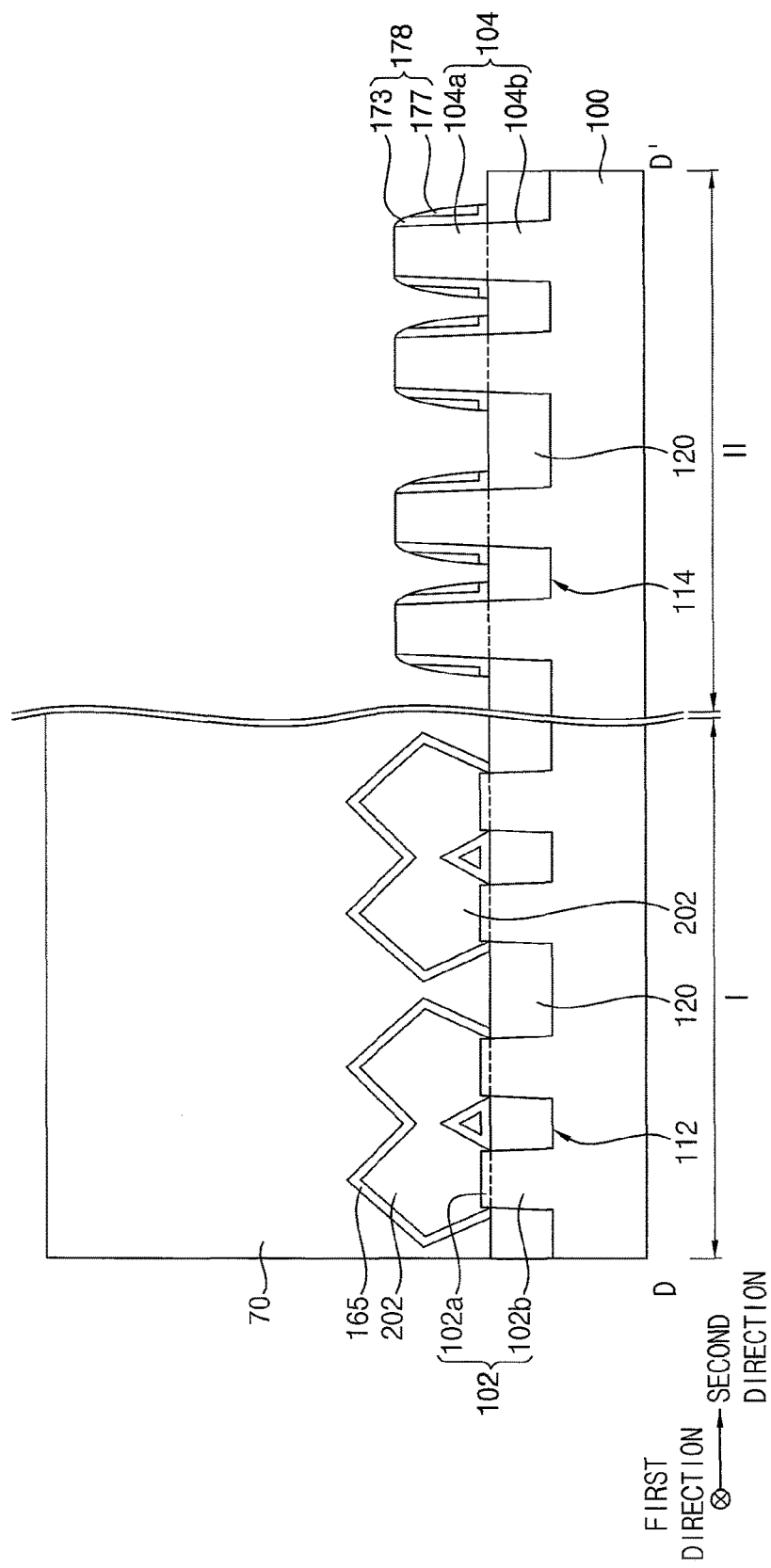
Figure 44:
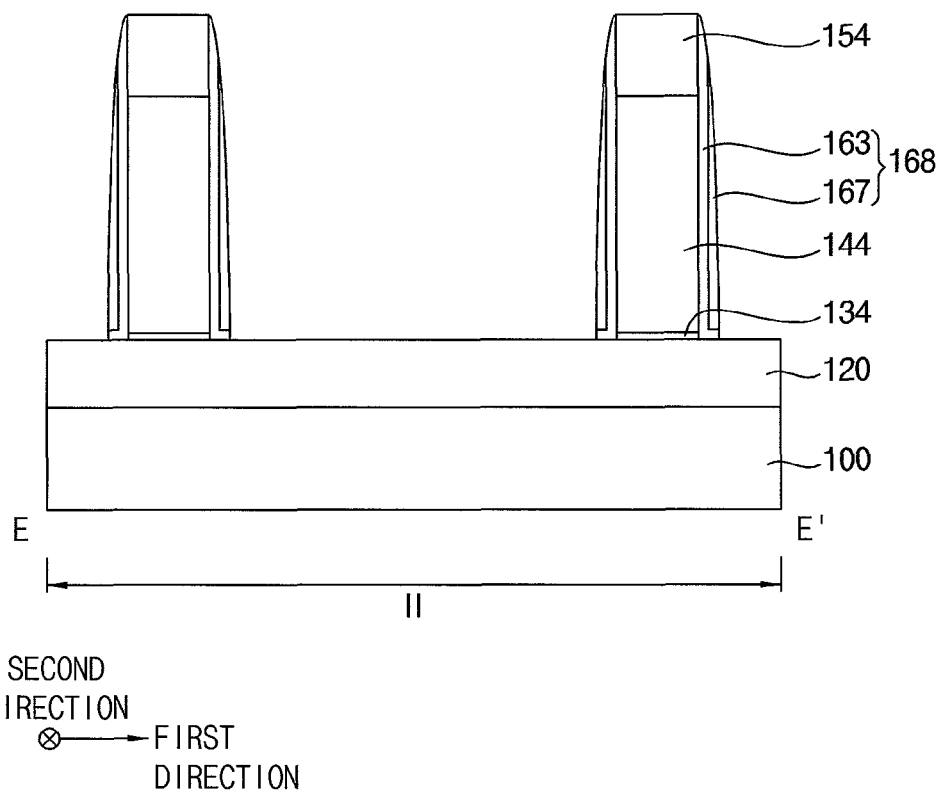

Referring to FIGS. 32 to 34, after removing the third photoresist pattern 60, an upper portion of the first active fin 102 adjacent the first dummy gate structure may be etched to form a fifth recess 182.

In particular, the upper portion of the first active fin 102 may be removed using the first dummy gate structure and the first gate spacer 162 on the first region I of the substrate 100 as an etching mask to form the fifth recess 182. The first fin spacer 172 may be also removed, and because the first spacer layer 160 remains on the second region II of the substrate 100, the second active fin 104 may not be etched.

FIGS. 32 to 34 show that the first upper active pattern 102a of the first active fin 102 may be partially removed to form the fifth recess 182; however, the inventive concept is not limited thereto. In examples, not only the first upper active pattern 102a but also the first lower active pattern 102b may be partially removed to form the fifth recess 182.

In examples, the etching process for forming the first gate spacer 162 and the etching process for forming the fifth recess 182 may be performed in-situ.

Referring to FIGS. 35 to 38, a first source/drain layer 202 may be formed on the first active fin 102 to fill the fifth recess 182.

In examples, the first source/drain layer 202 may be formed by an SEG process using an upper surface of the first active fin 102 exposed by the fifth recess 182 as a seed.

In examples, the first source/drain layer 202 may be formed by performing an SEG process using a silicon source gas, e.g., dichlorosilane ($SiH_2Cl_2$), a germanium source gas, e.g., germane ($GeH_4$), to form a single crystalline silicon-germanium layer. In examples, a p-type impurity source gas, e.g., diborane ($B_2H_6$), may be also used to form a single crystalline silicon-germanium layer doped with p-type impurities. Thus, the first source/drain layer 202 may serve as a source/drain region of a positive-channel metal oxide semiconductor (PMOS) transistor.

The first source/drain layer 202 may fill the fifth recess 182, and may be further grown to contact a portion of the first gate spacer 182. The first source/drain layer 202 may grow not only in the vertical direction but also in the horizontal direction, and thus may have a cross section, along the second direction, in the shape of a pentagon or hexagon. In examples, respective ones of the first source/drain layers 202 on the first active fins 102 spaced apart from each other in the second direction by a short distance may grow to be merged with each other. FIGS. 35 to 38 show one merged first source/drain layer 202 on the first active fins 102.

In the SEG process, the upper portion of the second side surfaces of the first dummy gate electrode 142 including polysilicon may not be covered by the first gate spacer 162 but exposed. However, the first growth blocking pattern 141 doped with ions may be formed on the upper portion of the second side surfaces of the first dummy gate electrode 142 so as not to serve as a seed. Accordingly, no epitaxial layer may be grown from the first dummy gate electrode 142, i.e., the first growth blocking pattern 141.

Referring to FIGS. 39 to 44, a second spacer layer 165 may be formed on the first and second regions I and II of the substrate 100 on which the first and second dummy gate structures, the first gate spacer 162, the first source/drain layer 202 and the first spacer 160 are formed, a fourth photoresist pattern 70 may be formed on the first dummy gate structure, the first gate spacer 162 and the first and second source/drain layer 202 to cover the first region I of the substrate 100, and an anisotropic etching process may be performed using the fourth photoresist pattern 70 as an etching mask.

Thus, a second gate spacer structure 168 may be formed on side surfaces of the second dummy gate structure on the second region II of the substrate 100, and a second fin spacer structure 178 may be formed on side surfaces of the second active fin 104. The second gate spacer structure 168 may include third and fourth gate spacers 163 and 167 sequentially stacked on the second dummy gate structure, and the second fin spacer structure 178 may include third and fourth fin spacers 173 and 177 sequentially stacked on the second active fin 104.

The second spacer layer 165 may be formed of a nitride, e.g., silicon nitride, silicon oxycarbonitride, etc. In examples, the second spacer layer 165 may be formed of a material substantially the same as that of the first spacer layer 160, and thus the second spacer layer 165 may be merged with the first gate spacer 162 in the first region I of the substrate 100, and may be merged with the first spacer layer 160 in the second region II of the substrate 100.

The second gate spacer structure 168 may include a first portion on opposite first side surfaces of the second dummy gate structure in the first direction, and a second portion on opposite second side surfaces of the second dummy gate structure in the second direction.

In examples, the first portion of the second gate spacer structure 168 may cover the entire first side surfaces of the second dummy gate structure. However, the second portion of the second gate spacer structure 168 may not cover the entire second side surfaces of the second dummy gate structure but expose upper portions of the second side surfaces thereof.

Because upper portions of the second side surfaces of the second dummy gate structure may be slanted with respect to the top surface of the substrate 100, portions of the first and second spacer layers 160 and 165 on the upper portion of the second side surface of the second dummy gate structure may be removed in the anisotropic etching process, and only lower portions of the first and second spacer layers 160 and 165 on a lower portion of the second side surfaces of the second dummy gate structure may remain. However, unlike the first gate spacer 162 on the side surfaces of the first dummy gate structure, the second gate spacer structure 168 may include the third and fourth gate spacers 163 and 167 sequentially stacked, and thus may have a thickness greater than that of the first gate spacer 162, and may have a top surface higher than that of the first gate spacer 162.

That is, the second gate spacer structure 168 may cover most of the second side surfaces of the second dummy gate structure, and opposite second side surfaces of an upper portion of the first dummy gate mask 152 in the second direction may not be covered but exposed by the second portion of the second gate spacer structure 168.

When an upper portion of the second dummy gate electrode 144 in the second dummy gate structure is not covered by the second gate spacer structure 168, the second growth blocking pattern 143 may be formed on the exposed upper portion of the second side surfaces of the second dummy gate electrode 144.

Figure 45:
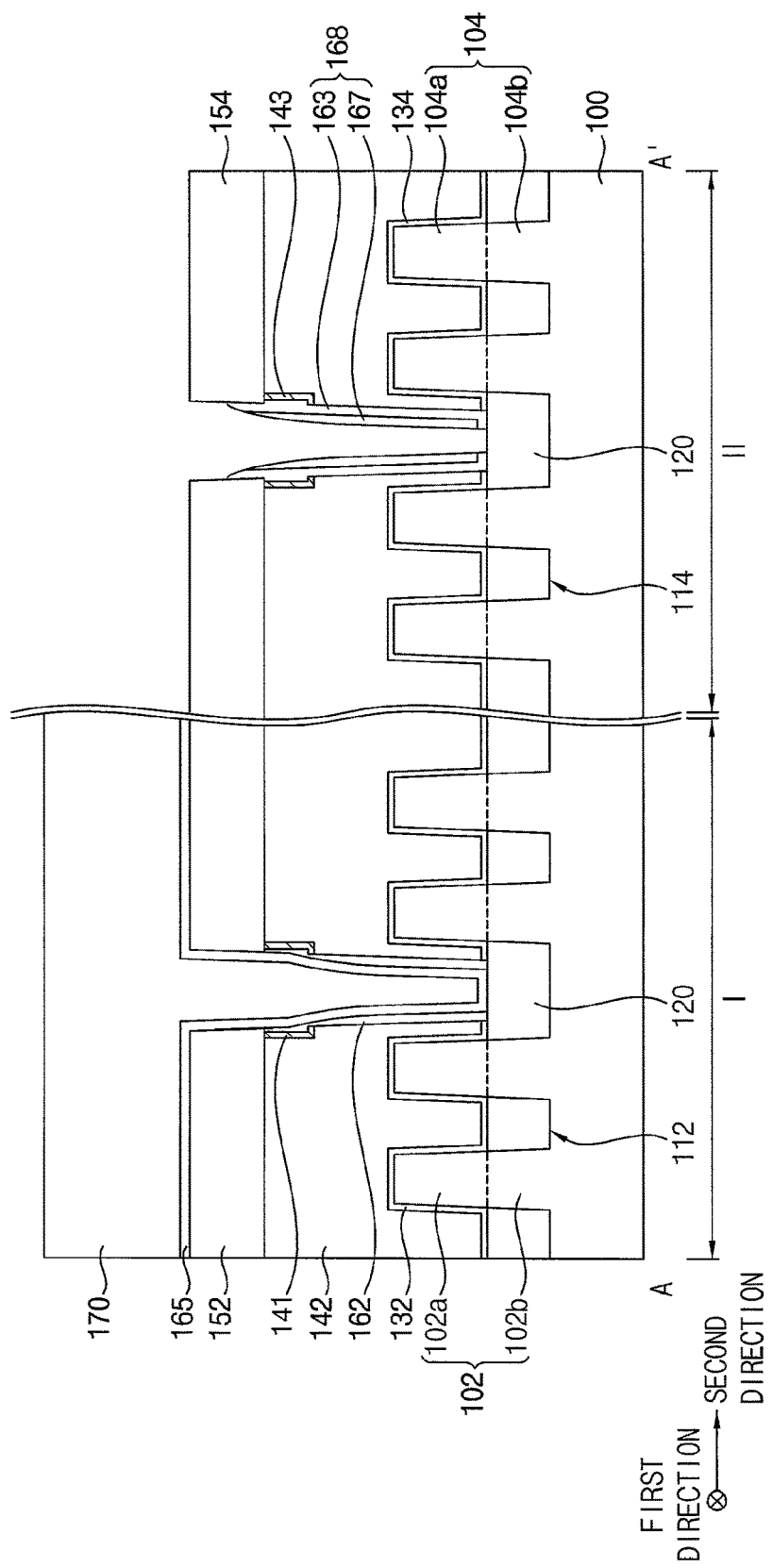

As illustrated with reference to FIG. 25, FIG. 45 shows the second spacer layer 165 and the second gate spacer structure 168 when the first and second indentations 147 and 149 are formed in the sides of the first and second growth blocking patterns 141 and 143, respectively. Because the first and second growth blocking patterns 141 and 143 are disposed in the ends of the dummy gate electrodes, the first and second indentations 147 and 149 extend in the ends of the respective dummy gate electrodes, as well.

Figure 46:
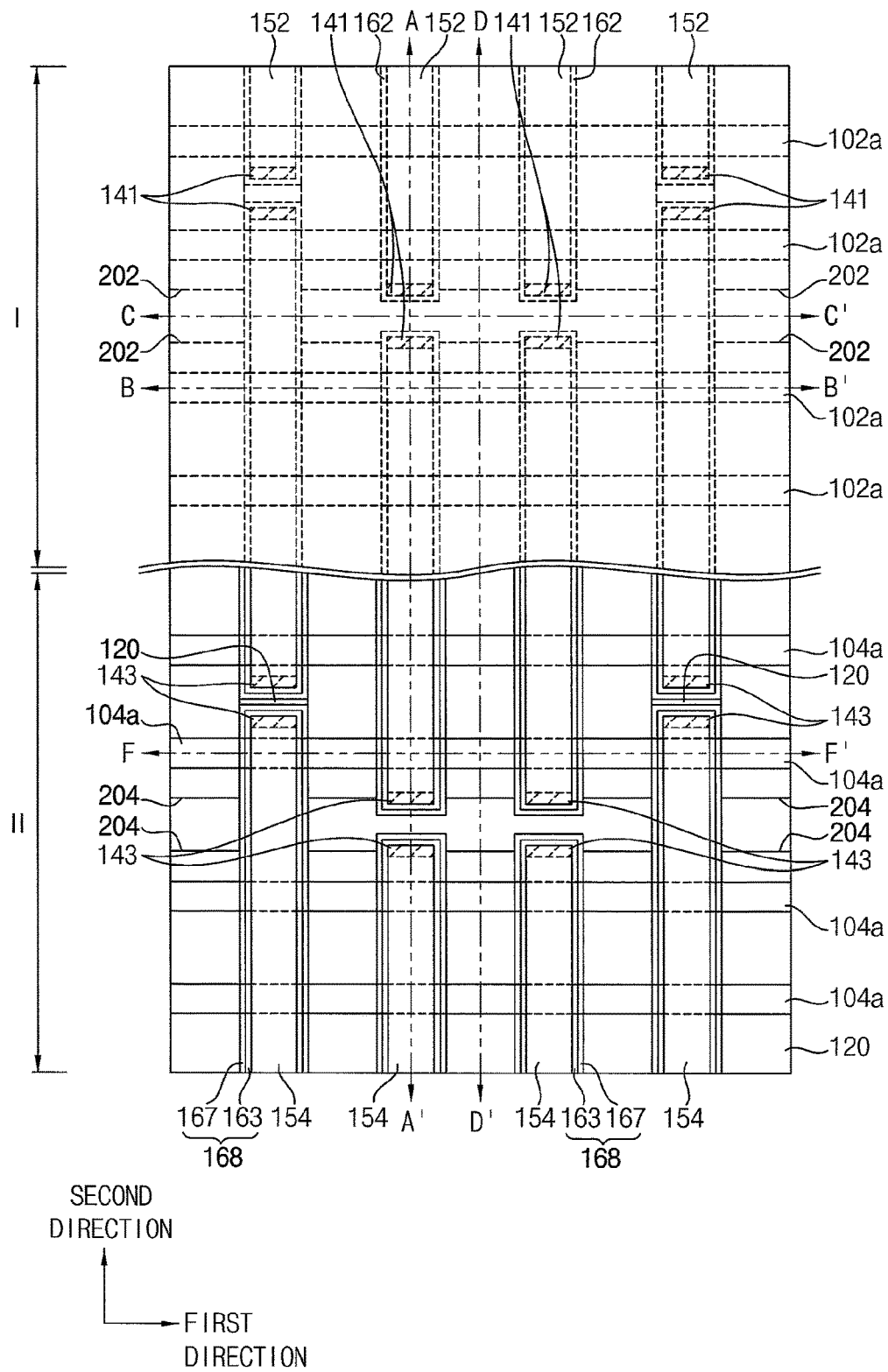
Figure 47:
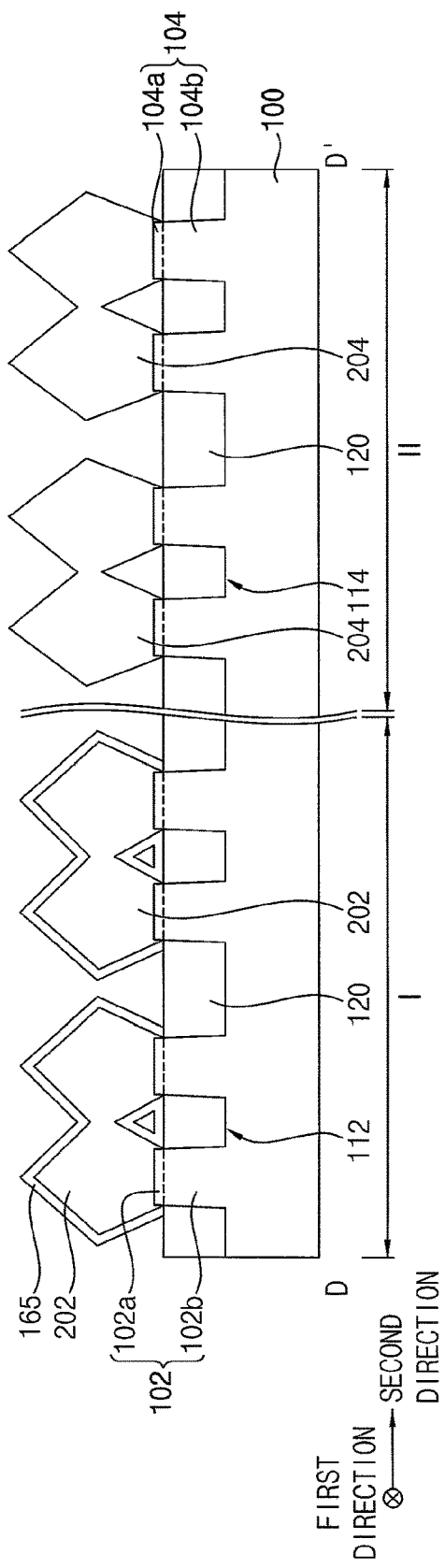
Figure 48:
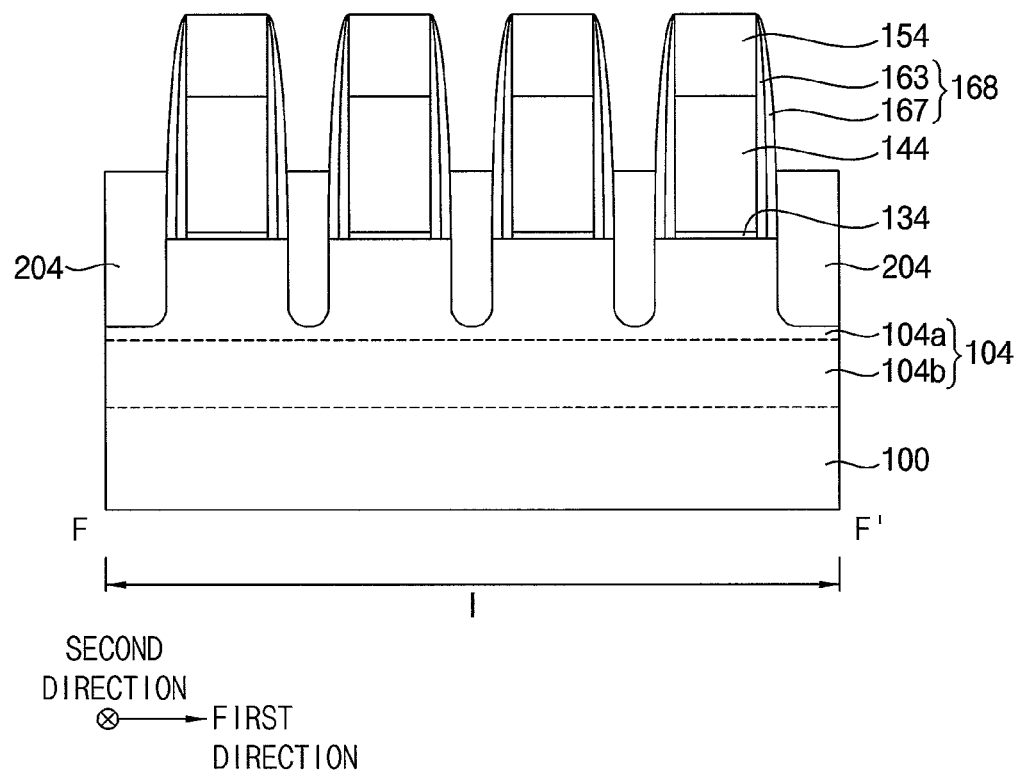
Figure 49:
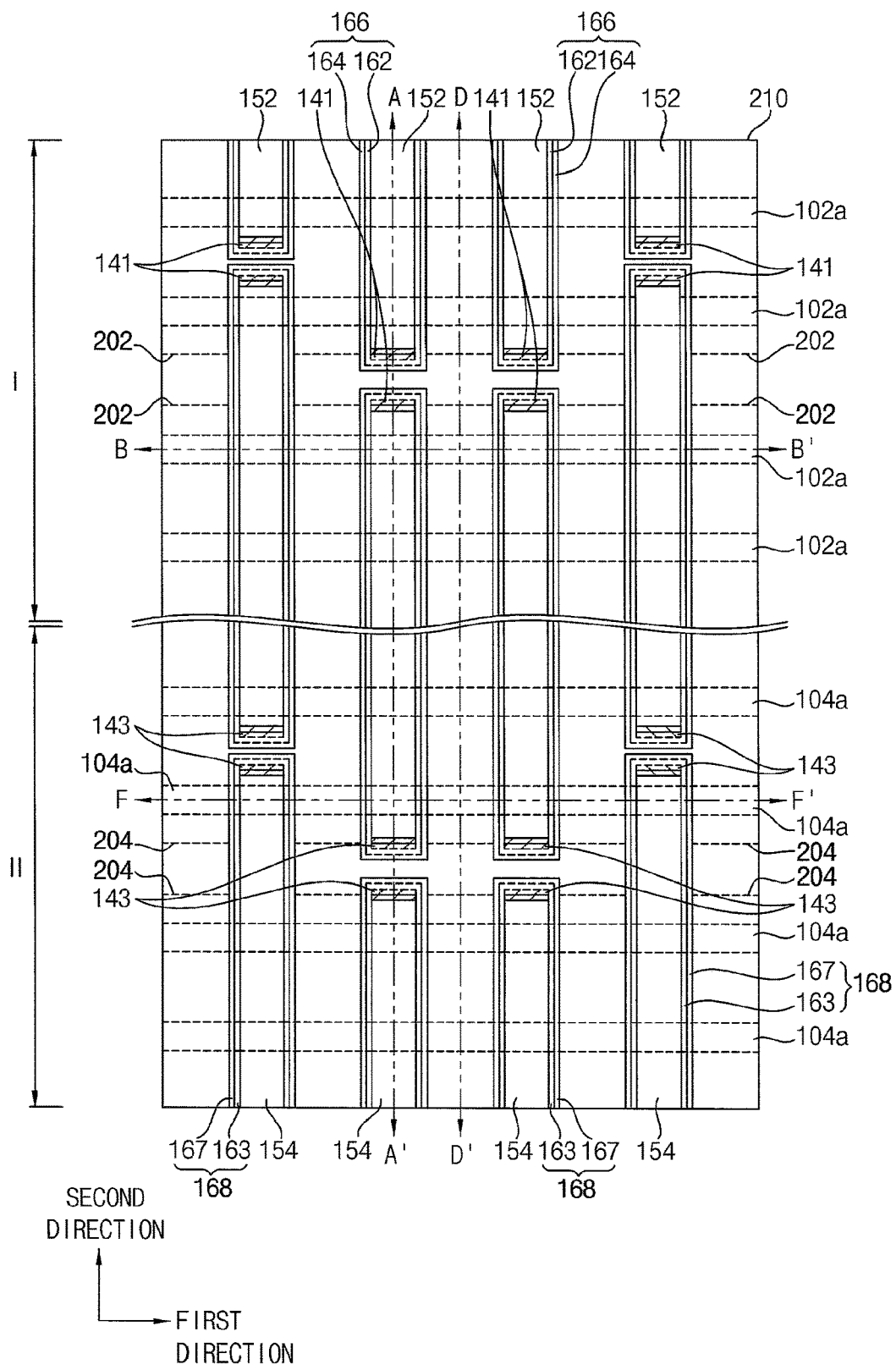
Figure 50:
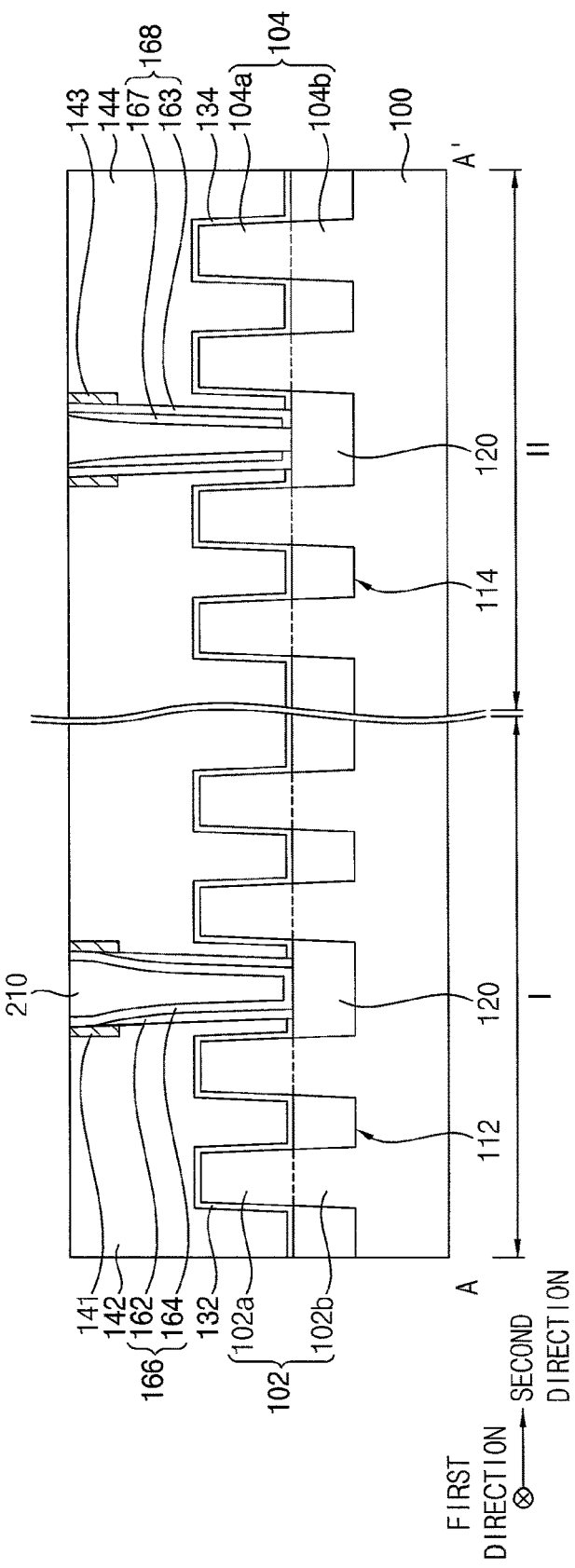
Figure 51:
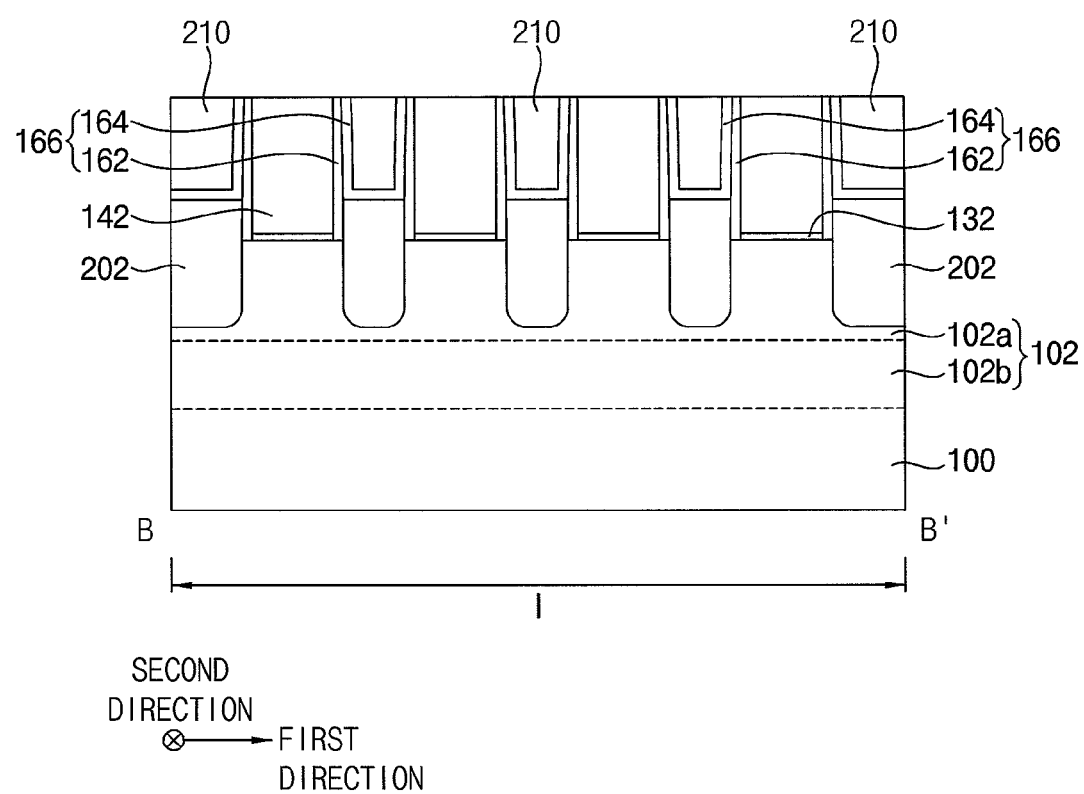
Figure 52:
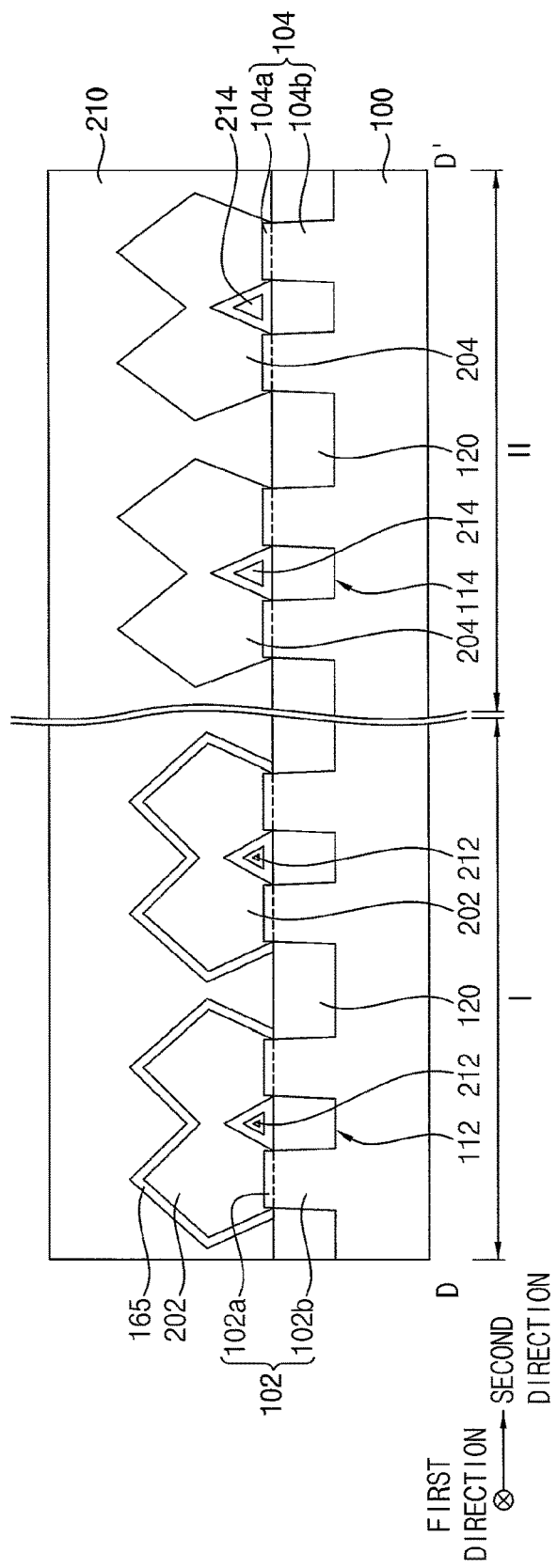
Figure 53:
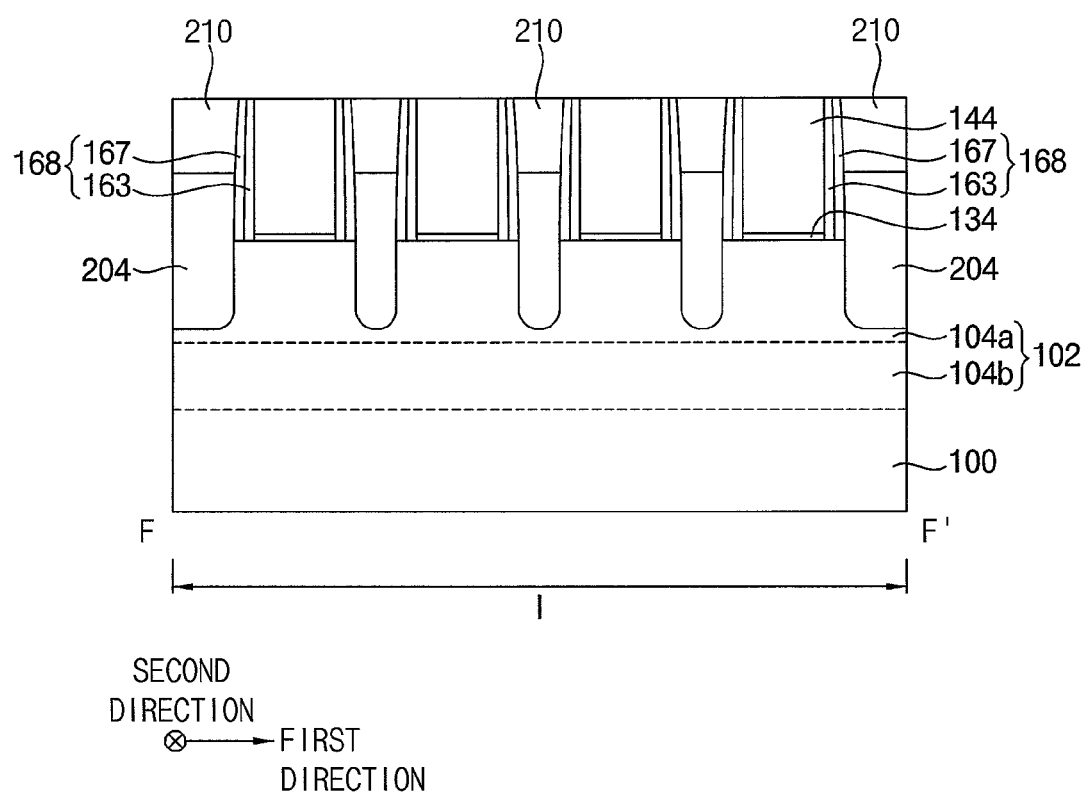

Referring to FIGS. 46 to 48, after removing the fourth photoresist pattern 70, an upper portion of the second active fin 104 adjacent the second dummy gate structure may be etched to form a sixth recess (not shown).

In particular, the upper portion of the second active fin 104 may be removed using the second dummy gate structure and the second gate spacer structure 168 on the second region II of the substrate 100 as an etching mask to form the sixth recess. The second fin spacer structure 178 may be also removed, and because the second spacer layer 165 remains on the first region I of the substrate 100, the first source/drain layer 202 may not be etched.

FIGS. 46 to 48 show that the second upper active pattern 104a of the second active fin 104 may be partially removed to form the sixth recess; however, the inventive concept is not limited thereto. In examples, not only the second upper active pattern 104a but also the second lower active pattern 104b may be partially removed to form the sixth recess.

In examples, the etching process for forming the second gate spacer structure 168 and the etching process for forming the sixth recess may be performed in-situ.

A second source/drain layer 204 may be formed on the second active fin 104 to fill the sixth recess.

In examples, the second source/drain layer 204 may be formed by an SEG process using an upper surface of the second active fin 104 exposed by the sixth recess as a seed. Because the second spacer layer 165 is formed on the first source/drain layer 202, no epitaxial layer may be grown from the source/drain layer 202.

In examples, the second source/drain layer 204 may be formed by an SEG process using a silicon source gas, e.g., disilane ($Si_2H_6$), and a carbon source gas, e.g., monomethylsilane ($SiH_3CH_3$), to form a single crystalline silicon carbide layer. Alternatively, the SEG process may be performed using only the silicon source gas, e.g., disilane ($Si_2H_6$), to form a single crystalline silicon layer. In examples, an n-type impurity source gas, e.g., phosphine ($PH_3$), may be also used to form a single crystalline silicon carbide layer doped with n-type impurities or a single crystalline silicon layer doped with n-type impurities. Thus, the second source/drain layer 204 may serve as a source/drain region of a negative-channel metal oxide semiconductor (NMOS) transistor.

The second source/drain layer 204 may fill the sixth recess, and may be further grown to contact a portion of the second gate spacer structure 168. The second source/drain layer 204 may grow not only in the vertical direction but also in the horizontal direction, and thus may have a cross section, in the second direction, in the shape of a pentagon or hexagon. In examples, respective ones of the second source/drain layers 204 on the second active fins 104 spaced apart from each other in the second direction by a short distance may grow to be merged with each other.

As described above, in the SEG process, the upper portions of the second side surfaces of the second dummy gate electrode 144 including polysilicon may be covered by the second gate spacer structure 168. Alternatively, even if the upper portions of the second side surfaces of the second dummy gate electrode 144 including polysilicon are not covered by the second gate spacer structure 168, the second growth blocking pattern 143 doped with ions may be formed on the upper portions of the second side surfaces of the second dummy gate electrode 144 so as not to serve as a seed. Accordingly, no epitaxial layer may be grown from the second dummy gate electrode 144.

In examples, the second source/drain layer 204 may be formed to have a top surface higher than that of the first source/drain layer 202. However, the inventive concept is not be limited thereto, and the top surface of the second source/drain layer 204 may be substantially coplanar with or lower than that of the first source/drain layer 202.

Referring to FIGS. 49 to 53, an insulation layer 210 may be formed on the first and second active fins 102 and 104 and the isolation pattern 120 to a sufficient thickness as to cover the first and second dummy gate structures, the first gate spacer 162, the second spacer layer 165, the second gate spacer structure 168, and the first and second source/drain layers 202 and 204, and may be planarized until a top surface of the first and second dummy gate electrodes 142 and 144 of the first and second dummy gate structures may be exposed.

In the planarization process, the first and second dummy gate masks 152 and 154 may be also removed, and upper portions of the second spacer layer 165 and the second gate spacer structure 168 may be partially removed. Hereinafter, a remaining portion of the second spacer layer 165 may be referred to as a second gate spacer 164, and the first and second gate spacers 162 and 164 may form a first gate spacer structure 166. In examples, the second portion of the first gate spacer 162 may not cover the upper portions of the second side surfaces of the first dummy gate electrode 142. However, the second gate spacer 164 may cover the upper portions of the second side surfaces of the first dummy gate electrode 142. The first growth blocking pattern 141 may be formed on the upper portions of the second side surfaces of the first dummy gate electrode 142 not covered by the first gate spacer 162, and side surfaces of the first growth blocking pattern 141 may be covered by the second gate spacer 164.

A space between the merged first source/drain layer 202 and the isolation pattern 120 or a space between the merged second source/drain layer 204 and the isolation pattern 120 may not be filled with the insulation layer 210, and thus first and second air gaps 212 and 214 may be formed, respectively.

The insulation layer 210 may be formed of silicon oxide, e.g., tonen silazene (TOSZ). The planarization process may be performed by a CMP process and/or an etch back process.

Figure 54:
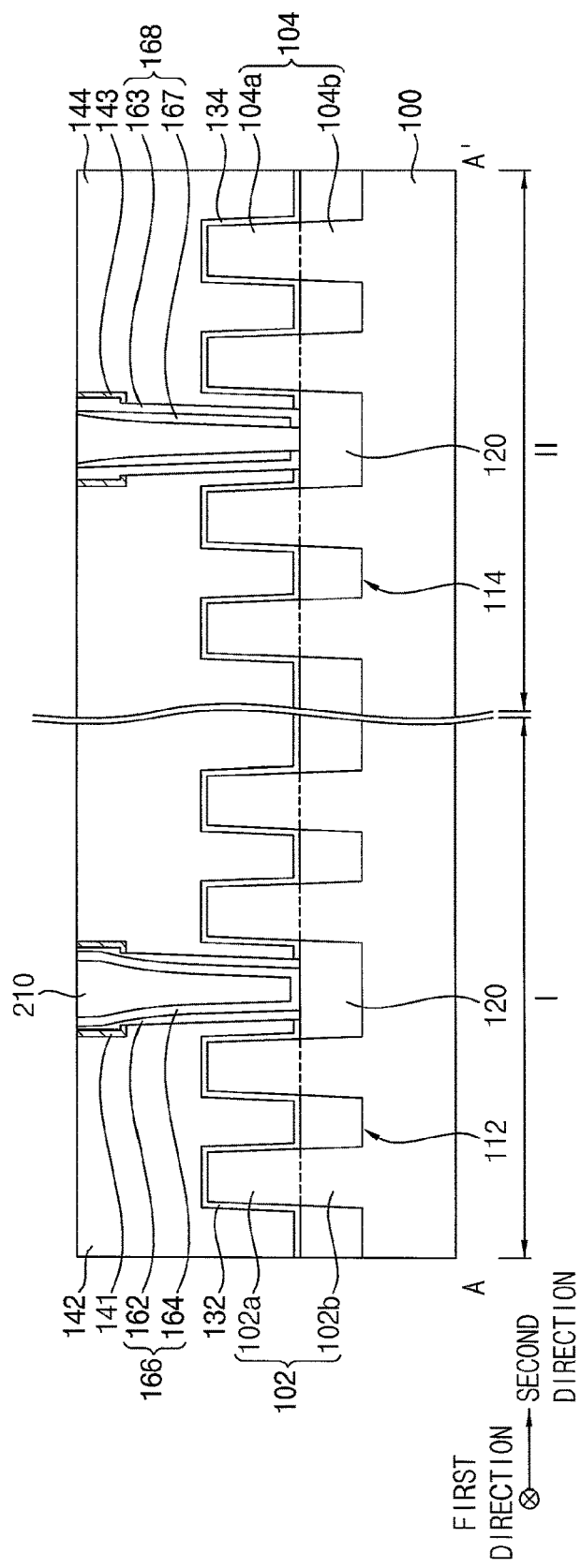

As illustrated with reference to FIG. 25, FIG. 54 shows the first and second gate spacer structures 166 and 168 when the first and second indentations 147 and 149 are formed in side surfaces of the first and second growth blocking patterns 141 and 143, respectively. The third gate spacer 163 of the second gate spacer structure 168 may include an upper portion having a width in the second direction greater than that of a lower portion thereof.

Figure 55:
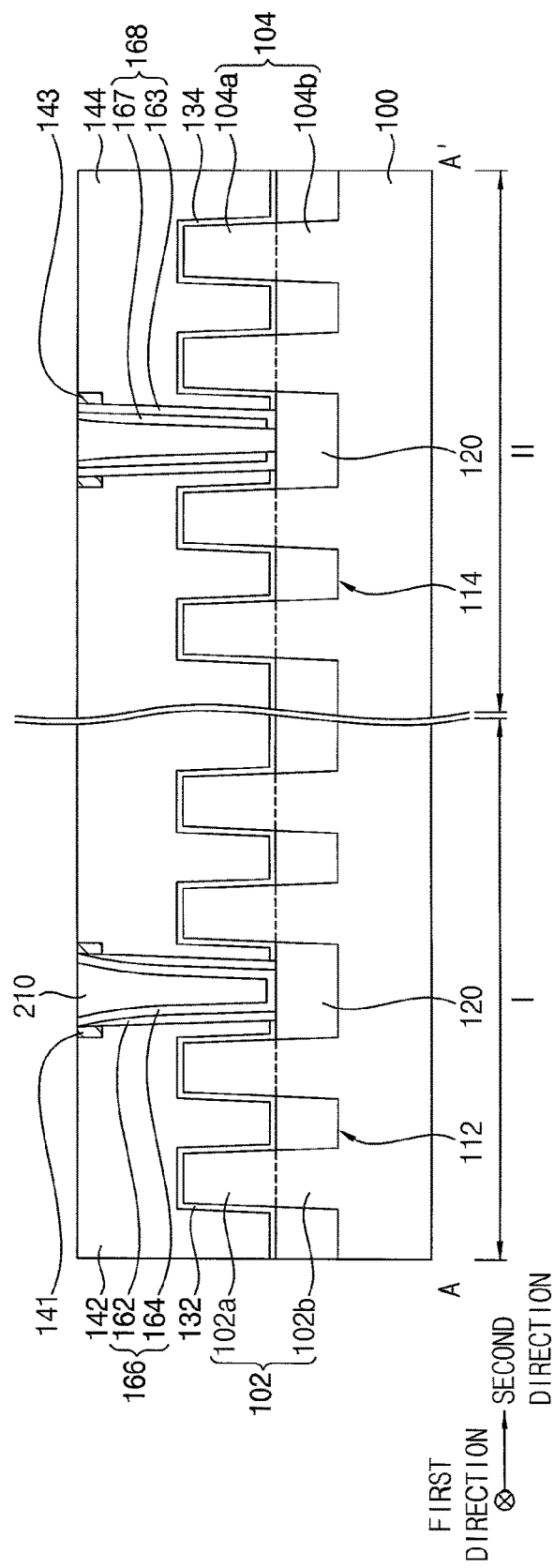
Figure 56:
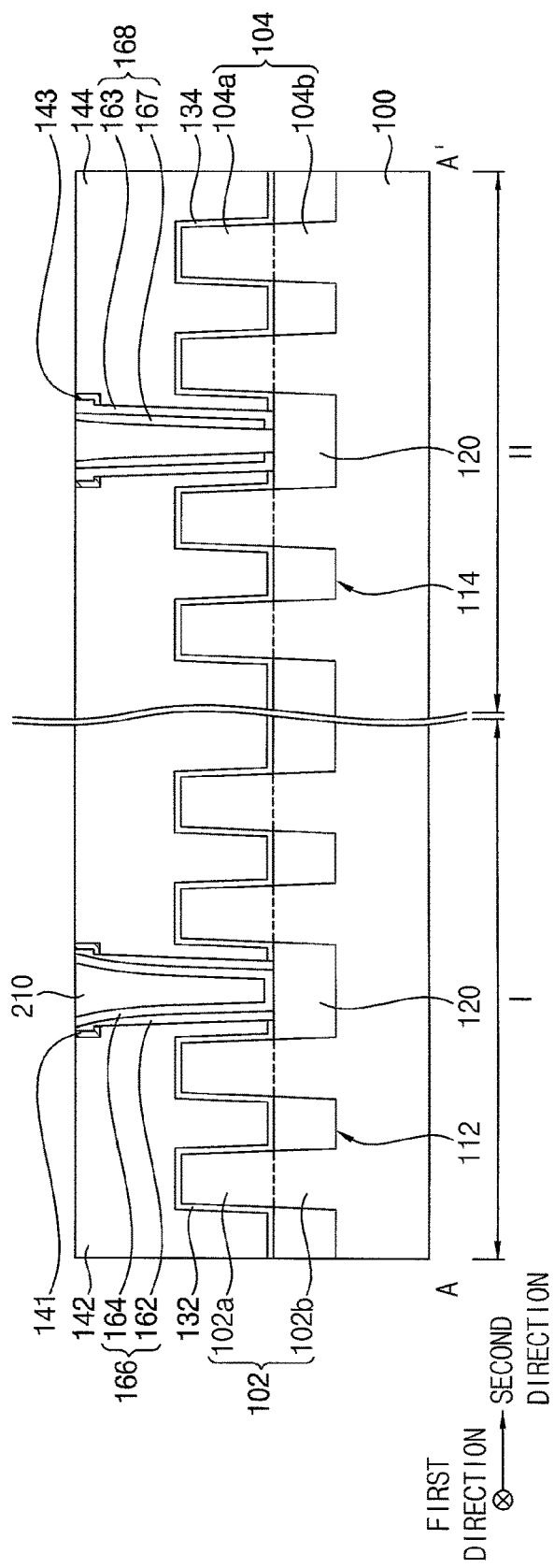

FIG. 55 shows the first and second gate spacer structures 166 and 168 when the upper portions of the first and second dummy gate structures 142 and 144 are also removed in the planarization process, and FIG. 56 shows the first and second gate spacer structures 166 and 168 when the first and second indentations 147 and 149 are formed in the sides of the first and second growth blocking patterns 141 and 143, respectively.

Figure 57:
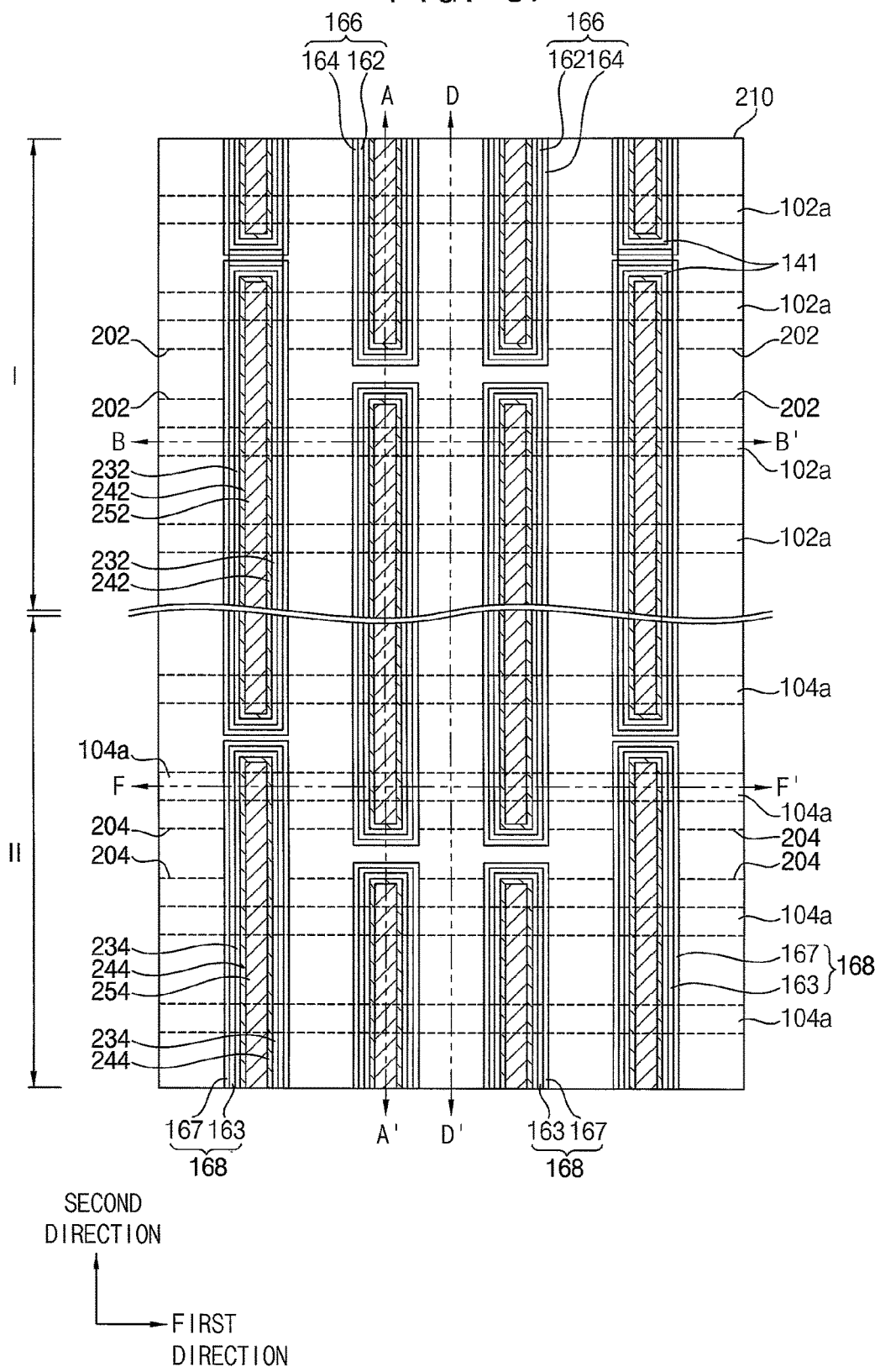
Figure 58:
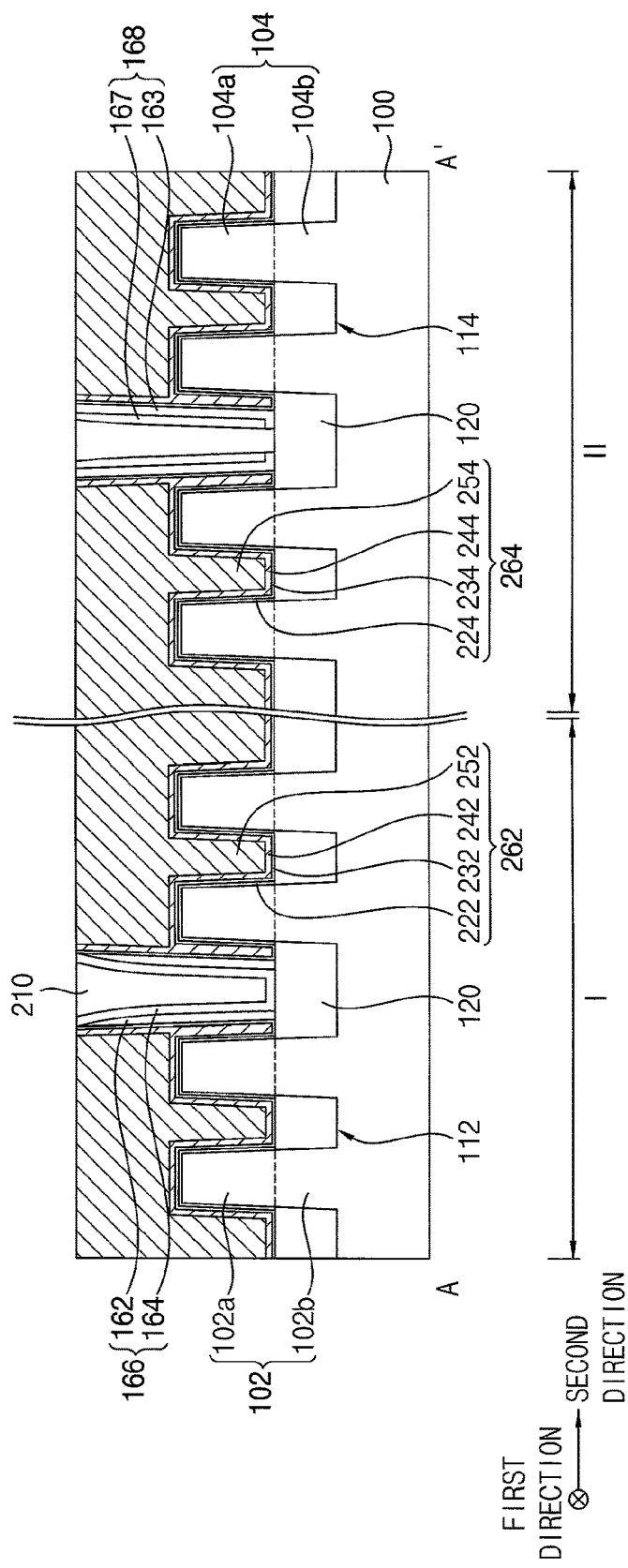
Figure 59:
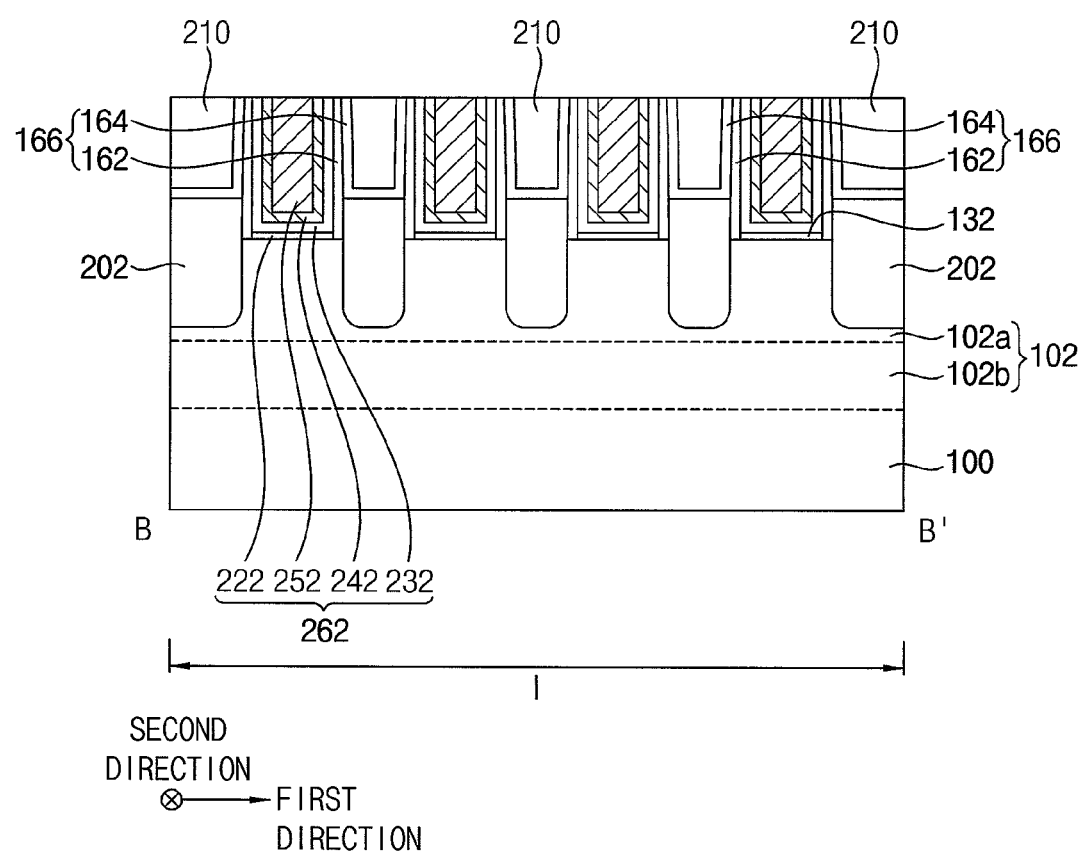

Referring to FIGS. 57 and 59, the exposed first and second dummy gate electrodes 142 and 144 and the first and second dummy gate insulation patterns 132 and 134 thereunder may be removed to form fourth and fifth openings (not shown) exposing inner side surfaces of the first and second gate spacer structures 166 and 168 and upper surfaces of the first and second active fins 102 and 104, respectively, and first and second gate structures 262 and 264 may be formed to fill the fourth and fifth openings, respectively.

In examples, when the first and second dummy gate structures 142 and 144 are removed, the first and second growth blocking patterns 141 and 143 on the upper side surfaces of the first and second dummy gate structures 142 and 144, respectively, may be also removed.

In particular, after performing a thermal oxidation process on the upper surfaces of the first and second active fins 102 and 104 exposed by the fourth and fifth openings to form first and second interface patterns 222 and 224, a gate insulation layer and a work function control layer may be sequentially formed on the first and second interface patterns 222 and 224, the isolation pattern 120, the first and second gate spacer structures 166 and 168, and the insulation layer 210, and a gate electrode layer may be formed on the work function control layer to sufficiently fill remaining portions of the fourth and fifth openings.

The gate insulation layer may be formed of a metal oxide having a high dielectric constant, e.g., hafnium oxide, tantalum oxide, zirconium oxide, or the like, by a CVD process or an ALD process. The work function control layer may be formed of a metal nitride or a metal alloy, e.g., titanium nitride, titanium aluminum, titanium aluminum nitride, tantalum nitride, tantalum aluminum nitride, etc., and the gate electrode layer may be formed of a material having a low resistance, e.g., a metal such as aluminum, copper, tantalum, etc., or a metal nitride thereof. The work function control layer and the gate electrode layer may be formed by an ALD process, a physical vapor deposition (PVD) process, or the like. In examples, a heat treatment process, e.g., a rapid thermal annealing (RTA) process, a spike rapid thermal annealing (spike RTA) process, a flash rapid thermal annealing (flash RTA) process or a laser annealing process may be additionally performed.

The first and second interface patterns 222 and 224 may be formed instead of by the thermal oxidation process, by a CVD process, an ALD process, or the like, similarly to the gate insulation layer or the gate electrode layer. In this case, each of the first and second interface patterns 222 and 224 may be formed not only on the upper surface of each of the first and second active fins 102 and 104 but also on the upper surface of the isolation pattern 120 and the inner side surface of each of the first and second gate spacer structures 166 and 168.

The gate electrode layer, the work function control layer, and the gate insulation layer may be planarized until a top surface of the insulation layer 210 is exposed to form a first gate insulation pattern 232 and a first work function control pattern 242 sequentially stacked on the first interface pattern 222, the isolation pattern 120, and the inner side surfaces of the first gate spacer structure 166, and a first gate electrode 252 filling the remaining portion of the fourth opening on the first work function control pattern 242. A second gate insulation pattern 234 and a second work function control pattern 244 sequentially stacked may be formed on the second interface pattern 224, the isolation pattern 120, and the inner side surfaces of the second gate spacer structure 168, and a first second electrode 254 filling the remaining portion of the fifth opening may be formed on the second work function control pattern 244.

Accordingly, bottom surfaces and side surfaces of the first and second gate electrodes 252 and 254 may be covered by the first and second work function control patterns 242 and 244, respectively. In examples, the planarization process may be performed by a CMP process and/or an etch back process.

The first interface pattern 222, the first gate insulation pattern 232, the first work function control pattern 242 and the first gate electrode 252 sequentially stacked may form the first gate structure 262, and the first gate structure 262 together with the first source/drain layer 202 may form a PMOS transistor. The second interface pattern 224, the second gate insulation pattern 234, the second work function control pattern 244 and the second gate electrode 254 sequentially stacked may form the second gate structure 264, and the second gate structure 264 together with the second source/drain layer 204 may form an NMOS transistor.

Figure 60:
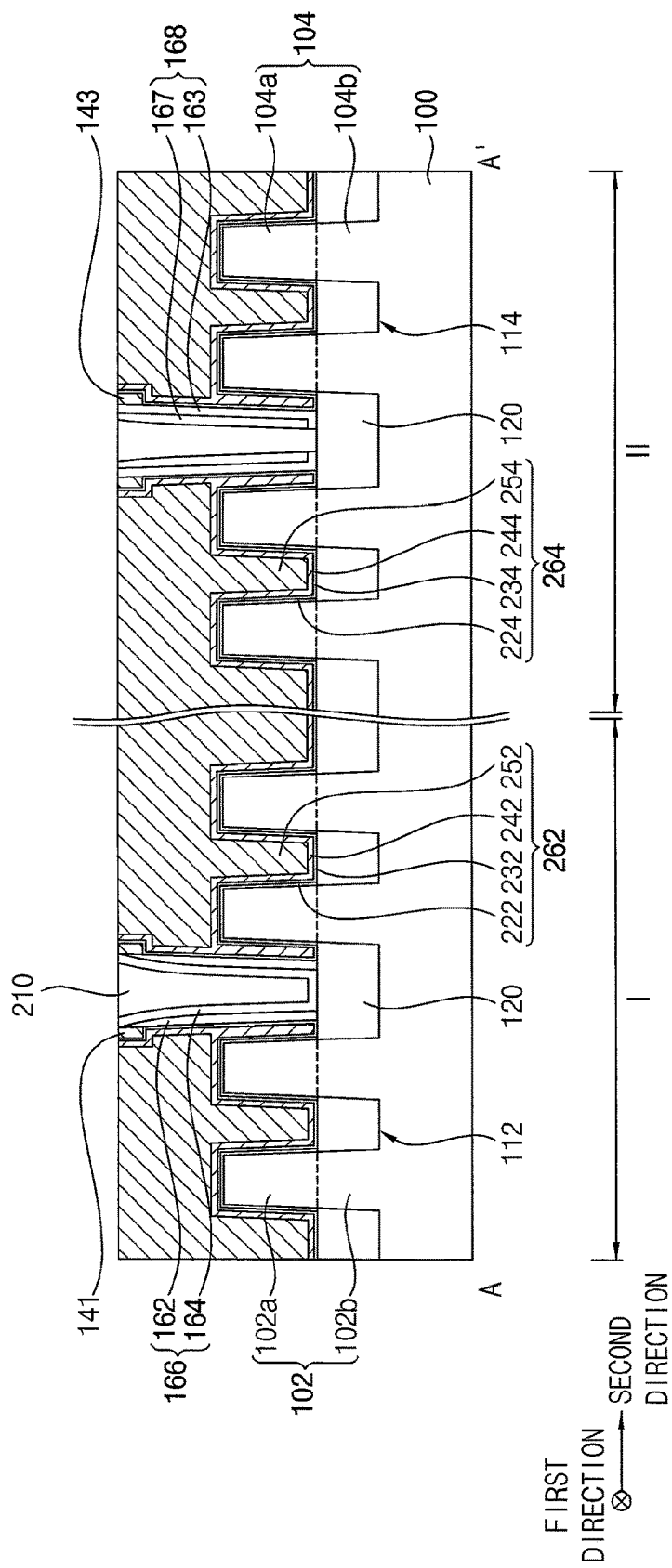

FIG. 60 shows the case in which the first and second growth blocking patterns 141 and 143 are not removed when the first and second dummy gate structures 142 and 144 are removed.

That is, the first and second growth blocking patterns 141 and 143 may include polysilicon doped with nitrogen, carbon, etc., and thus may have etching rates different from those of the first and second dummy gate structures 142 and 144. Thus, when the first and second dummy gate structures 142 and 144 are removed, the first and second growth blocking patterns 141 and 143 may not be removed.

Figure 61:
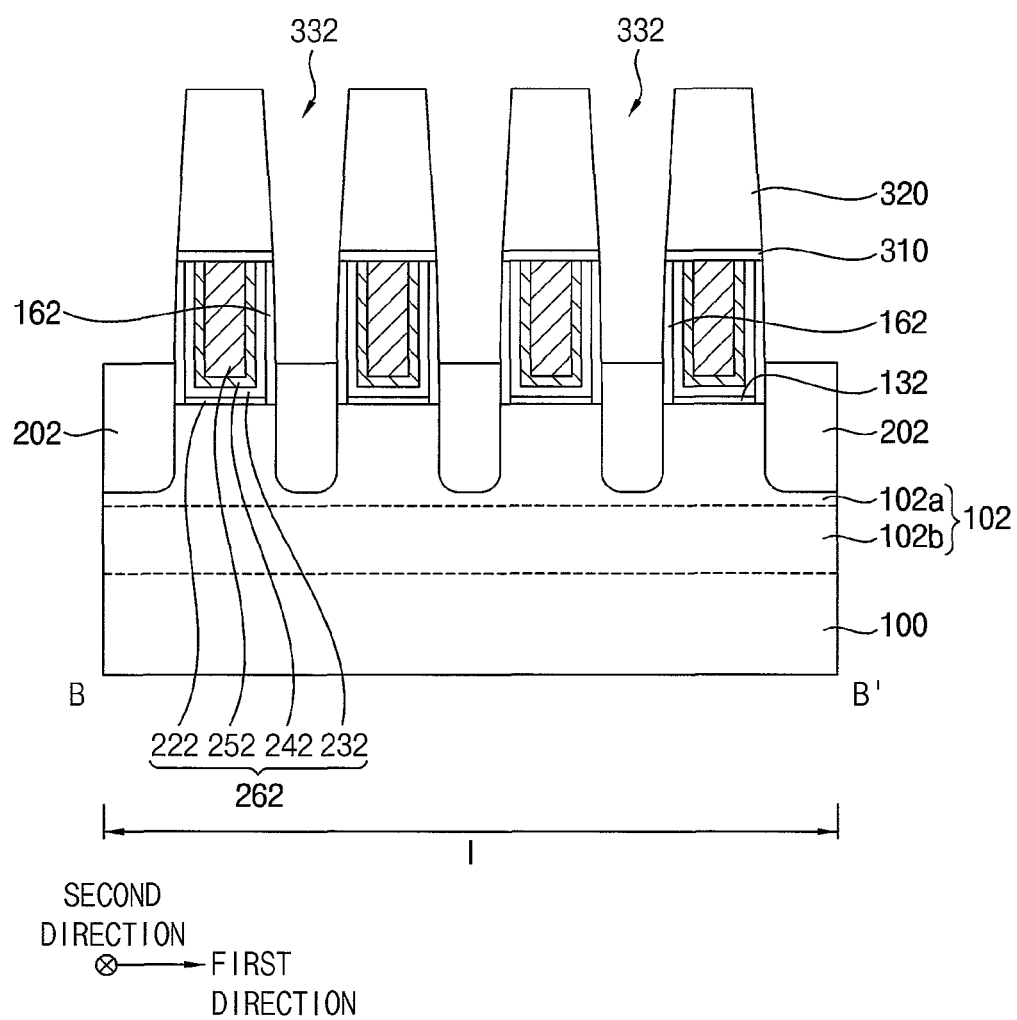
Figure 62:
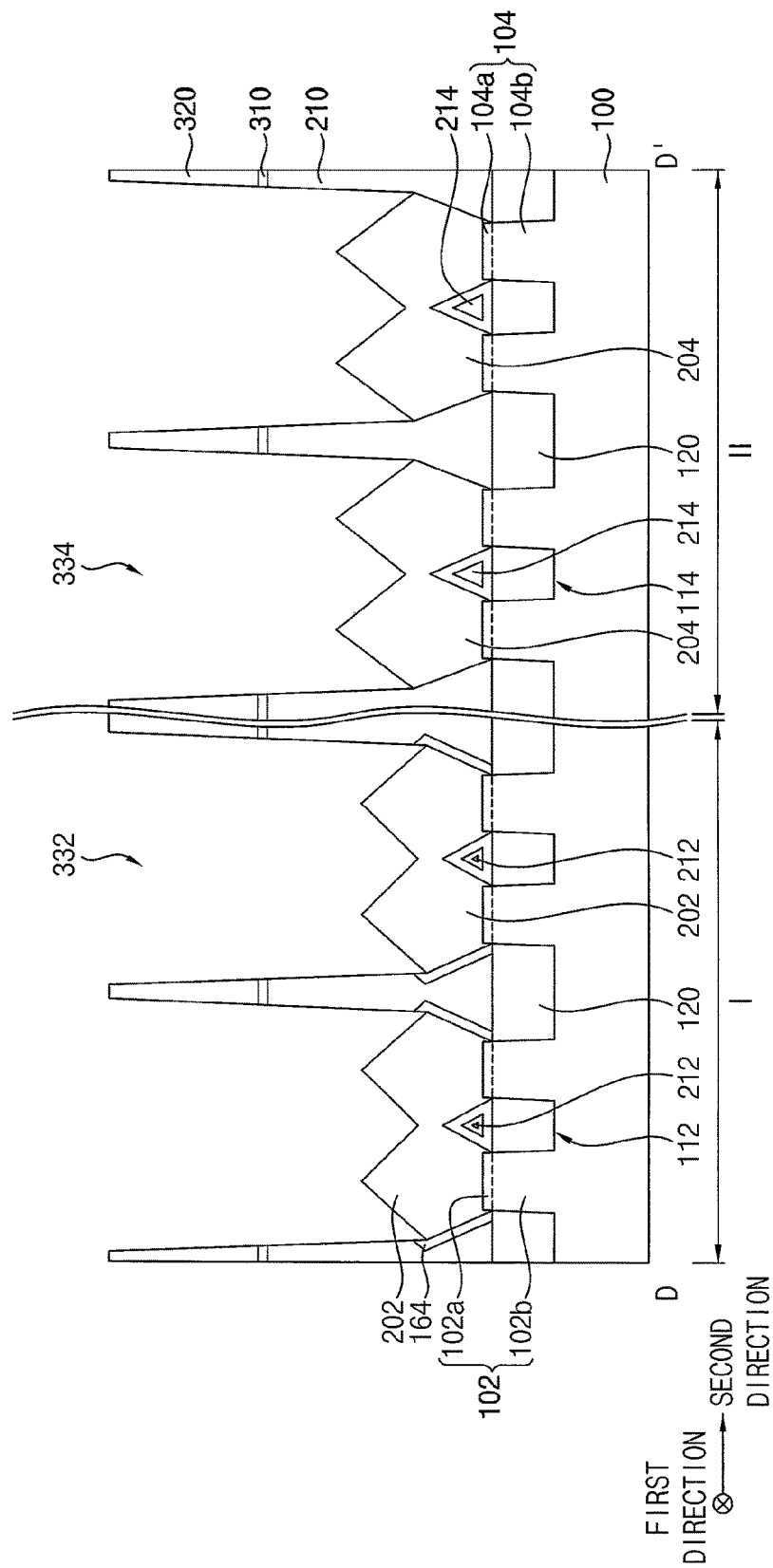
Figure 63:
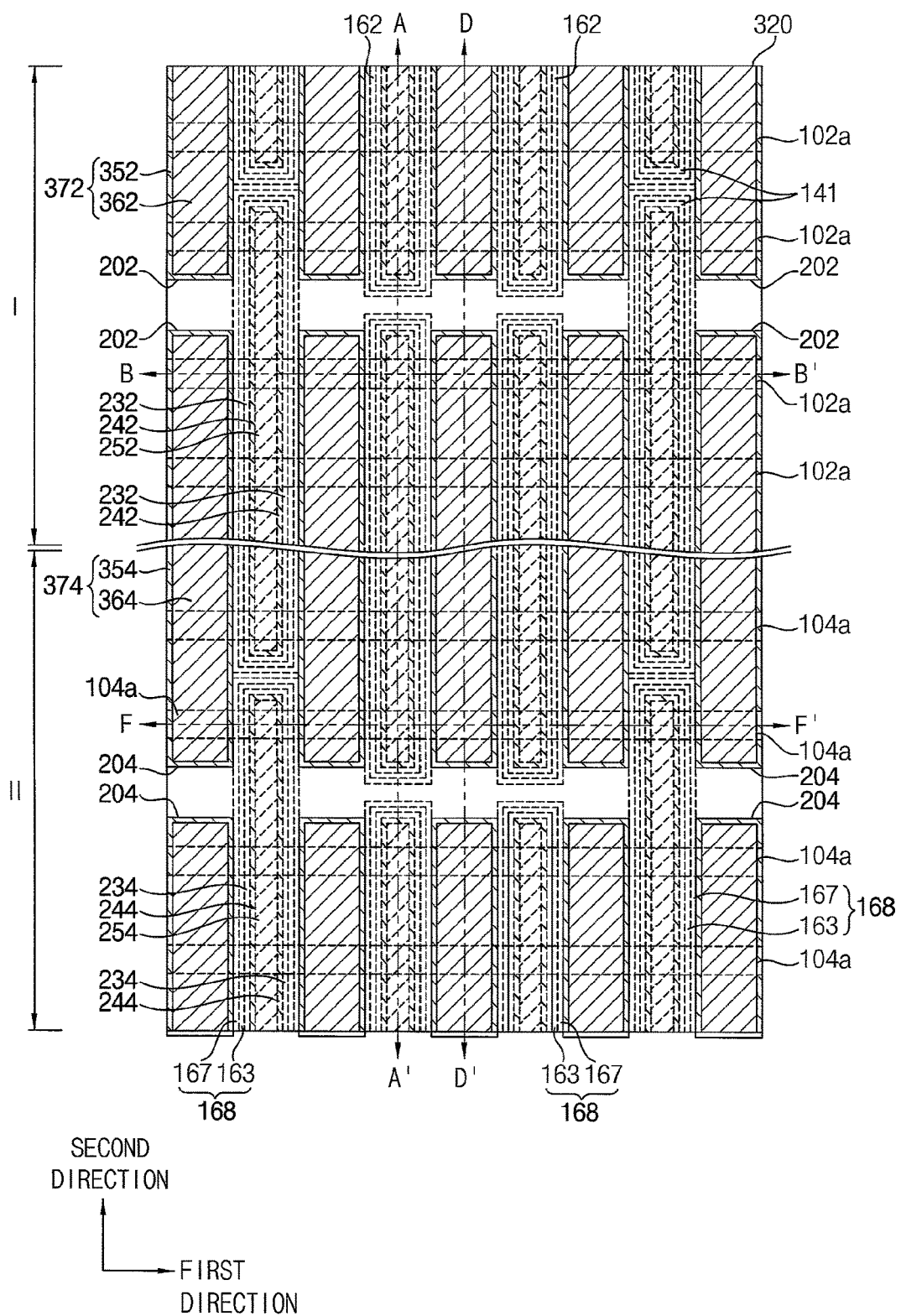
Figure 64:
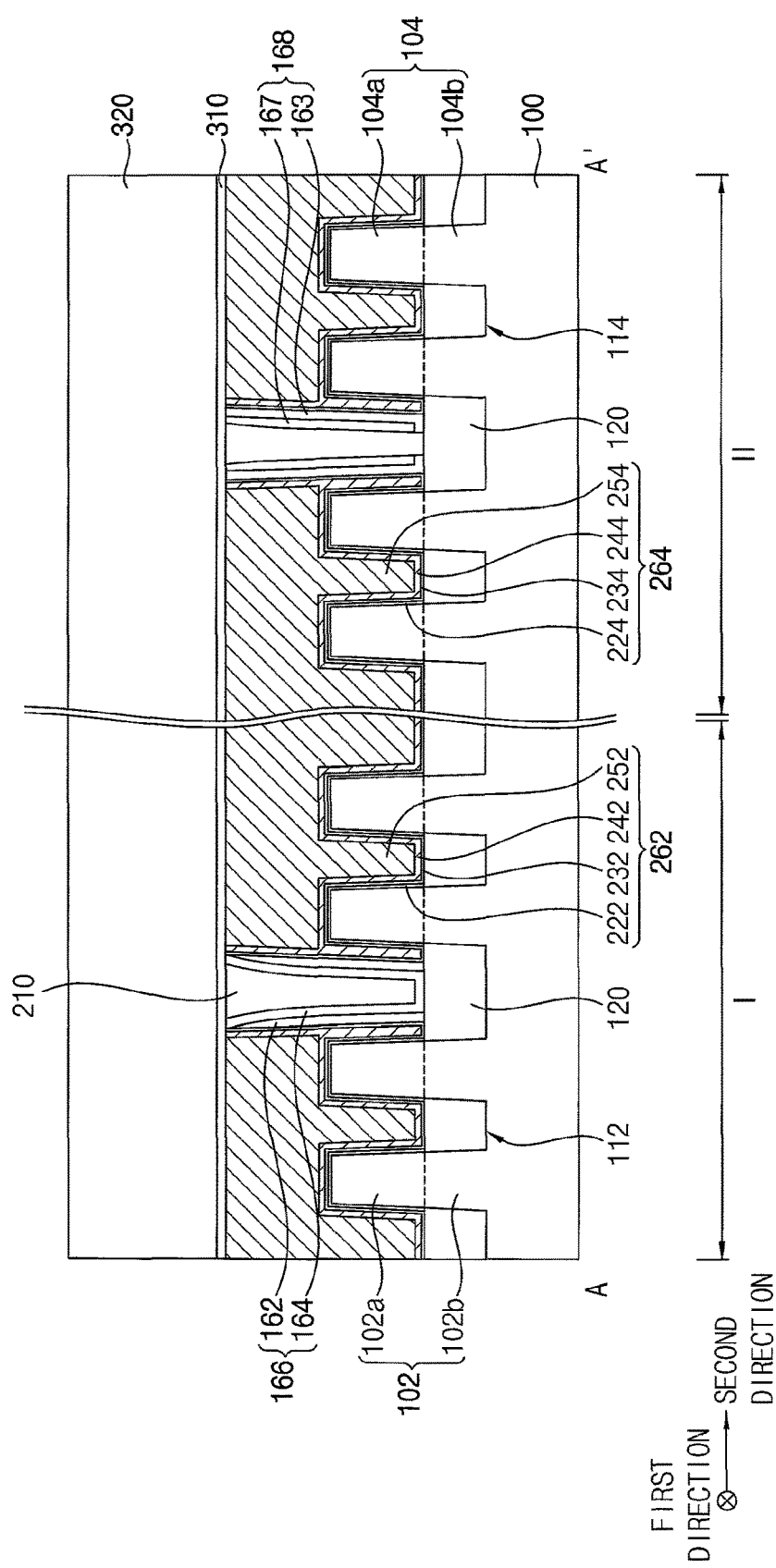
Figure 65:
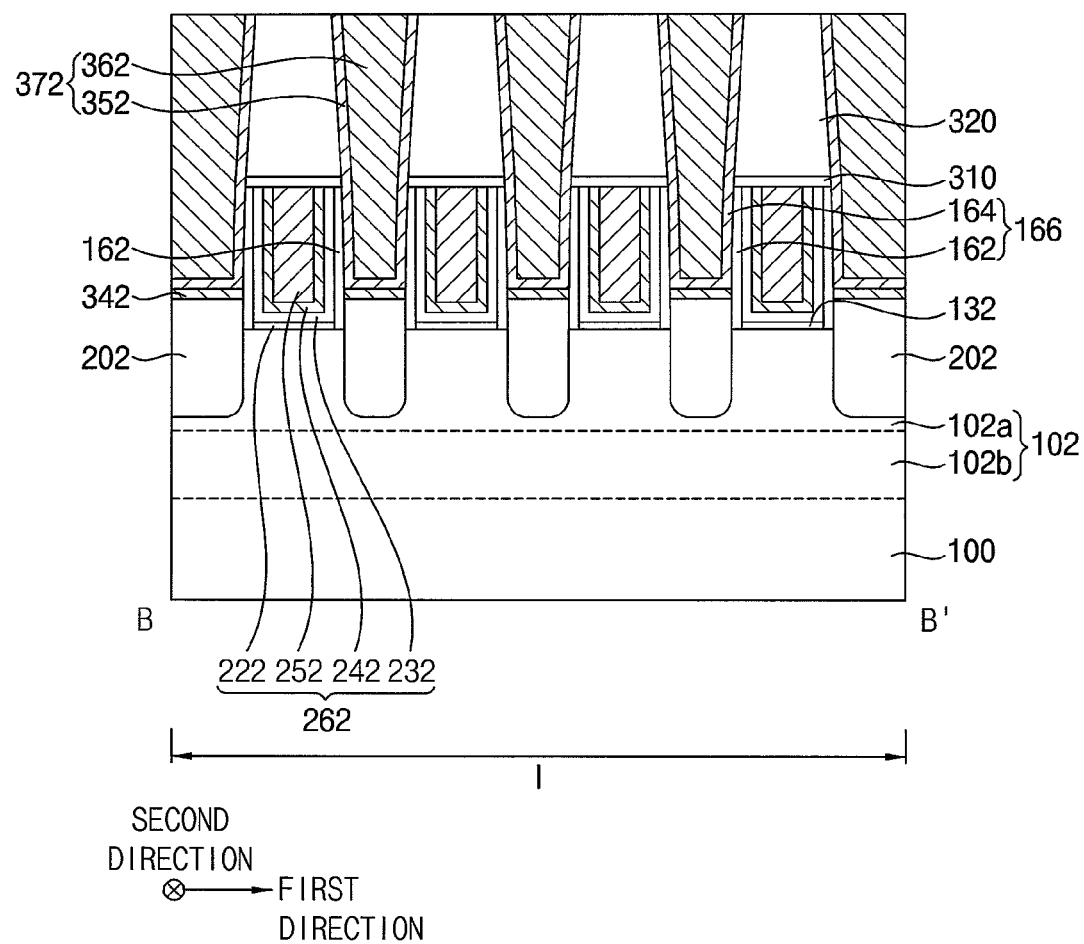
Figure 66:
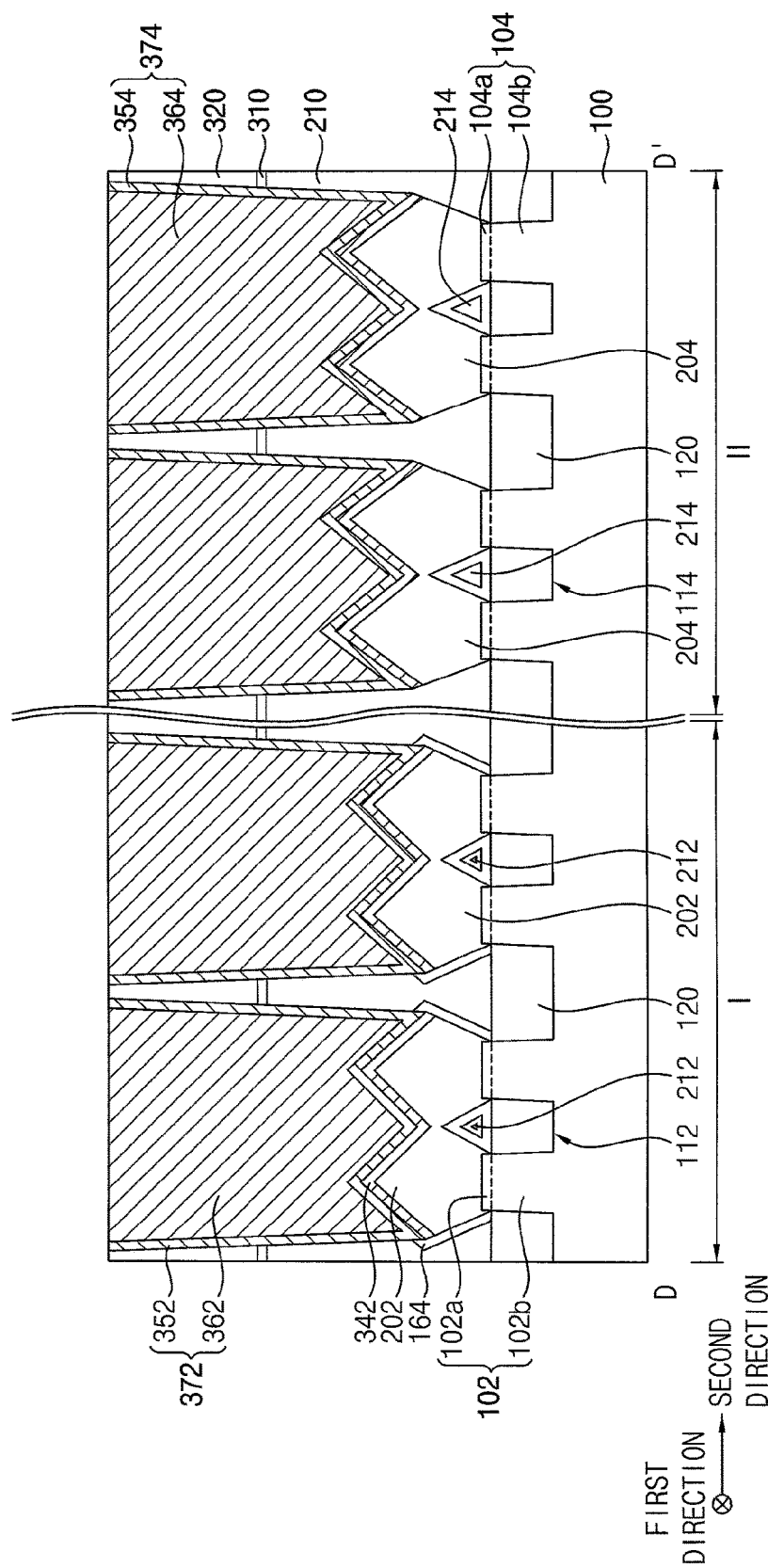

Referring to FIGS. 61 to 62, a capping layer 310 and an insulating interlayer 320 may be sequentially formed on the insulation layer 210, the first and second gate structures 262 and 264, and the first and second gate spacer structures 166 and 168, and first and second contact holes 332 and 334 may be formed through the insulation layer 210, the capping layer 310 and the insulating interlayer 320 to expose upper surfaces of the first and second source/drain layers 202 and 204, respectively.

The insulating interlayer 320 may be formed of silicon oxide, e.g., tetra ethyl ortho silicate (TEOS).

Referring to FIGS. 63 to 67, after forming a first metal layer on the exposed upper surfaces of the first and second source/drain layers 202 and 204, side surfaces of the first and second contact holes 332 and 334, and an upper surface of the insulating interlayer 320, a heat treatment process may be performed thereon to form first and second metal silicide patterns 342 and 344 on the first and second source/drain layers 202 and 204, respectively. An unreacted portion of the first metal may be removed.

The first metal layer may be formed of a metal, e.g., titanium, cobalt, nickel, etc.

A barrier layer may be formed on the first and second metal silicide patterns 342 and 344, the side surfaces of the first and second contact holes 332 and 334 and the upper surface of the insulating interlayer 320, a second metal layer may be formed on the barrier layer to fill the first and second contact holes 332 and 334, and the second metal layer and the barrier layer may be planarized until the upper surface of the insulating interlayer 320 may be exposed.

Thus, first and second contact plugs 372 and 374 may be formed on the first and second metal silicide patterns 342 and 344 to fill the first and second contact holes 332 and 334, respectively.

In examples, the first and second contact plugs 372 and 374 may be formed to be self-aligned with the first and second spacer structures 166 and 168, respectively; however, the inventive concept is not limited thereto.

The barrier layer may be formed of a metal nitride, e.g., titanium nitride, tantalum nitride, tungsten nitride, etc., and the second metal layer may be formed of a metal, e.g., tungsten, copper, etc.

The first contact plug 372 may include a first metal pattern 362 and a first barrier pattern 352 covering a bottom and sides thereof, and the second contact plug 374 may include a second metal pattern 364 and a second barrier pattern 354 covering a bottom and sides thereof.

Wiring (not shown) and/or a via (not shown) may be additionally formed to be electrically connected to the first and second contact plugs 372 and 374 to complete the semiconductor device.

Figure 68:
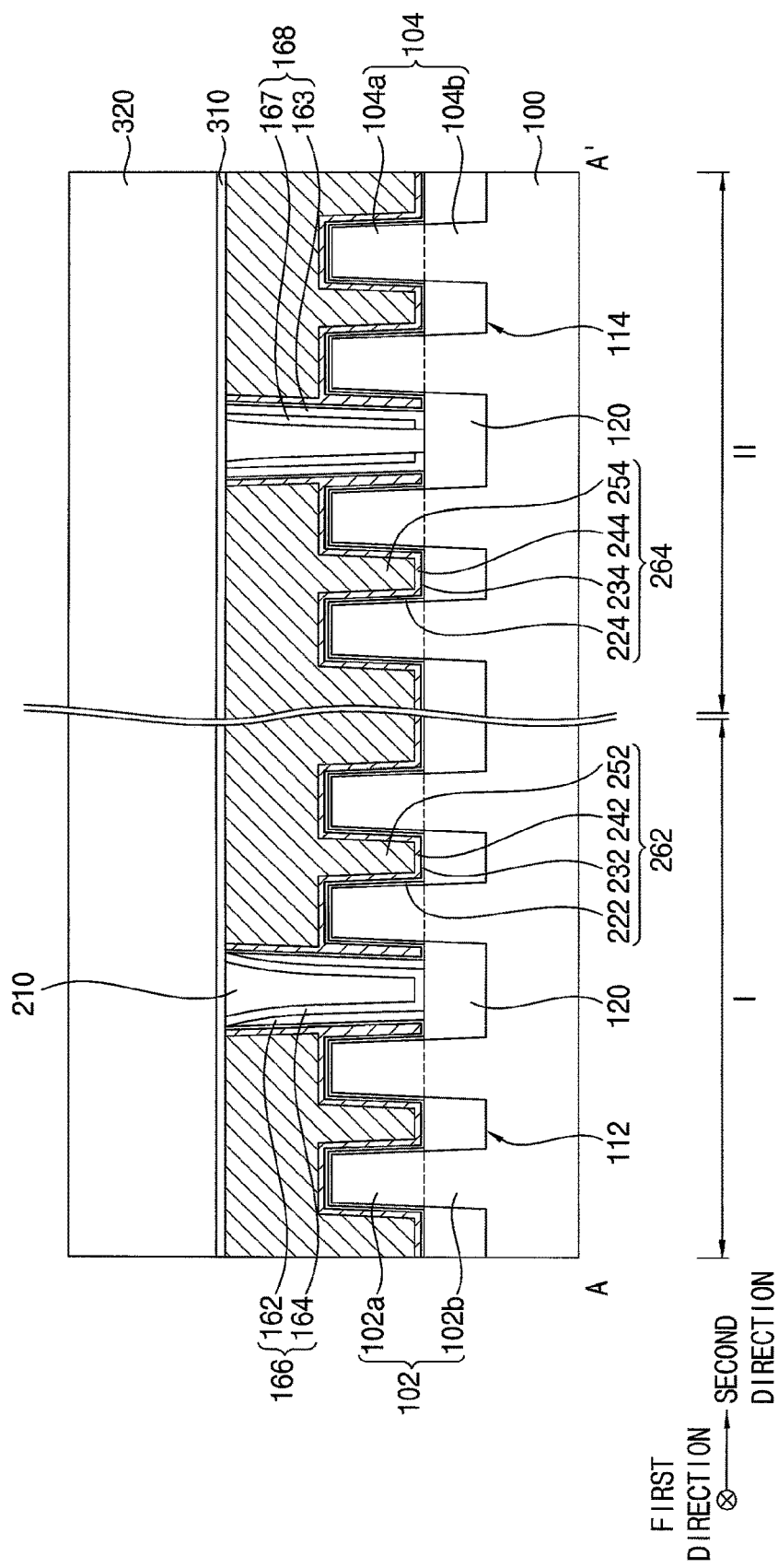
Figure 69:
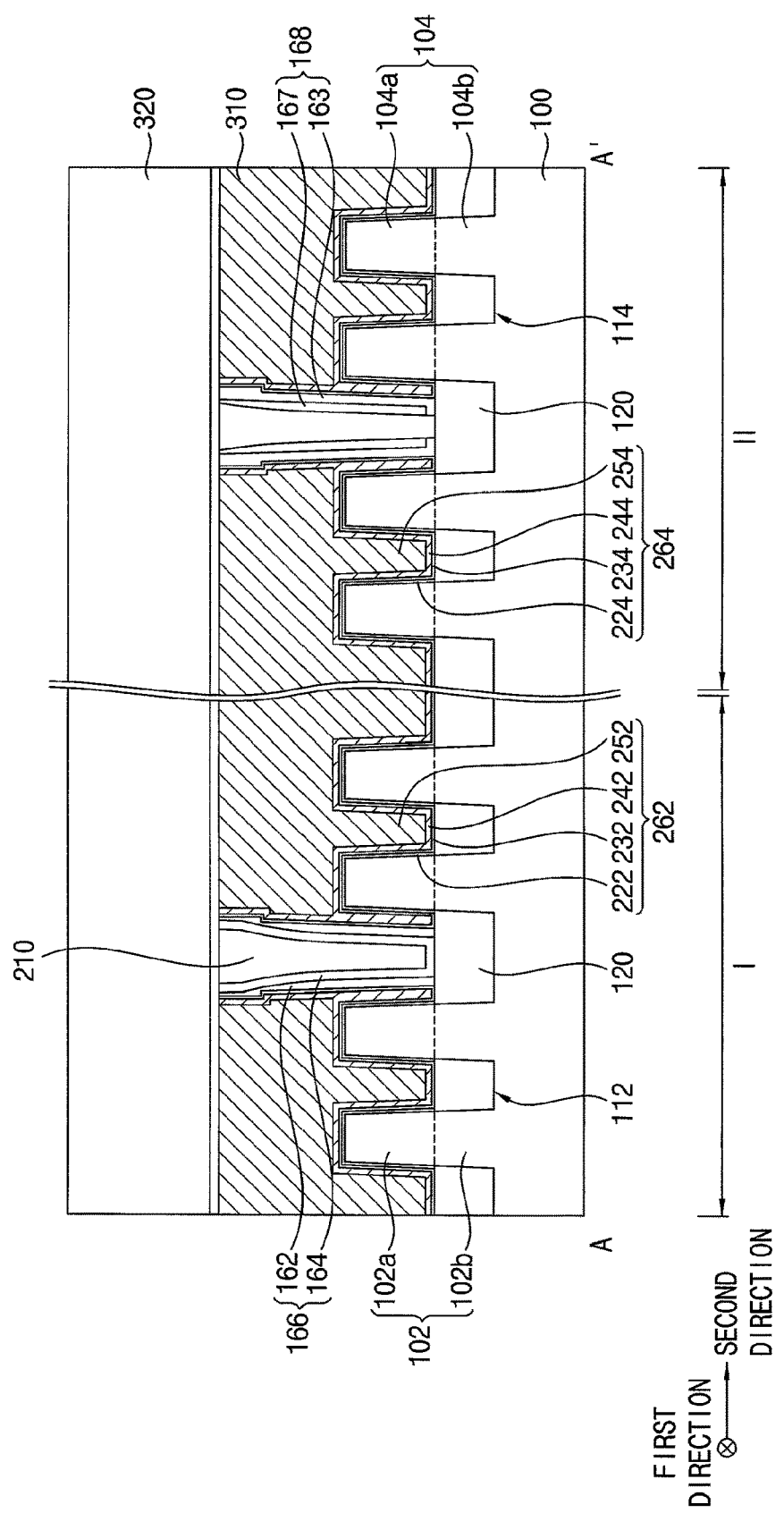
Figure 70:
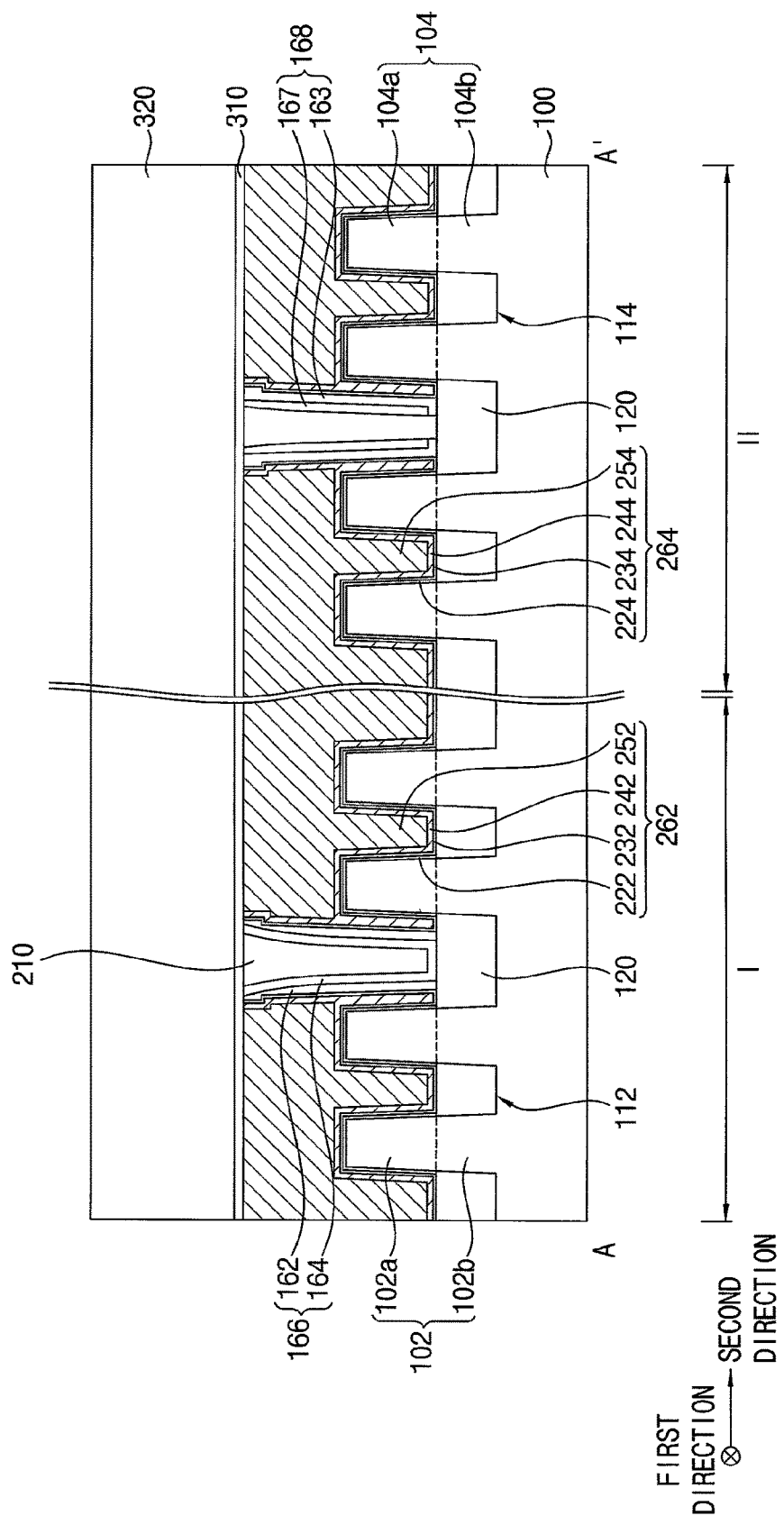

FIG. 68 shows an example of a semiconductor device, according to the inventive concept, including the first and second gate spacer structures 166 and 168 illustrated with reference to FIG. 55, and FIGS. 69 and 70 show examples of semiconductor devices, according to the inventive concept, each including the first and second gate spacer structures 166 and 168 when the first and second indentations 147 and 149 are formed in the sides of the first and second growth blocking patterns 141 and 143, respectively, and extend within the ends of the gate electrodes as open at top surfaces of the gate electrodes. That is, in these latter examples, remnants of the first and second growth blocking patterns 141 and 143 remain within the ends of the gate electrodes and define the first and second indentations 147 and 149 in the ends of the gate electrodes.

FIG. 71 shows an example of a semiconductor device, according to the inventive concept, including the first and second growth blocking patterns 141 and 143 that are not removed when the first and second dummy gate electrodes 142 and 144 are removed.

As described above, after forming the first and second dummy gate masks 152 and 154 each of which may be spaced apart from each other by etching the first and second preliminary dummy gate masks 152a and 154a using the fourth layer 15 as an etching mask, ions, e.g., nitrogen, carbon, etc. may be implanted into a portion of the dummy gate electrode layer 140 using the fourth layer 15 as an ion implantation mask to form the growth blocking layer 145. Thus, even if the growth blocking patterns 141 and 143 are not covered but exposed by the spacer structures 166 and 168, when an SEG process for forming the source/drain layers 202 and 204 is performed, the growth blocking patterns 141 and 143 may not serve as a seed, and accordingly, no epitaxial layer may be grown on the side surfaces of the dummy gate structures 142 and 144. Thus, the gate structures 262 and 264 adjacent to each other in the second direction may not be electrically shorted by an epitaxial layer.

The above method of manufacturing the semiconductor device may be applied to methods of manufacturing various types of memory devices including source/drain layers formed by an SEG process. For example, the method may be applied to methods of manufacturing logic devices such as central processing units (CPUs), main processing units (MPUs), or application processors (APs), or the like. Additionally, the method may be applied to methods of manufacturing volatile memory devices such as DRAM devices or SRAM devices, or non-volatile memory devices such as flash memory devices, PRAM devices, MRAM devices, RRAM devices, or the like.

The foregoing is illustrative of examples and is not to be construed as limiting thereof. Although a few examples have been described, those skilled in the art will readily appreciate that many modifications are possible in the examples without materially departing from the novel teachings and advantages of the present inventive concept. Therefore, it is to be understood that the foregoing is illustrative of various examples and is not to be construed as limited to the specific examples disclosed, and that modifications to the disclosed examples, as well as other examples, are intended to be included within the scope of the appended claims.

What is claimed is:

1. A method of manufacturing a semiconductor device, the method comprising:
   sequentially forming a dummy gate electrode layer and a dummy gate mask layer on a substrate;
   patterning the dummy gate mask layer to form a dummy gate mask so that a portion of the dummy gate electrode layer is exposed;
   implanting ions into the exposed portion of the dummy gate electrode layer and a portion of the dummy gate electrode layer adjacent thereto by an angled ion implantation process to form a growth blocking layer at the portion of the dummy gate electrode layer;
   etching the dummy gate electrode layer using the dummy gate mask as an etching mask to form a dummy gate electrode;
   forming a spacer on a side surface of a dummy gate structure including the dummy gate electrode and the dummy gate mask; and
   performing an SEG process to form an epitaxial layer on a portion of the substrate adjacent the spacer.

2. The method of claim 1, wherein the substrate and the dummy gate electrode layer include silicon, and the ions implanted into the dummy gate electrode layer include at least one of nitrogen, carbon, oxygen and arsenic.

3. The method of claim 1, wherein no epitaxial layer is formed from a side surface of the dummy gate electrode when the epitaxial layer is formed on the portion of the substrate adjacent the spacer.

4. The method of claim 1, wherein patterning the dummy gate mask layer to form the dummy gate mask includes:
   etching the dummy gate mask layer to form a plurality of preliminary dummy gate masks spaced apart from each other in a first direction, each of the preliminary dummy gate masks extending in a second direction crossing the first direction; and
   etching the preliminary dummy gate masks to form a plurality of dummy gate masks spaced apart from each other in the second direction.

5. The method of claim 4, wherein the first and second directions are substantially perpendicular to each other.

6. The method of claim 4, wherein etching the preliminary dummy gate masks to form the plurality of dummy gate masks includes:
   forming an etching mask on the preliminary dummy gate masks and the dummy gate electrode layer to have an opening extending in the first direction; and
   etching the preliminary dummy gate masks using the etching mask.

7. The method of claim 6, wherein forming the etching mask includes:
   sequentially forming a SOH layer, a silicon nitride layer, an anti-reflective layer and a photoresist pattern on the preliminary dummy gate masks and the dummy gate electrode layer; and
   sequentially etching the anti-reflective layer, the silicon nitride layer and the SOH layer using the photoresist pattern as an etching mask,
   wherein the SOH layer is etched to form the etching mask.

8. The method of claim 7, wherein sequentially etching the anti-reflective layer, the silicon nitride layer and the SOH layer using the photoresist pattern as the etching mask includes:
   sequentially etching the anti-reflective layer and the silicon nitride layer using the photoresist pattern as an etching mask to form an anti-reflective pattern and a silicon nitride pattern, respectively, so that a portion of the SOH layer is exposed;
   forming an ALD oxide layer on the photoresist pattern, the anti-reflective pattern, the silicon nitride pattern and the exposed portion of the SOH layer; and
   etching the SOH layer using the photoresist pattern, the anti-reflective pattern and the silicon nitride pattern as an etching mask.

9. The method of claim 6, wherein the angled ion implantation process is performed by implanting ions into the dummy gate electrode layer through the opening.

10. The method of claim 9, wherein the angled ion implantation process is performed such that the ions are implanted into the dummy gate electrode layer in a direction slanted with respect to a top surface of the substrate in a cross-sectional view taken along the second direction.

11. The method of claim 6, wherein an upper portion of the dummy gate electrode layer is removed to form a recess when the preliminary dummy gate masks are etched using the etching mask.

12. The method of claim 11, wherein the growth blocking layer is formed at a portion of the dummy gate electrode layer adjacent the recess.

13. The method of claim 6, further comprising, after forming the growth blocking layer at the portion of the dummy gate electrode layer, removing the etching mask.

14. The method of claim 4, wherein the growth blocking layer is formed at a first portion of the dummy gate electrode layer exposed by the plurality of dummy gate masks spaced apart from each other in the second direction, and at a second portion of the dummy gate electrode layer adjacent the first portion thereof in the second direction.

15. The method of claim 14, wherein a portion of the growth blocking layer on the first portion of the dummy gate electrode layer is removed, while a portion of the growth blocking layer on the second portion of the dummy gate electrode layer remains, when the dummy gate electrode layer is etched using the dummy gate mask to form the dummy gate electrode.

16. The method of claim 14, wherein a portion of the growth blocking layer on the first portion of the dummy gate electrode layer is removed, and a portion of the growth blocking layer on the second portion of the dummy gate electrode layer is partially removed to form a growth blocking pattern, when the dummy gate electrode layer is etched using the dummy gate mask to form the dummy gate electrode.

17. The method of claim 4, wherein forming the spacer on the side surface of the dummy gate structure includes:

forming a spacer layer on the dummy gate structure and the substrate; and anisotropically etching the spacer layer.

18. The method of claim 1, wherein performing the SEG process to form the epitaxial layer on the portion of the substrate adjacent the spacer includes:

etching an upper portion of the substrate using the dummy gate structure and the spacer as an etching mask to form a recess; and performing the SEG process using an upper surface of the substrate exposed by the recess.

19. The method of claim 1, further comprising, after forming the epitaxial layer, replacing the dummy gate structure with a gate structure.

20. The method of claim 19, wherein the growth blocking layer is removed when the dummy gate structure is replaced with the gate structure.

* * * * *